US012217940B2

(12) United States Patent
Valcore, Jr. et al.

(10) Patent No.: US 12,217,940 B2
(45) Date of Patent: Feb. 4, 2025

(54) SENSOR DATA COMPRESSION IN A PLASMA TOOL

(71) Applicant: Lam Research Corporation, Fremont, CA (US)

(72) Inventors: John Valcore, Jr., Worthington, OH (US); Travis Joseph Wong, Oakland, CA (US); Ying Wu, Livermore, CA (US); Sandeep Mudunuri, Austin, TX (US); Bostjan Pust, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/926,574

(22) PCT Filed: May 10, 2021

(86) PCT No.: PCT/US2021/031655
§ 371 (c)(1),
(2) Date: Nov. 18, 2022

(87) PCT Pub. No.: WO2021/242512
PCT Pub. Date: Dec. 2, 2021

(65) Prior Publication Data
US 2023/0207267 A1 Jun. 29, 2023

Related U.S. Application Data

(60) Provisional application No. 63/030,748, filed on May 27, 2020.

(51) Int. Cl.
*H01J 37/32* (2006.01)

(52) U.S. Cl.
CPC .. *H01J 37/32183* (2013.01); *H01J 37/32926* (2013.01)

(58) Field of Classification Search
CPC ........... H01J 37/32082; H01J 37/32183; H01J 37/32366; H01J 37/32926; H01J 37/32935
See application file for complete search history.

(56) References Cited

U.S. PATENT DOCUMENTS

| | | | |
|---|---|---|---|
| 5,175,472 A | 12/1992 | Johnson, Jr. et al. | |
| 10,049,857 B2* | 8/2018 | Fisk, II | H01J 37/32935 |
| 11,996,269 B2* | 5/2024 | Burry | H03K 5/00006 |
| 2006/0262889 A1* | 11/2006 | Kalvaitis | H01J 37/32082 375/355 |

(Continued)

OTHER PUBLICATIONS

ISR & WO PCT/US2021/031655, dated Aug. 17, 2021, 12 pages.

*Primary Examiner* — Tung X Le
(74) *Attorney, Agent, or Firm* — PENILLA IP, APC

(57) ABSTRACT

Systems and methods for compressing data are described. One of the methods includes receiving a plurality of measurement signals from one or more sensors coupled to a radio frequency (RF) transmission path of a plasma tool. The RF transmission path is from an output of an RF generator to an electrode of a plasma chamber. The method includes converting the plurality of measurement signals from an analog form to a digital form to sample data and processing the data to reduce an amount of the data. The amount of the data is compressed to output compressed data. The method includes sending the compressed data to a controller for controlling the plasma tool.

34 Claims, 22 Drawing Sheets

(56) References Cited

U.S. PATENT DOCUMENTS

| | | | |
|---|---|---|---|
| 2009/0120580 A1 | 5/2009 | Kagoshima et al. | |
| 2010/0201371 A1 | 8/2010 | Valcore et al. | |
| 2013/0073241 A1* | 3/2013 | Coumou | G01R 31/00 702/81 |
| 2017/0345620 A1* | 11/2017 | Coumou | H03J 7/08 |
| 2021/0074529 A1* | 3/2021 | Labanc | H03F 3/189 |
| 2021/0327684 A1* | 10/2021 | Bhutta | H01J 37/3299 |

* cited by examiner (Two RF Sensors)

(TCP Coil-one match)

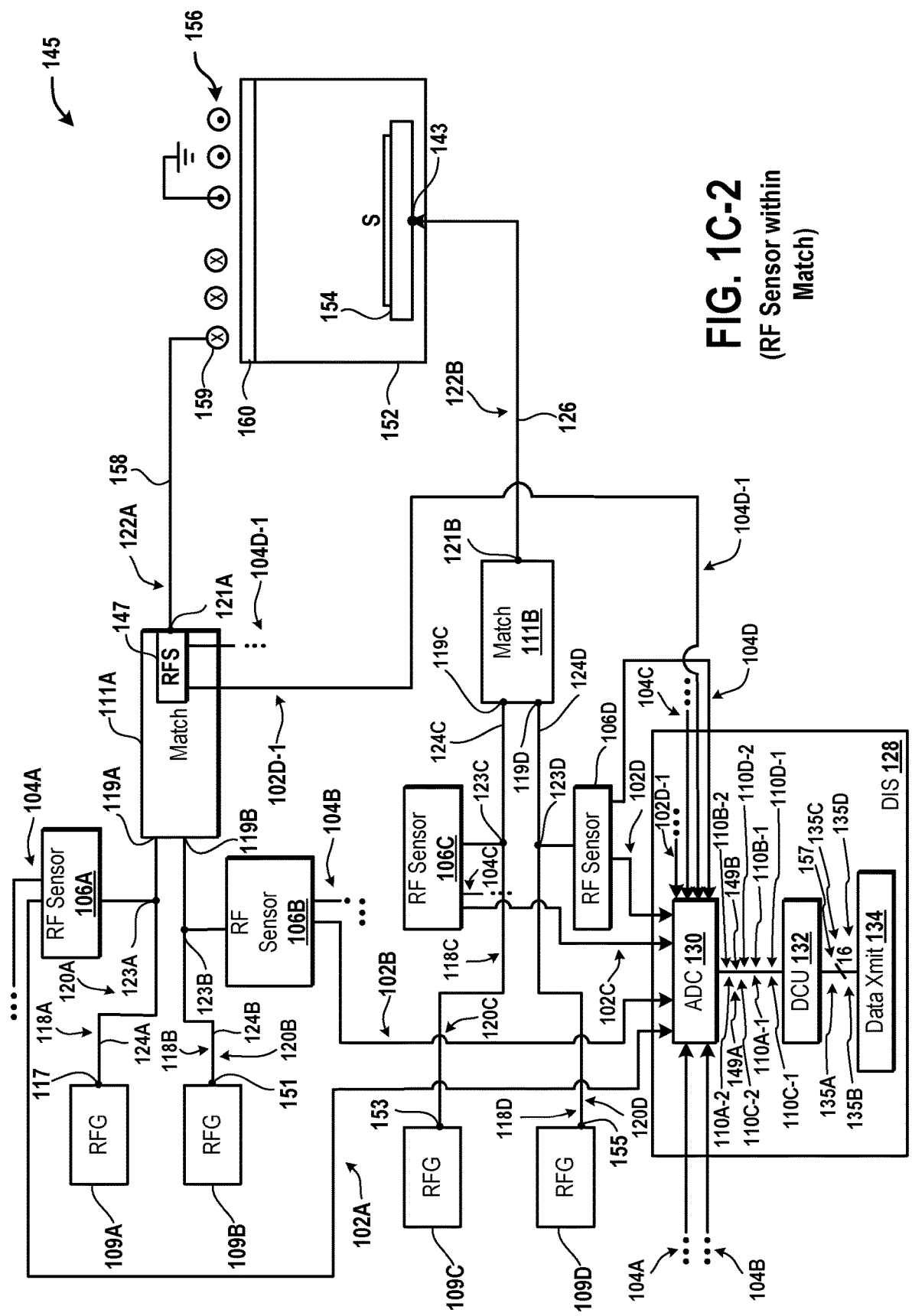
FIG. 1C-2 (RF Sensor within Match)

(Two TCP coils-two matches)

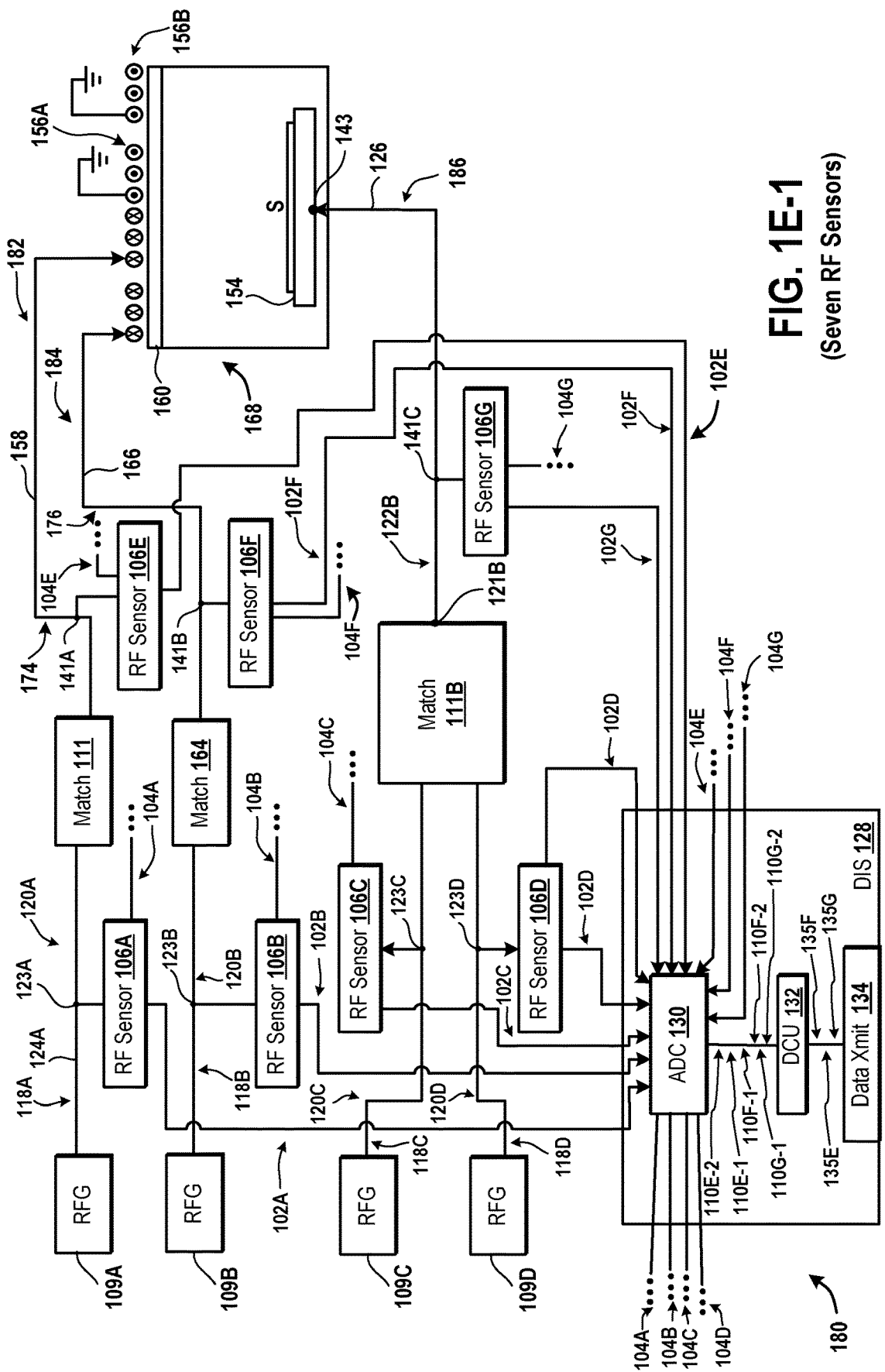
FIG. 1E-1 (Seven RF Sensors)

(RF Sensor within a Plasma Chamber)

(DIS Integrated with RF Sensor)

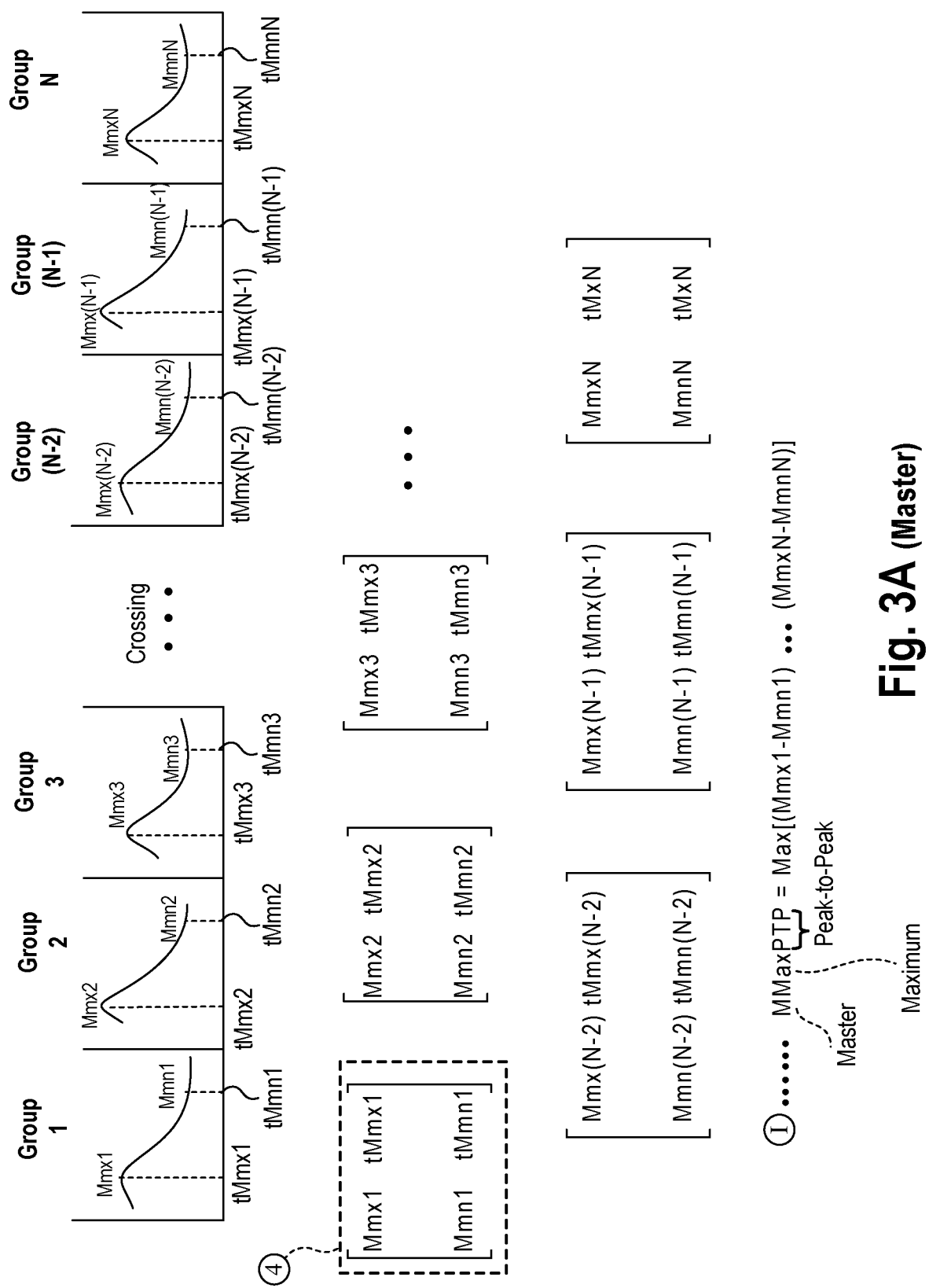
Fig. 3A (Master)

(Slave)

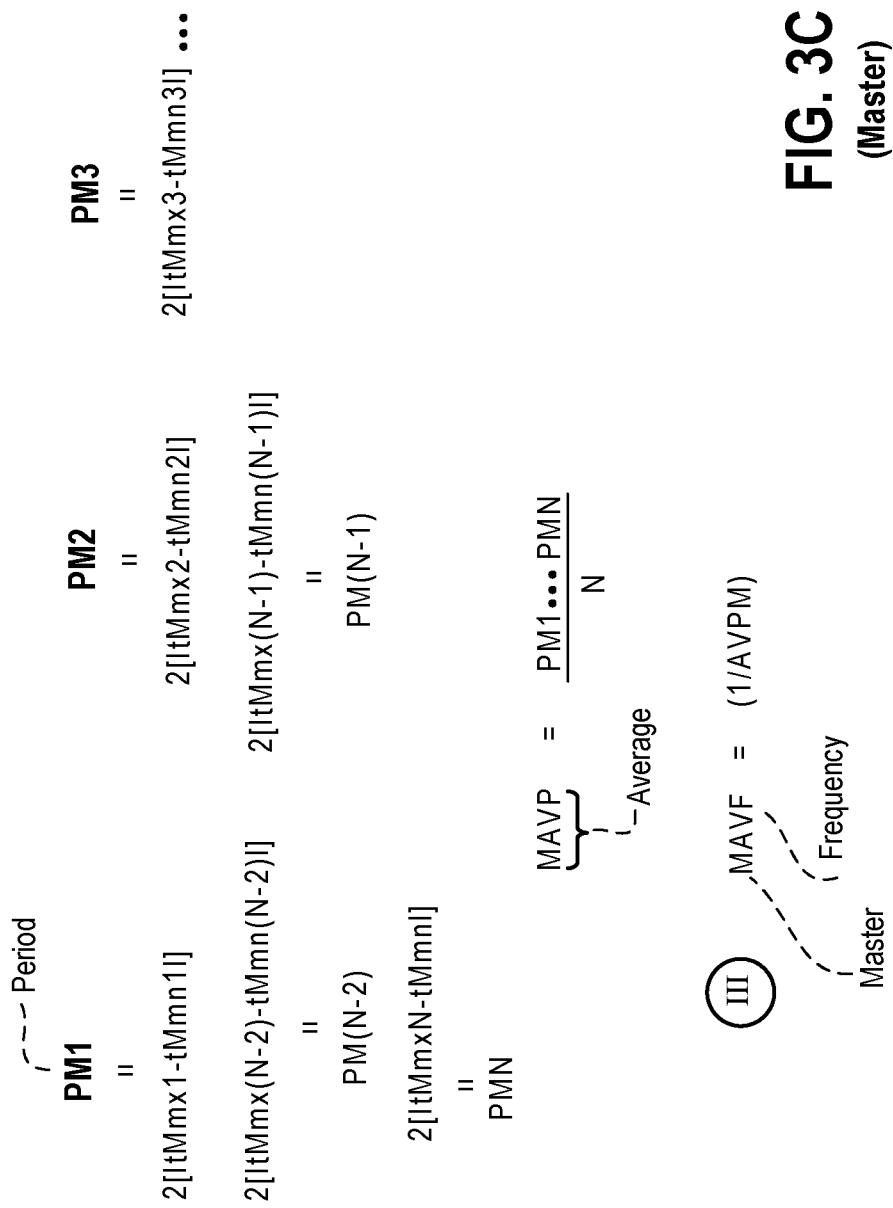
FIG. 3C (Master)

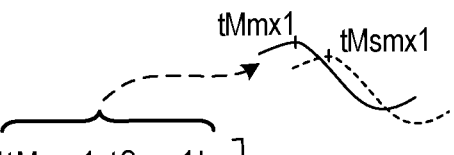

$Mxav1 = |tMmx1 - tSmx1|$
$Mnav1 = |tMmn1 - tSmn1|$
$\Rightarrow Av1 = Av(Mxav1, Mnav1)$ $Mxav2 = |tMmx2 - tSmx2|$
$Mnav2 = |tMmn2 - tSmn2|$
$\Rightarrow Av2 = Av(Mxav2, Mnav2)$ $Mxav3 = |tMx3 - tSmx3|$
$Mnav3 = |tMmn3 - tSmn3|$
$\Rightarrow Av3 = Av(Mxav3, Mnav3)$

⋮

$Mxav(N-2) = |tMmx(N-2) - tSmx(N-2)|$
$Mnav(N-2) = |tMmn(N-2) - tSmn(N-2)|$
$\Rightarrow Av(N-2) = Av(Mxav(N-2), Mnav(N-2))$ $Mxav(N-1) = |tMmx(N-1) - tSmx(N-1)|$
$Mnav(N-1) = |tMmn(N-1) - tSmn(N-1)|$
$\Rightarrow Av(N-1) = Av(Mxav(N-2), Mnav(N-2))$ $MxavN = |tMmxN - tSmxN|$
$Mxa0N = |tMmnN - tSmnN|$
$\Rightarrow AvN = Av(MxavN, MnavN)$ (IV)  $\Phi = Av[Av1 \ldots AvN]$        ---- N can be 1

FIG. 3D

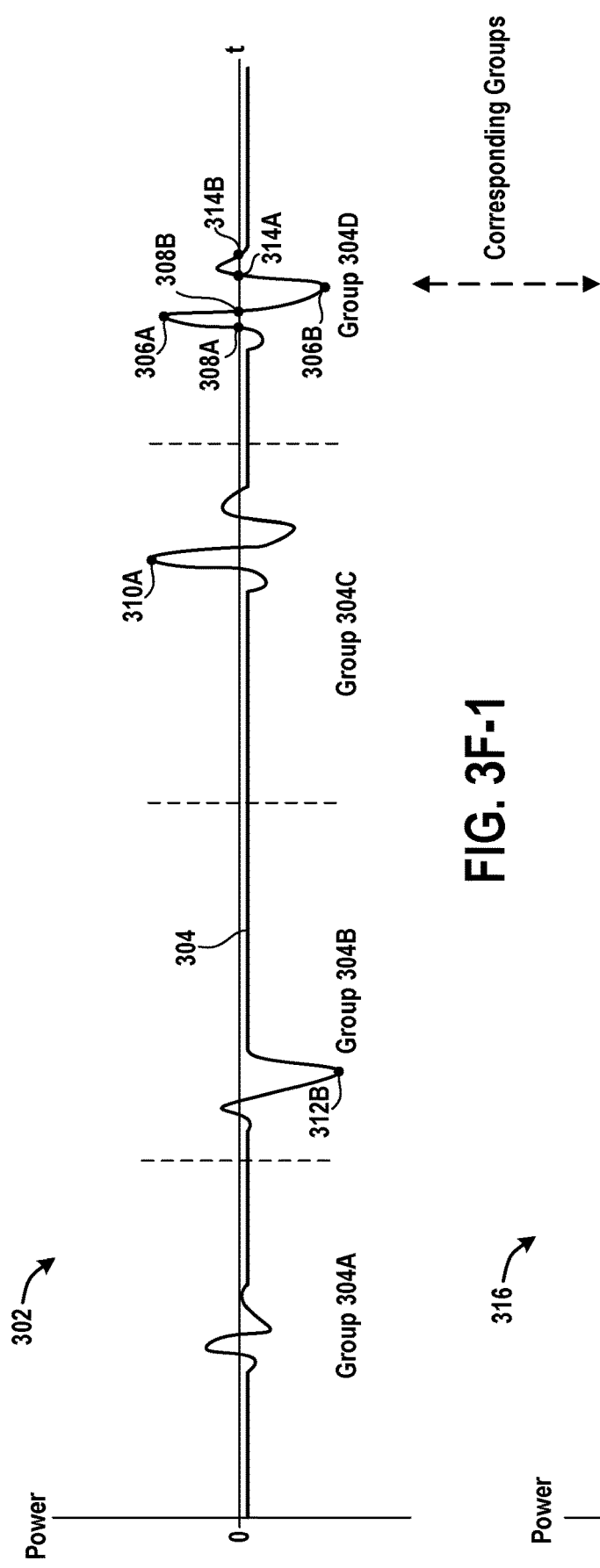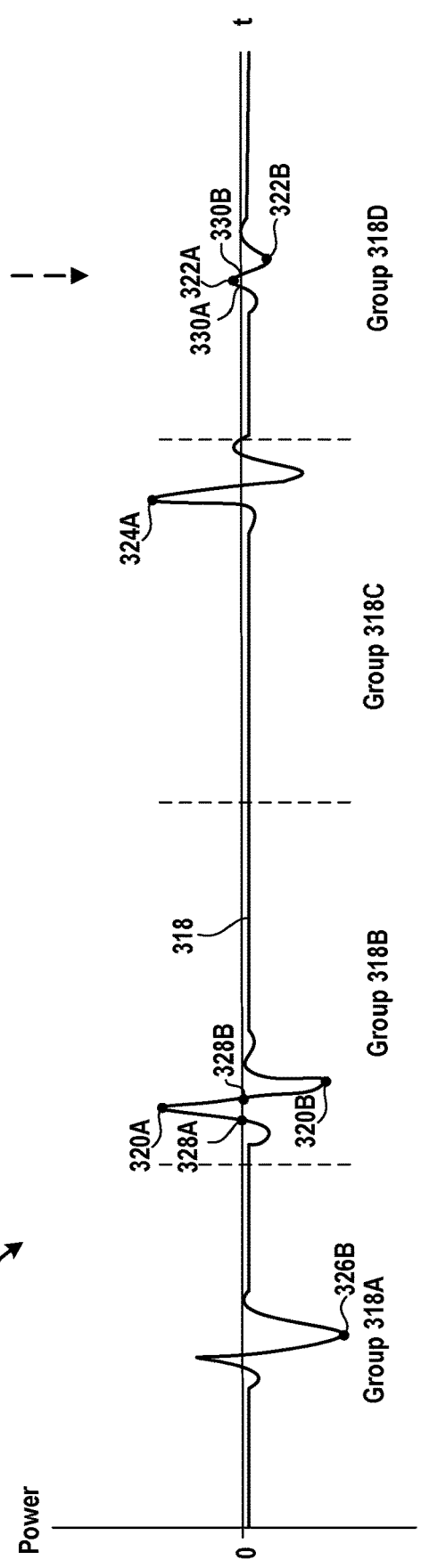

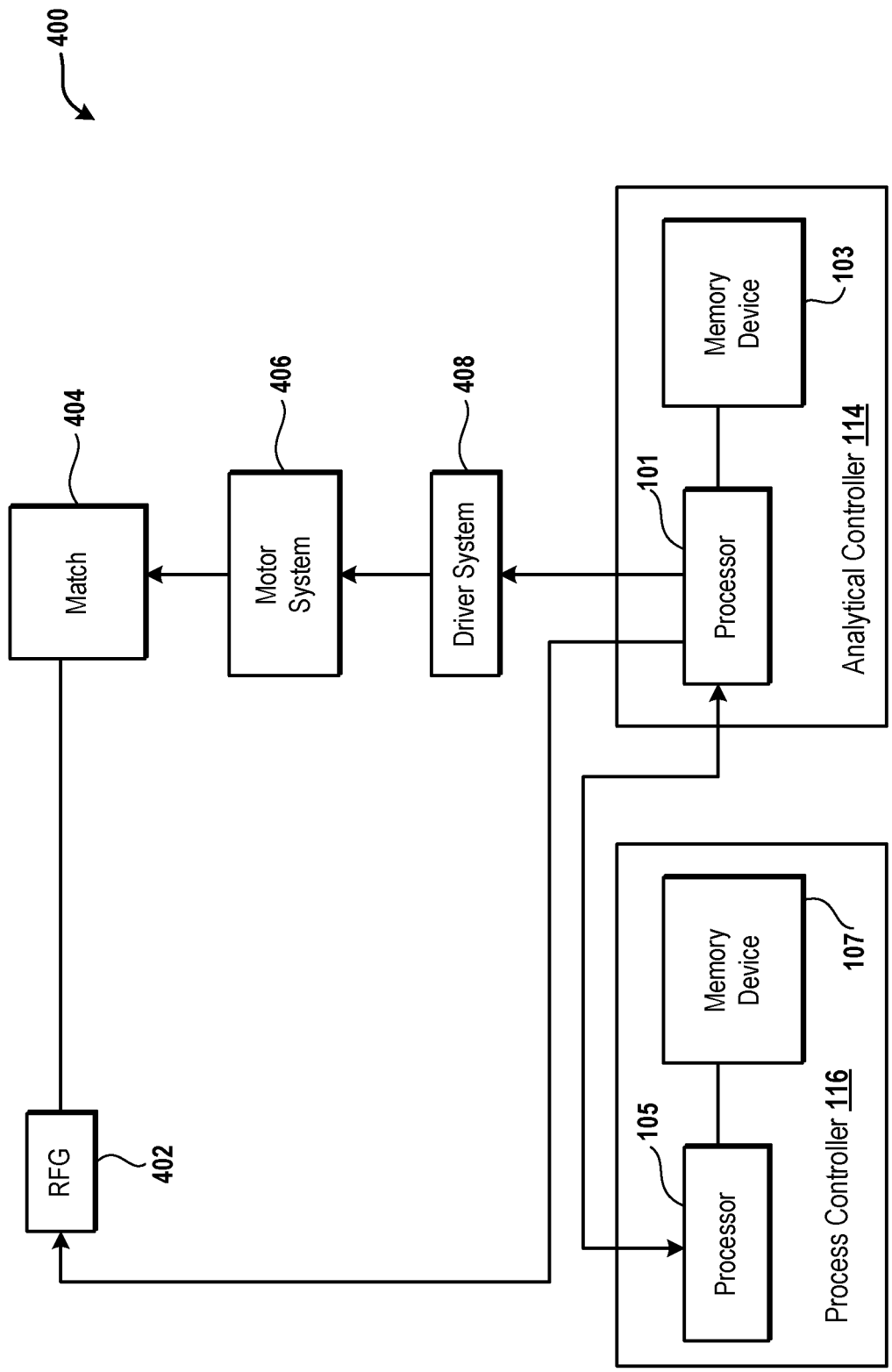
Fig. 4A (RFG and/or Match Control)

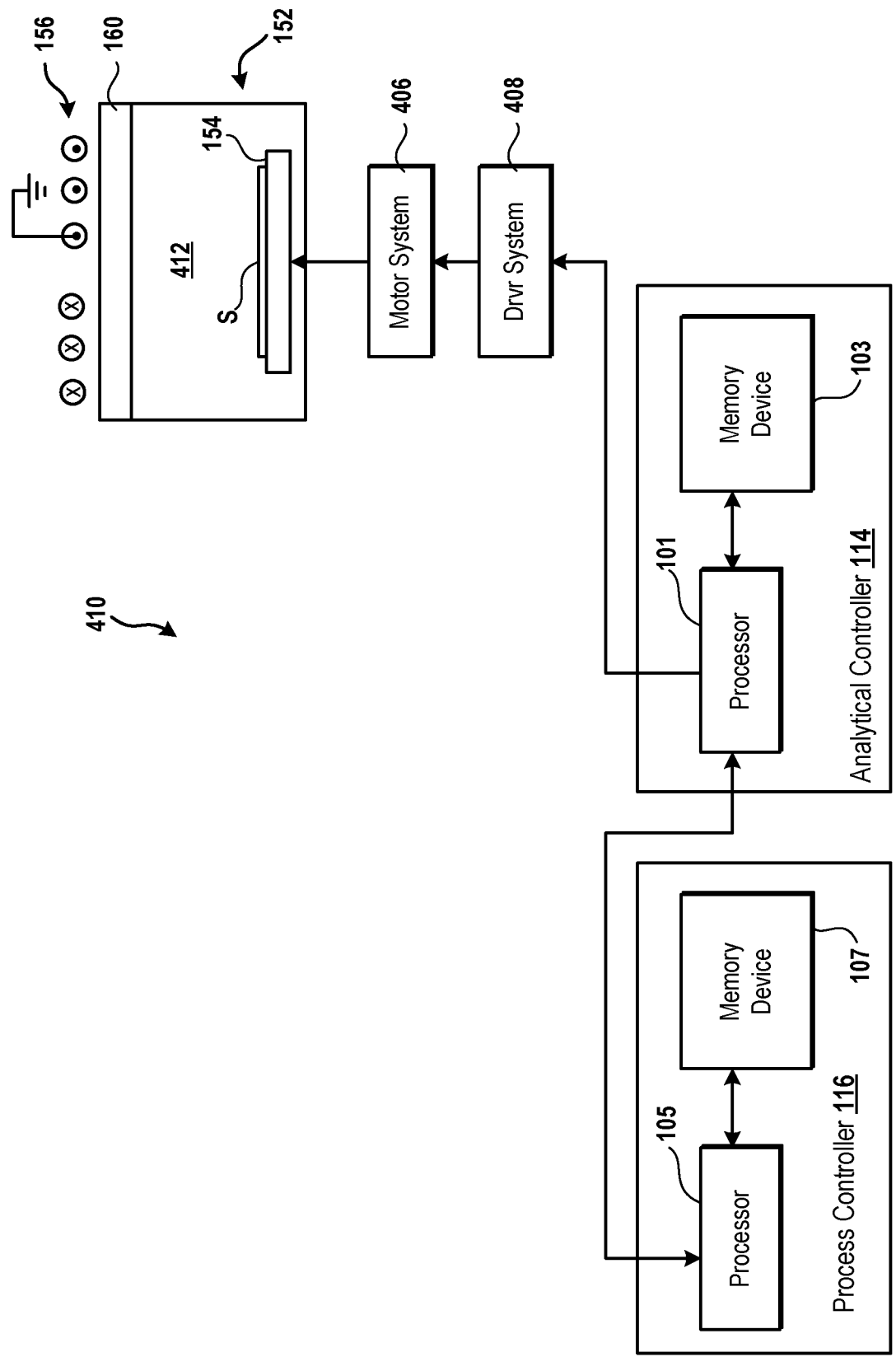
Fig. 4B (Gap Control)

(Pressure & Gas Flow Control)

(Temp. Control)

SENSOR DATA COMPRESSION IN A PLASMA TOOL

CLAIM OF PRIORITY

This application is a national stage filing of and claims priority, under 35 U.S.C. § 371, to PCT/US21/31655, filed on May 10, 2021, and titled "SENSOR DATA COMPRESSION IN A PLASMA TOOL", which claims the benefit of and priority, under 35 U.S.C. § 119 (e), to U.S. Provisional Patent Application No. 63/030,748, filed on May 27, 2020, and titled "SENSOR DATA DECIMATION IN A PLASMA TOOL", all of which are incorporated by reference herein in their entirety.

FIELD

The embodiments described in the present disclosure relate to sensor data compression in a plasma tool.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In a plasma tool, one or more radio frequency (RF) generators are coupled to an impedance matching network. The impedance matching network is coupled to a plasma chamber. RF signals are supplied from the RF generators to the impedance matching network. The impedance matching network outputs an RF signal to the plasma chamber upon receiving the RF signals. Also, multiple process gases are supplied to a gap within the plasma chamber. When the RF signal is supplied from the impedance matching network to the plasma chamber and the process gases are supplied, a wafer is processed in the plasma chamber.

During processing of the wafer, a large amount of data is collected.

It is in this context that embodiments described in the present disclosure arise.

SUMMARY

Embodiments of the disclosure provide sensor data compression in a plasma tool. It should be appreciated that the present embodiments can be implemented in numerous ways, e.g., a process, an apparatus, a system, a piece of hardware, or a method on a computer-readable medium. Several embodiments are described below.

In an embodiment, a method for compressing data is described. The method includes receiving a plurality of measurement signals from one or more sensors coupled to a radio frequency (RF) transmission path of a plasma tool. The RF transmission path is from an output of an RF generator to an electrode of a plasma chamber. The method includes converting the plurality of measurement signals from an analog form to a digital form to sample data and processing the data to reduce an amount of the data. The amount of the data is compressed while maintaining critical information for optimized wafer processing. The method includes sending the compressed data to a controller for controlling the plasma tool. An example of the critical information includes a master maximum peak-to-peak value, a slave maximum peak-to-peak value, a master average frequency value, and an average phase value, which are described below.

In an embodiment, a compression integrated system for compressing data is described. The compression integrated system includes an analog-to-digital converter that receives a plurality of measurement signals from one or more sensors coupled to the RF transmission path of a plasma tool. The analog-to-digital converter converts the plurality of measurement signals from an analog form to a digital form to sample data. The compression integrated system includes a data compression unit coupled to the analog-to-digital converter. The data compression unit processes the data to reduce an amount of the data. The amount of the data is compressed to output compressed data. The compression integrated system includes a transmitter coupled to the data compression unit. The transmitter sends the compressed data to the controller for controlling the plasma tool.

In one embodiment, a system for compressing data is described. The system includes an RF generator that is coupled to an RF path. The RF generator supplies a first RF signal to the RF path. The system includes an RF sensor coupled to the RF path. The RF sensor senses the first RF signal and a second RF signal to output a plurality of measurement signals. The system includes a data integrated system coupled to the RF sensor. The data integrated system receives the plurality of measurement signals. The data integrated system converts the plurality of measurement signals from an analog form to a digital form to sample data and processes the data to reduce an amount of the data in a synchronized fashion. For example, the amount of the data is compressed to output compressed data in synchronization with a clock signal. The data integrated system sends the compressed data to a controller for controlling the system.

Some advantages of the herein described systems and methods for sensor data compression in the plasma tool include reducing an amount of data that is used to control the plasma tool. An RF generator supplies an RF signal that has many voltage cycles. In addition, an RF signal is reflected towards the RF generator and the reflected RF signal has many voltage cycles. A large amount of data represented by the supplied and reflected RF signals is measured. The large amount of data is overwhelming in determining which portion of the large amount of data to use in controlling the plasma tool. The systems and methods described herein provide a controlled manner for reducing the large amount of data to an amount that is not overwhelming, and is also representative of the large amount of data. As an example, the compressed amount of data includes a master maximum peak-to-peak value, a slave maximum peak-to-peak value, a master average frequency value, and an average phase value, and the compressed amount of data is generated from the large amount of data.

Other advantages of the herein described systems and methods for sensor data compression in the plasma tool include parallel processing of the sensor data. The large amount of data is stored in a number of registers and processed in a parallel manner to calculate the master maximum peak-to-peak value and the slave maximum peak-to-peak value. The parallel processing increases a speed of processing the large amount of data.

Yet another advantage of the herein described systems and methods for sensor data compression in the plasma tool includes that the large amount of data does not need to be stored in a memory device after the large amount of data is processed to determine the compressed amount of data. This reduces data storage burden and improves integrity of the data by increasing the number of significant bits (ENOB per digital measurement). For example, the critical information, described above, is generated and provided to a controller for processing.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 1C-2 is a diagram of an embodiment of a system to illustrate use of an RF sensor within a match.

FIG. 1E-1 is a diagram of an embodiment of a system to illustrate that the data compression unit is used to compress data received from multiple RF sensors coupled to outputs of matches.

FIG. 1E-2 is a diagram of an embodiment of a system to illustrate use of an RF sensor within a plasma chamber.

FIG. 2 is a diagram of an embodiment of the DCU.

FIG. 3A is a diagram to illustrate an embodiment of a method executed by a master maximum (max) peak-to-peak (PTP) determiner to determine a master maximum peak-to-peak value MMaxPTP.

FIG. 3C is a diagram to illustrate an embodiment of a method that is executed by a master average frequency determiner to determine a master average frequency MAVF.

FIG. 3D is a diagram to illustrate an embodiment of a method that is executed by an average phase determiner to determine an average phase $\phi$.

FIG. 3F-1 is an embodiment of a graph to illustrate a group of master sample data having a maximum amplitude and a minimum amplitude, and a corresponding group of slave sample data.

FIG. 3F-2 is an embodiment of a graph to illustrate that a group of slave sample data does not correspond to the group of master sample data.

FIG. 4A is a diagram of an embodiment of a system to illustrate control of an RF generator and/or an impedance matching network based on the compressed data.

FIG. 4B is a diagram of an embodiment of a system to illustrate a control of a gap between a lower electrode and a TCP coil based on the compressed data.

DETAILED DESCRIPTION

The following embodiments describe systems and methods for sensor data compression in a plasma tool. It will be apparent that the present embodiments may be practiced without some or all of these specific details. In other instances, well known process operations have not been described in detail in order not to unnecessarily obscure the present embodiments.

Figure 1A:
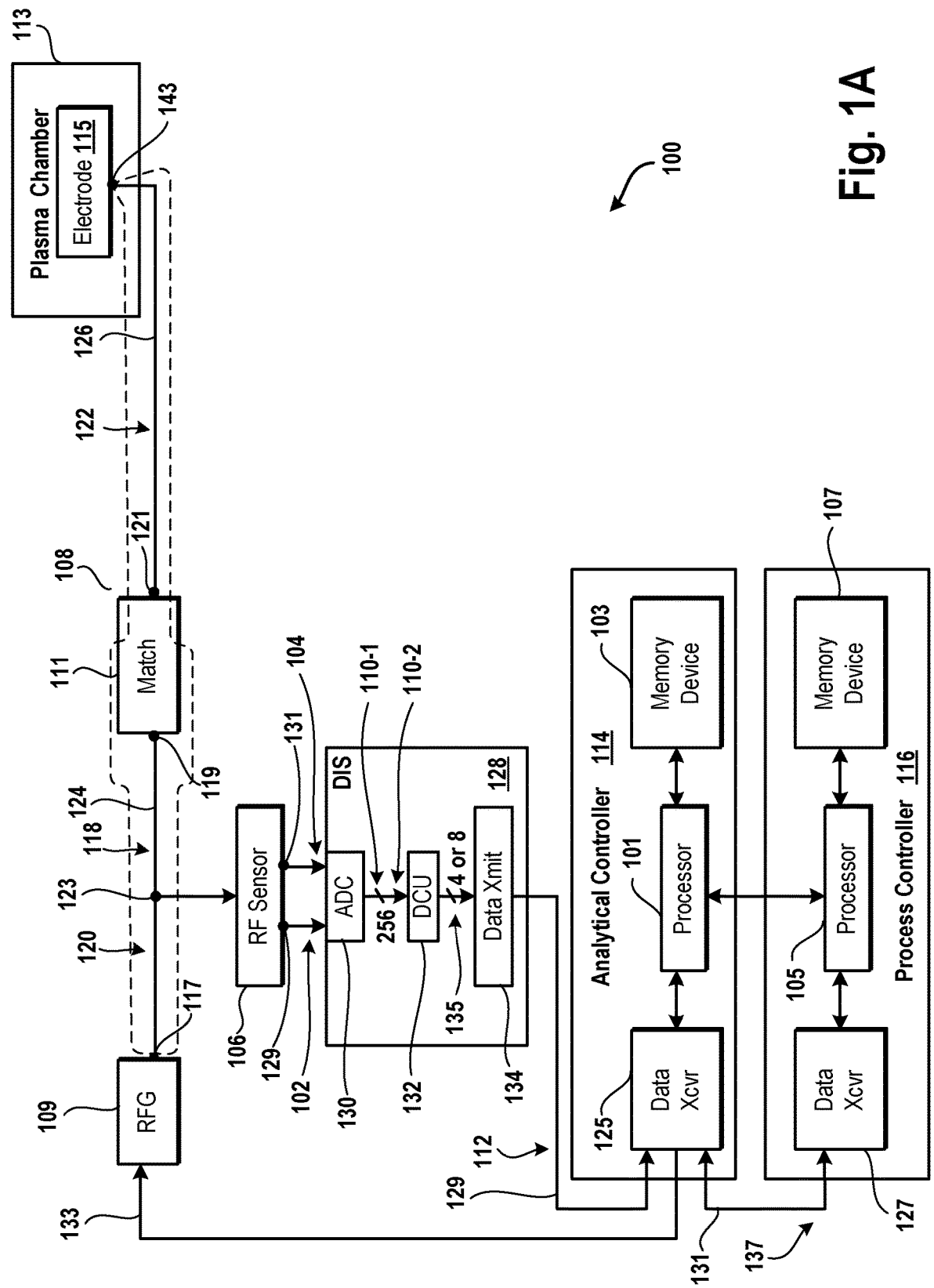
FIG. 1A is a diagram of an embodiment of a system to illustrate a data compression unit (DCU) for compressing data received from a radio frequency (RF) sensor.

FIG. 1A is a diagram of an embodiment of a system 100 to illustrate a data compression unit (DCU) 132. A plasma system, such as the system 100 is sometimes referred to herein as a plasma tool. The system 100 includes a radiofrequency (RF) generator (RFG) 109, a match 111, a plasma chamber 113, an RF sensor 106, a compression integrated system (DIS) 128, an analytical controller 114, and a process controller 116. The plasma chamber 113 includes an electrode 115, such as a transformer coupled plasma (TCP) coil or a lower electrode of a substrate support. An example of the substrate support is a chuck. The DIS 128 includes an analog-to-digital converter (ADC) 130, the DCU 132, and a data transmitter (Xmit) 134. The analytical controller 114 includes a processor 101, a memory device 103, and a data transceiver (Xcvr) 125. The process controller 116 includes a processor 105, a memory device 107, and a data transceiver 127. The system 100 further includes an RF cable 124 and an RF transmission line 126.

An example of an RF generator, as used herein, is an RF generator having an operating frequency of 100 kilohertz (kHz), or an RF generator having an operating frequency of 400 kHz, or an RF generator having an operating frequency of 1-2 megahertz (MHz), or an RF generator having an operating frequency of 13.56 MHz, or an RF generator having an operating frequency of 27 MHz, or an RF generator having an operating frequency of 60 MHz.

An example of a match, as used herein, is an impedance matching network or an impedance matching circuit. For example, a match includes a network of electrical circuit components, such as one or more capacitors, or one or more inductors, or one or more resistors, or a combination thereof, that are connected to each other. To illustrate, the match includes multiple shunt capacitors, multiple series capacitors, and inductors. As another illustration, any two of the electrical components are connected to each other in series or in parallel in the match.

An example of a plasma chamber, as used herein, includes a capacitively coupled plasma (CCP) chamber or an inductively coupled plasma (ICP) chamber. An example of an electrode, as used herein, includes the lower electrode of the chuck, or an upper electrode, or an RF coil, or a TCP coil.

Also, an example of an RF sensor, as used herein, includes a complex voltage and current (VI) probe, or a directional coupler, or a complex current sensor or a complex voltage sensor, or an impedance sensor. The complex VI probe measures a complex voltage and current, which includes a magnitude of the voltage, a magnitude of the current, and a phase between the voltage and current. The complex current sensor measures a complex current, which includes a magnitude of the current and the phase of the current. The complex voltage sensor measures a complex voltage, which includes a magnitude of the voltage and the phase of the voltage. The directional coupler is an example of a power sensor that measures supplied power and reflected power. The reflected power is sometimes referred to herein as reverse power and the supplied power is sometimes referred to herein as forward power. The supplied power is power of an RF signal 118 that is generated and supplied by the RF generator 109 to the match 111. The reflected power is power of an RF signal 120 that is reflected from the plasma chamber 113 via the RF transmission line 126, the match 111, and the RF cable 124 towards the RF generator 109. An example of the voltage sensor includes a phase mag. The phase mag measures a magnitude of a voltage and a phase of the voltage.

An example of an RF transmission line, as used herein, includes an RF cylinder and one or more RF straps that couple the RF rod to an RF cylinder. The RF cylinder is a part of the RF transmission line. The RF transmission line having the RF cylinder is used when the RF transmission line couples a match to a lower electrode. In this example, the RF rod of the RF transmission line is surrounded by an insulator material, which is surrounded by an RF sheath of the RF transmission line. Another example of an RF transmission line is an RF rod and RF straps. In this example, the RF rod of the RF transmission line is surrounded by an insulator material, which is surrounded by an RF sheath of the RF transmission line. The RF transmission line excludes an RF cylinder. The RF transmission line excluding the RF cylinder is used when the RF transmission line couples a match to an upper electrode or a TCP coil or an RF coil. Some of the RF straps couple the RF rod to the match and remaining of the RF straps coupled the RF rod to the TCP coil or the RF coil. Yet another example of an RF transmission line includes an RF rod and an RF sheath. In this example, the RF rod of the RF transmission line is surrounded by an insulator material, which is surrounded by the RF sheath.

An example of the DIS 128 is an application specific integrated circuit (ASIC) or a programmable logic device (PLD), which can be a field programmable gate array (FPGA). To illustrate, each of the ADC 130, DCU 132, and the data transmitter 134 is a programmable logic block. As another example, the DCU 132 is made from multiple logic gates, which are interconnected with each other via programmable switches. As yet another example, each of the ADC 130, the DCU 132, and the data transmitter 134 is a processor or a microcontroller. An example of the data transmitter 134 includes a universal asynchronous receiver transmitter (UART), a parallel data transmitter, an Ethernet device, and a universal serial bus (USB) communication device. The UART transmits data in a serial manner, e.g., 1 bit at a time. The parallel data transmitter transmits data in a parallel manner, e.g., multiple bits simultaneously. The USB communication device sends data after applying a USB protocol to the data. The Ethernet device sends data after applying an Ethernet protocol to the data. The Ethernet protocol is applied to generate data packets from the data.

An example of a data transceiver, as used herein, includes a UART, a parallel data transceiver, an Ethernet transceiver, and the USB communication device. The UART transmits or receives data in the serial manner. The parallel data transceiver transmits or receives data in the parallel manner. The USB communication device sends data after applying a USB protocol to data generate data packets or receives data packets and applies the USB protocol to the data packets to extract data from the data packets. The Ethernet transceiver sends data after applying the Ethernet protocol to the data to generate data packets and applies the Ethernet protocol to data packets received to extract the data from the data packets.

Examples of a processor, as used herein, include a central processing unit (CPU), a controller, a microcontroller a microprocessor, an ASIC, and a PLD. Examples of a memory device, as used herein, include a read-only memory (ROM) and a random access memory (RAM). To illustrate, a memory device, as used herein, is a flash memory or a redundant array of independent disks.

The RF generator 109 has an output 117 that is coupled to an input 119 of the match 111 via the RF cable 124 and an output 121 of the match 111 is coupled to the electrode 115 via the RF transmission line 126. The RF transmission line 126 couples the output 121 of the match 111 to an input 143 of the electrode 115. An RF path 108 includes the RF cable 124, the match 111, and the RF transmission line 126. The RF path 108 extends from the output 117 of the RF generator 109 to the input 143 of the electrode 115.

The RF sensor 106 is coupled at any point on the RF path 108. For example, the RF sensor 106 is coupled at the output 117 of the RF generator 109, or at the input 119 of the match 111, or at a point 123 on the RF cable 124, or at the output 121 of the match, or at a point on the RF transmission line 126, or to an electrical circuit component of the match 111. To illustrate, the RF cable 124 passes from an input port of the directional coupler via a channel within the directional coupler to an output port of the directional coupler. As another illustration, the RF cable 124 passes from an input port of the VI probe via a channel within the VI probe to an output port of the VI probe.

The RF sensor 106 has two measurement ports 129 and 131 that are coupled to the ADC 130. The ADC 130 is coupled to the DCU 132, which is coupled to the data transmitter 134. The data transmitter 134 is coupled via a transfer cable 129 to the data transceiver 125. Examples of a transfer cable, as used herein, include a serial transfer cable or a parallel transfer cable or a USB cable. The data transceiver 125 is coupled to the processor 101, which is coupled to the memory device 103. The data transceiver 125 is coupled via a transfer cable 131 to the data transceiver 127, which is coupled to the processor 105. The data transceiver 125 is also coupled to the RF generator via a transfer cable 133. The processor 105 is coupled to the memory device 107.

The RF generator 109 generates the RF signal 118 and supplies the RF signal from the output 117 via the RF cable 124 to the input 119 of the match 111. The match 111 receives the RF signal 118 and matches an impedance of the load coupled to the output 121 with an impedance of a source coupled to the input 119 to output a modified RF signal 122 at the output. An example of the load includes the RF transmission line 126 and the plasma chamber 113, and an example of the source includes the RF generator 109 and the RF cable 124. When the modified RF signal 122 is supplied to the electrode 115 and one or more process gases are supplied to the plasma chamber 113, plasma is stricken or maintained within the plasma chamber 113 to process a substrate within the plasma chamber 113. Examples of the one or more process gases include hydrocarbon gases (e.g., $C_xH_y$), fluorocarbon gases (e.g., $C_xF_y$), oxygen-containing gases (e.g., $O_2$), nitrogen-containing gases (e.g., $N_2$, $NH_3$) and inert gases (e.g., He, Ar). The substrate can be a semiconductor wafer or a substrate stack.

The RF sensor 106 receives the RF signals 118 and 120, and measures one or more parameters, such as forward and reflected power, or impedance, or a voltage, or complex voltage and current, or complex voltage, or complex current, to output a measurement signal 102 and another measurement signal 104. The parameter that is complex includes a magnitude and a phase. For example, the complex voltage includes a voltage magnitude and a voltage phase, and the complex current includes a current magnitude and a current phase. As another example, the complex voltage and current includes a magnitude of voltage, a magnitude of current, and a phase difference between the complex voltage and the complex current.

The measurement signal 102 is an example of a master measurement signal and the measurement signal 104 is an example of a slave measurement signal. Each measurement signal, described herein, is an electrical signal. The RF signal 118 is an example of a master RF signal and the RF signal 120 is an example of a slave RF signal. An example of the measurement signal 102 is an analog signal that indicates RF power of the RF signal 118, and an example of the measurement signal 104 is an analog signal that indicates RF power of the RF signal 120. To illustrate, the measurement signal 102 indicates supplied power and the measurement signal 104 indicates reflected power. The measurement signal 102 is sent from the port 129 of the RF sensor to the ADC 130 and the measurement signal 104 is sent from the port 131 of the RF sensor 106 to the ADC 130.

The ADC 130 receives the measurement signals 102 and 104, and converts each of the measurement signals 102 and 104 from an analog form into a digital form. For example, the ADC 130 samples the parameter, such as supplied power, from the measurement signal 102 to output sample data 110-1 to the DCU 132, and samples the parameter, such as reflected power, from the measurement signal 104 to output sample data 110-2 to the DCU 132. To illustrate, the ADC 130 samples the parameter at a rate ranging from 5.5 nanoseconds (ns) to 6.8 ns. As another illustration, the ADC 130 samples the parameter at a rate of ranging from 600 picoseconds (ps) to 900 ps. To further illustrate, the ADC 130 samples the parameter at a rate of 6.4 nanoseconds (ns) or at a rate of 800 picoseconds (ps). An example of the sample data 110-1 or the sample data 110-2 is 128 samples. To illustrate, each sample of the sample data 110-1 or the sample data 110-2 is a measured value of the parameter, and can be represented by a number of bits, such as two bits or four bits or one byte. Another example of each of the sample data 110-1 and the sample data 110-2 is 128 samples or 256 samples or 512 samples or 1024 samples or 2048 samples or an even larger number of samples. As another example, the ADC 130 samples the parameter from the measurement signals 102 and 104 in synchronization with a clock signal, which is further described below. To illustrate, the parameter is sampled from the measurement signals 102 and 104 during the same clock cycle or the same number of multiple clock cycles of the clock signal. To further illustrate, the parameter is sampled from the measurement signals 102 and 104 during clock cycles 1 through 8 or clock cycles 1 through N of the clock signal, where N is an integer greater than zero.

The DCU 132 processes the sample data 110-1 and 110-2 to output compressed data 135, and provides the compressed data 135 to the data transmitter 134. The compressed data 135 is sometimes referred to herein as reduced data. A number of samples, of the compressed data 135 is substantially less than a number of samples of the sample data 110-1 or the sample data 110-2. For example, a number of samples of the compressed data 135 is less than a number of samples of the sample data 110-1 and 110-2 by a factor of 64. To illustrate, when a number of samples of the sample data 110-1 and 110-2 is 256, a number of samples of the compressed data 135 is four.

The data transmitter 125 applies a transfer protocol, such as a serial transfer protocol, or a parallel transfer protocol, or a USB protocol, to output data units 112 including the compressed data 135, and sends the data units 112 via the transfer cable 129 to the data transceiver 125. The serial transfer protocol is applied to transfer the compressed data 135 in the serial manner. For example, each byte of the compressed data 135 is converted or segmented from bytes to bits, and the bits are transferred serially one at a time. The parallel transfer protocol is applied to transfer the compressed data 135 in the parallel manner. For example, each byte of the compressed data 135 is converted or segmented from bytes to bits, and the bits are transferred multiple bits at a time. The USB protocol is applied to generate the data packets from the compressed data 135, and transfer the data packets.

The data transceiver 125 receives the data units 112 and applies the transfer protocol to the data unit 112 to extract the compressed data 135 from the data units 112. For example, the compressed data 135 is extracted by converting bits received in the serial manner or the parallel manner into bytes. As another example, the data packets are converted into bytes of the compressed data 135. The data transceiver 125 provides the compressed data 135 to the processor 101, which can store, e.g., write, the compressed data 135 into the memory device 103.

The processor 101 obtains the compressed data 135 from the memory device 103 and sends the compressed data 135 to the data transceiver 135. For example, upon receiving a request from the processor 105 via the data transceiver 127, the transfer cable 131, and the data transceiver 125, the processor 101 reads the compressed data 135 from the memory device 103. The data transceiver 135 applies the transfer protocol to the compressed data 135 to generate data units 137 and sends the data units 137 via the transfer cable 131 to the data transceiver 127. The data transceiver 127 applies the transfer protocol to the data units 137 to extract the compressed data 135 from the data units 137, and provides the compressed data 135 to the processor 105. The processor 105 stores the compressed data 135 in the memory device 107.

In one embodiment, there is no need for the DIS 128 to store the sample data 110-1 and 110-2 after the compressed data 135 is generated. For example, the DIS 128 deletes the sample data 110-1 and 110-2 from a buffer, such as a ring buffer, that is used to store the sample data 110-1 and 110-2 after the sample data 110-1 and 110-2 is used to generate the compressed data 135. As another example, each of the measurement signals 102 and 104 is continuously being converted from an analog form to a digital form to output the sample data 110-1 and 110-2, and the sample data 110-1 and 110-2 is continuously being processed by the DCU 132 to generate the compressed data 135.

In one embodiment, the sample data 110-1 and the sample data 110-2 from which the compressed data 135 is generated is not stored in a memory device after generation of the compressed data 135. Hence, the sample data 110-1 and 110-2 is decimated or rendered unavailable for subsequent use. For example, the DCU 132 does not include a buffer or a memory device for storing the sample data 110-1 and 110-2 after generation of the compressed data 135. As another example, when the sample data 110-1 and 110-2 is not stored within the memory device after processing the sample data 110-1 and 110-2 to generate the compressed data 135, the sample data 110-1 and 110-2 is decimated.

In an embodiment, the sample data 110-1 is output from the ADC 130 via one channel to the DCU 132 and the sample data 110-2 is output from the ADC 130 via another channel to the DCU 132. Examples of a channel include a conductor or a via or a metal link or a metal path. The sample data 110-1 and 110-2 are output in a synchronized manner from the ADC 130 to the DCU 132. For example, the sample data 110-1 and 110-2 are output from the ADC 130 to the DCU 132 in synchronization with the clock signal, which is described below. To illustrate, the sample data 110-1 and 110-2 are output from the ADC 130 to the DCU 132 during the same clock cycle of the clock signal or during a pre-determined number of clock cycles, such as N clock cycles, of the clock signal.

In one embodiment, the process controller 116 is coupled to the analytical controller 114 via a computer network, such as a wide area network (WAN) or a local area network (LAN) or a combination thereof. An example of WAN is the Internet and an example of LAN is an Intranet. For example, all communication between the process controller 116 and the analytical controller 114 occur via a network communication device of the analytical controller 114 and a network communication device of the process controller 116. Examples of a network communication device include a network interface controller, such as a network interface card (NIC). The processor 101 is coupled to the network communication device of the analytical controller 114 and the processor 105 is coupled to the network communication device of the process controller 116. As an example, all communication between network communication devices, described herein, occur using a communication protocol, such as an Internet protocol (IP), or Transmission Control Protocol (TCP) over IP.

In an embodiment, each RF generator, described herein, and the DIS 128, are coupled via multiple network communication devices and the computer network to the processor 101 of the analytical controller 114. For example, a network communication device of the analytical controller 114 is coupled to a network communication device of an RF generator, described herein, via the computer network. The network communication device of the analytical controller 114 is also coupled to a network communication device of the DIS 128 via the computer network. The processor 101 of the analytical controller 114 is coupled to the network communication device of the analytical controller 114, and a controller, such as a digital signal processor and a memory device, within the RF generator is coupled to the network communication device of the RF generator. The digital signal processor is coupled to the memory device of the RF generator. As used herein, each RF generator includes the controller that is coupled to an RF power supply, such as an electronic oscillator, of the RF generator. The RF power supply generates an RF signal. The DCU 130 of the DIS 128 is coupled to the network communication device of the DIS 128.

In an embodiment, the RF sensor 106 is integrated within the RF generator 109. For example, the RF sensor 106 is a component of the RF generator 109. As another example, the RF sensor 106 is located within a housing or enclosure of the RF generator 109.

In one embodiment, the RF sensor 106 is integrated within the match 111. For example, the RF sensor 106 is a component of the match 111. As another example, the RF sensor 106 is located within a housing or enclosure of the match 111.

In an embodiment, a moving average processor, such as a moving average filter, is coupled between the ADC 130 and the DCU 132. The moving average processor calculates a moving average from sample data that is output from the ADC 130. The sample data is output from the ADC 130 based on a measurement signal, such as the measurement signal 118 or 120. For example, the moving average processor calculates the moving average from for a pre-determined block of time. The moving average processor calculates the moving average to provide moving average data, which is sampled by the ADC 130 to output sample data, such as the sample data 110-1 or 110-2.

Figure 1B:
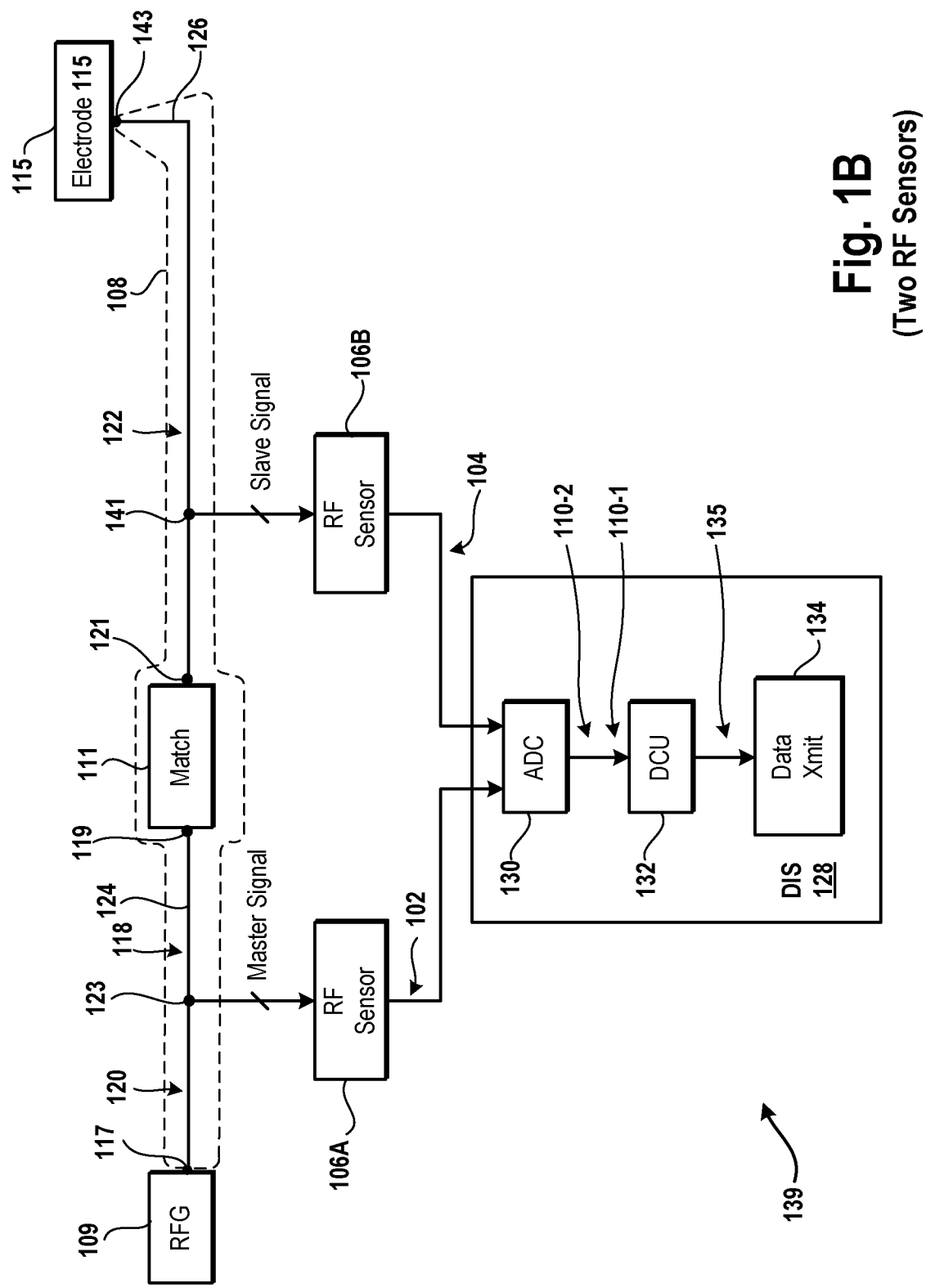
FIG. 1B is a diagram of an embodiment of a system to illustrate that the data compression is used to compress data received from multiple RF sensors.

FIG. 1B is a diagram of an embodiment of a system 139 to illustrate that instead of the RF sensor 106, multiple RF sensors 106A and 106B are used. A plasma system, such as the system 139 is sometimes referred to herein as a plasma tool. The system 139 is the same as the system 100 of FIG. 1A except that the system 139 includes the RF sensors 106A and 106B in place of the RF sensor 106. Examples of the RF sensors 106A and 106B are provided above. The RF sensor 106A is coupled to the point 123 between the output 117 and the input 119.

The RF sensor 106B is coupled at a point 141 on the RF transmission line 126. For example, the RF rod of the RF transmission line 126 passes from an input port of the RF sensor 106B via a channel within the RF sensor 106B to an output port of the RF sensor 106B. The point 141 is located between the output 121 and the electrode 115.

The RF sensor 106A measures the parameter, such as a complex voltage, at the point 123 to output the measurement signal 102 to the ADC 130. Moreover, the RF sensor 106B measures the parameter, such as a complex voltage, at the point 141 to output the measurement signal 104 to the ADC 130.

In one embodiment, the RF sensor 106B is coupled to the output 121 or at any other point on the RF transmission line 126. For example, the RF sensor 106B is coupled to the cylinder or an RF strap of the RF transmission line 126.

In an embodiment, the RF sensor 106A is integrated within the RF generator 109 or within the match 111. For example, the RF sensor 106A is a component of the RF generator 109 or of the match 111. As another example, the RF sensor 106A is located within a housing or enclosure of the RF generator 109 or a housing or enclosure of the match 111.

In one embodiment, the RF sensor 106B is integrated within the match 111. For example, the RF sensor 106B is a component of the match 111. As another example, the RF sensor 106B is located within a housing or enclosure of the match 111.

Figures 1, 1C:
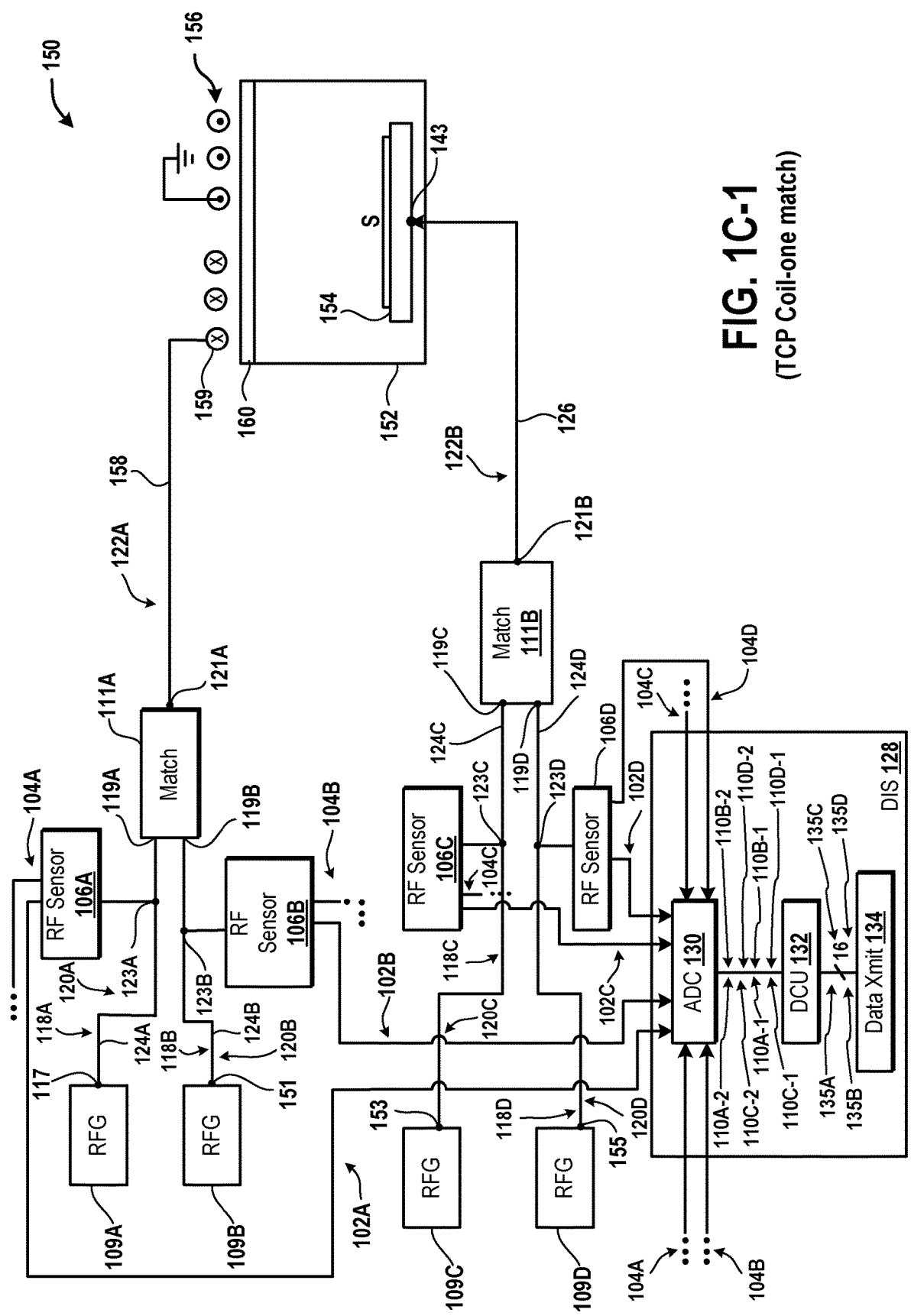
FIG. 1C-1 is a diagram of an embodiment of a system to illustrate the data compression unit is used to compress data received from an RF sensor that is coupled to a match, which is coupled to a transformer coupled plasma (TCP) coil.

FIG. 1C-1 is a diagram of an embodiment of a system 150 to illustrate generation of measurement signals 102A, 102B, 102C, and 102D for providing to the ADC 130. Each of the measurement signals 102A-102D is an example of the master measurement signal. A plasma system, such as the system 150 is sometimes referred to herein as a plasma tool. The system 150 includes an RF generator 109A, an RF generator 109B, an RF generator 109C, an RF generator 109D, the RF sensor 106A, the RF sensor 106B, an RF sensor 106C, an RF sensor 106D, a match 111A, another match 111B, the DIS 128, and a plasma chamber 152.

The plasma chamber 152 is a TCP plasma chamber having a TCP coil 156 and a dielectric window 160. The TCP coil 156 is located above the dielectric window 160. The plasma chamber 152 further includes a lower electrode 154 on which a substrate S is placed for processing.

The output 117 of the RF generator 109A is coupled to an input 119A of the match 111A via an RF cable 124A and an output 151 of the RF generator 109B is coupled to another input 119B of the match 111A via another RF cable 124B. An output 121A of the match 111A is coupled via an RF transmission line 158 to an input 159 of the TCP coil 156. An example of the RF transmission line 158 is an RF rod that is surrounded by an insulator, which is surrounded by an RF sheath.

Similarly, an output 153 of the RF generator 109C is coupled to an input 119C of the match 111B via an RF cable 124C and an output 155 of the RF generator 109C is coupled to another input 119D of the match 111B via another RF cable 124D. An output 121B of the match 111B is coupled via the RF transmission line 126 to the input 143 of the lower electrode 154. The RF sensors 106A-106D are coupled to the ADC 130.

The RF sensor 106A is coupled at a point 123A on the RF cable 124A. For example, the RF cable 124A passes from an input port of a directional coupler via a channel within the directional coupler to an output port of the directional coupler. Similarly, the RF sensor 106B is coupled at a point 123B on the RF cable 124B, the RF sensor 106C is coupled at a point 123C on the RF cable 124C, and the RF sensor 106D is coupled at a point 123D on the RF cable 124D. For example, the RF cable 124B passes from an input port of the RF sensor 106B via a channel within the RF sensor 106B to an output port of the RF sensor 106B, the RF cable 124C passes from an input port of the RF sensor 106C via a channel within the RF sensor 106C to an output port of the RF sensor 106C, and the RF cable 124D passes from an input port of the RF sensor 106D via a channel within the RF sensor 106D to an output port of the RF sensor 106D.

An RF path includes the RF generator 109A, the RF cable 124A, the match 111A, and the RF transmission line 158, and extends from the output 117 of the RF generator 109A to the input 159 of the TCP coil 156. Another RF path includes the RF generator 109B, the RF cable 124B, the match 111A, and the RF transmission line 158, and extends from the output 151 of the RF generator 109B to the input 159 of the TCP coil 156. Yet another RF path includes the RF generator 109C, the RF cable 124C, the match 111B, and the RF transmission line 126, and extends from the output 153 of the RF generator 109C to the input 143 of the lower electrode 154. Another RF path includes the RF generator 109D, the RF cable 124D, the match 111B, and the RF transmission line 126, and extends from the output 155 of the RF generator 109D to the input 143 of the lower electrode 154.

The RF generator 109A generates an RF signal 118A and supplies the RF signal 118A via the RF cable 124A to the input 119 A of the match 111A. Moreover, the RF generator 109B generates an RF signal 118B and supplies the RF signal 118B via the RF cable 124B to the input 119B of the match 111A. The match 111A receives the RF signals 118A and 118B and matches an impedance of a load coupled to the output 121A with that of a source coupled to the inputs 119A and 119B to provide a modified RF signal 122A at the output 121A. An example of the source coupled to the inputs 119A and 119B includes the RF cables 124A and 124B and the RF generators 109A and 109B. An example of the load coupled to the output 121A includes the RF transmission line 158 and the plasma chamber 152. The modified RF signal 122B is supplied to the TCP coil 156 via the RF transmission line 158.

Similarly, the RF generator 109C generates an RF signal 118C and supplies the RF signal 118C via the RF cable 124C to the input 119C of the match 111B. Also, the RF generator 109D generates an RF signal 118D and supplies the RF signal 118D via the RF cable 124D to the input 119D of the match 111B. The match 111B receives the RF signals 118C and 118D and matches an impedance of a load coupled to the output 121B with that of a source coupled to the inputs 119C and 119D to provide a modified RF signal 122B at the output 121B. An example of the source coupled to the inputs 119C and 119D include the RF cables 124C and 124D and the RF generators 109C and 109D. An example of the load coupled to the output 121B includes the RF transmission line 126 and the plasma chamber 152. The modified RF signal 122B is supplied to the lower electrode 154 via the RF transmission line 126.

When the modified RF signals 122A and 122B are supplied to the plasma chamber 152 in addition to the one or more process gases, plasma is generated or maintained within the plasma chamber 152 to process the substrate S. Moreover, when the modified RF signals 122A and 122B are supplied to the plasma chamber 152, an RF signal 120A is reflected from the plasma chamber 152 via the RF transmission line 158 and the match 111A and the RF cable 124A towards the RF generator 109A. Similarly, an RF signal 120B is reflected from the plasma chamber 152 via the RF transmission line 158 and the match 111A and the RF cable 124B towards the RF generator 109B, an RF signal 120C is reflected from the plasma chamber 152 via the RF transmission line 126 and the match 111B and the RF cable 124C towards the RF generator 109C, and an RF signal 120D is reflected from the plasma chamber 152 via the RF transmission line 126 and the match 111D and the RF cable 124D towards the RF generator 109D. Each RF signal 118A, 118B, 118C, and 118D is an example of the master RF signal and each RF signal 120A-120D is an example of the slave RF signal.

When the substrate S is being processed, each of the RF sensors 106A-106D senses the parameter to output multiple measurement signals. For example, the RF sensor 106A senses the parameter at the point 123A to output the measurement signal 102A and provides the measurement signal 102A to the ADC 130, and the RF sensor 106B senses the parameter at the point 123B to output a measurement signal 102B and provides the measurement signal 102B to the ADC 130. To illustrate, the RF sensor 106A senses supplied power of the RF signal 118A and the RF sensor 106B senses supplied power of the RF signal 118B. As another illustration, the RF sensor 106A senses reflected power of the RF signal 120A and the RF sensor 106B senses reflected power of the RF signal 120B. As yet another illustration, the RF sensor 106A senses supplied power of the RF signal 118A and the RF sensor 106B senses reflected power of the RF signal 120B. As another illustration, the RF sensor 106A senses reflected power of the RF signal 120A and the RF sensor 106B senses supplied power of the RF signal 118B.

Similarly, the RF sensor 106C senses the parameter at the point 123C to output the measurement signal 102C and provides the measurement signal 102C to the ADC 130, and the RF sensor 106D senses the parameter at the point 123D to output the measurement signal 102D and provides the measurement signal 102D to the ADC 130. To illustrate, the RF sensor 106C senses supplied power of the RF signal 118C and the RF sensor 106D senses supplied power of the RF signal 118D.

In addition to the measurement signals 102A-102D, the RF sensors 106A-106D generates additional measurement signals 104A, 104B, 104C, and 104D by measuring the parameter, such as reflected power. For example, the RF sensor 106A senses the reflected power of the RF signal 120A to output the measurement signal 104A based on the reflected power, and provides the measurement signal 104A to the ADC 130, and the RF sensor 106B senses the reflected power of the RF signal 120B to output the measurement signal 104B based on the reflected power and provides the measurement signal 104B to the ADC 130. As another example, the RF sensor 106C senses the reflected power of the RF signal 120C to output the measurement signal 104C based on the reflected power, and provides the measurement signal 104C to the ADC 130, and the RF sensor 106D senses the reflected power of the RF signal 120D to output the measurement signal 104D based on the reflected power and provides the measurement signal 104D to the ADC 130. Each of the measurement signals 104A-104D is an example of the slave measurement signal.

The ADC 130 converts each of the measurement signals 102A, 104A, 102B, and 104B from an analog form to a digital form to sample the measurement signal. For example, the measurement signal 102A is sampled to output sample data 110A-1, and the measurement signal 104A is sampled to output sample data 110A-2. An example of the sample data 110A-1 or 110A-2 is 128 samples or 256 samples or 512 samples. To illustrate, each sample of the sample data 110A-1 or 110A-2 is a measured value of the parameter, and can be represented by a number of bits, such as two bits or four bits or one byte. Similarly, the measurement signal 102B is sampled to output sample data 110B-1 and the measurement signal 104B is sampled to output sample data 110B-2.

Also, the ADC 130 converts each of the measurement signals 102C, 104C, 102D, and 104D from an analog form to a digital form to sample the measurement signal. For example, the measurement signal 102C is sampled to output sample data 110C-1, the measurement signal 104C is sampled to output sample data 110C-2, the measurement signal 102D is sampled to output sample data 110D-1, and the measurement signal 104D is sampled to output sample data 110D-2. An example of the sample data 110C-1 or 110C-2 is 128 samples or 256 samples or 512 samples. To illustrate, each sample of the sample data 110C-1 or 110C-2 is a measured value of the parameter, and can be represented by a number of bits, such as two bits or four bits or one byte.

The DCU 132 processes the sample data 110A-1 and 110A-2 to provide compressed data 135A at its output, processes the sample data 110B-1 and 110B-2 to provide compressed data 135B at its output, processes the sample data 110C-1 and 110C-2 to provide compressed data 135C at its output, and processes the sample data 110D-1 and 110D-2 to provide compressed data 135D at its output. For example, the DCU 132 processes the sample data 110A-1 and 110A-2 to compress the sample data 110A-1 and 110A-2 from 256 samples to 4 or 8 samples, and processes the sample data 110B-1 and 110B-2 to compress the sample data 110B-1 and 110B-2 from 256 samples to 4 or 8 samples.

The DCU 132 sends the compressed data 135A, 135B, 135C, and 135D to the data transmitter 134. The data transmitter 134 sends the compressed data 135A, 135B, 135C, and 135D to the processor 101 (FIG. 1A) for processing.

In one embodiment, more than one TCP coil, such as two or three TCP coils, are located above the dielectric window 160. In an embodiment, one or more TCP coils are located to a side of the plasma chamber 152 in addition to the TCP coil 156 being located above the dielectric window 160.

In one embodiment, the RF sensor 106A or the RF sensor 106B is coupled at a point on the RF transmission line 158. For example, the RF rod of the RF transmission line 158 is coupled to an input port of the RF sensor 106B and passes from the input port via the RF sensor 106B to be coupled to an output port of the RF sensor 106B. The RF rod of the RF transmission line 158 is coupled from the output port of the RF sensor 106B to the TCP coil 156.

In an embodiment, more than two RF generators are coupled to a match (not shown) that is used in place of the match 111B. The match has three inputs instead of the two inputs 119C and 119D. For example, three RF generators are coupled to the match having the three inputs. The three RF generators include the RF generators 109C and 109D, and a third RF generator. The three inputs include two inputs, similar to the inputs 124C and 124D, and a third input. In this embodiment, an RF sensor is coupled at a point on an RF cable that is coupled between the third RF generator and the match having the three inputs. The RF cable is coupled to the third RF generator and to the third input of the match. The RF generators 109C and 109D are coupled to the two inputs of the match.

In one embodiment, the sample data 110A-1 and the sample data 110A-2 from which the compressed data 135A is generated is not stored in a memory device after generation of the compressed data 135A. For example, the DCU 132 does not include a buffer or a memory device for storing the sample data 110A-1 and 110A-2 after generation of the compressed data 135A. As another example, when the sample data 110A-1 and 110A-2 is not stored within the memory device after processing the sample data 110A-1 and 110A-2 to generate the compressed data 135A, the sample data 110A-1 and 110A-2 is compressed.

In an embodiment, the sample data 110B-1 and the sample data 110B-2 from which the compressed data 135B is generated is not stored in a memory device after generation of the compressed data 135B. For example, the DCU 132 does not include a buffer or a memory device for storing the sample data 110B-1 and 110B-2 after generation of the compressed data 135B. As another example, when the sample data 110B-1 and 110B-2 is not stored within the memory device after processing the sample data 110B-1 and 110B-2 to generate the compressed data 135B, the sample data 110B-1 and 110B-2 is compressed.

In one embodiment, the sample data 110C-1 and the sample data 110C-2 from which the compressed data 135C is generated is not stored in a memory device after generation of the compressed data 135C. For example, the DCU 132 does not include a buffer or a memory device for storing the sample data 110C-1 and 110C-2 after generation of the compressed data 135C. As another example, when the sample data 110C-1 and 110C-2 is not stored within the memory device after processing the sample data 110C-1 and 110C-2 to generate the compressed data 135C, the sample data 110C-1 and 110C-2 is compressed.

In one embodiment, the sample data 110D-1 and the sample data 110D-2 from which the compressed data 135D is generated is not stored in a memory device after generation of the compressed data 135D. For example, the DCU 132 does not include a buffer or a memory device for storing the sample data 110D-1 and 110D-2 after generation of the compressed data 135D. As another example, when the sample data 110D-1 and 110D-2 is not stored within the memory device after processing the sample data 110D-1 and 110D-2 to generate the compressed data 135D, the sample data 110D-1 and 110D-2 is compressed.

In an embodiment, the RF sensor 106A is integrated within the RF generator 109A or within the match 111A. For example, the RF sensor 106A is a component of the RF generator 109A or of the match 111A. As another example, the RF sensor 106A is located within a housing or enclosure of the RF generator 109A or a housing or enclosure of the match 111A.

In one embodiment, the RF sensor 106B is integrated within the RF generator 109B or within the match 111B. For example, the RF sensor 106B is a component of the RF generator 109B or of the match 111B. As another example, the RF sensor 106B is located within a housing or enclosure of the RF generator 109B or a housing or enclosure of the match 111B.

In an embodiment, the RF sensor 106C is integrated within the RF generator 109C or within the match 111B. For example, the RF sensor 106C is a component of the RF generator 109C or of the match 111B. As another example, the RF sensor 106C is located within a housing or enclosure of the RF generator 109C or a housing or enclosure of the match 111B. In one embodiment, the RF sensor 106D is integrated within the RF generator 109D or within the match 111B. For example, the RF sensor 106D is a component of the RF generator 109D or of the match 111B. As another example, the RF sensor 106D is located within a housing or enclosure of the RF generator 109D or a housing or enclosure of the match 111B.

Figure 1D:
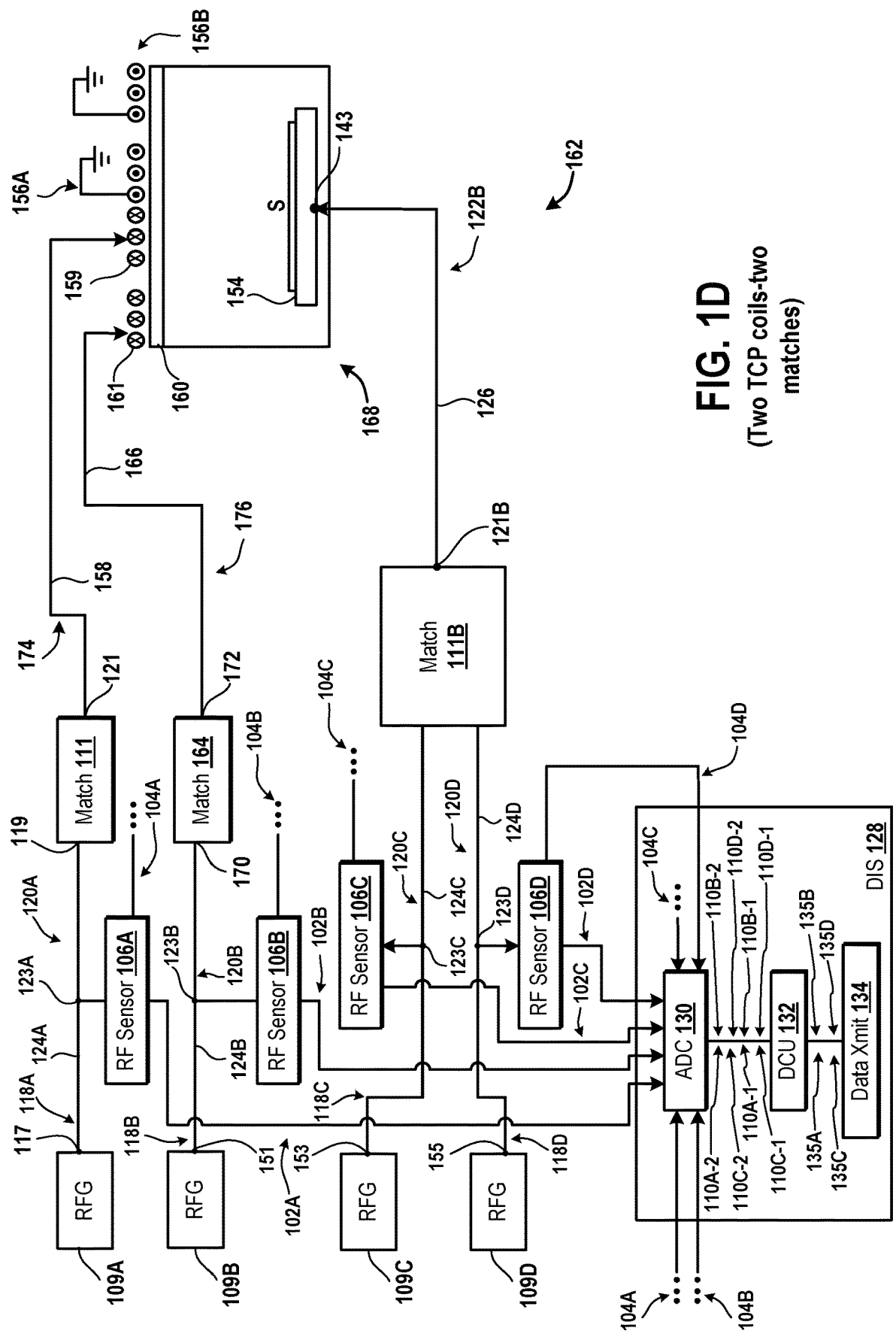
FIG. 1D is a diagram of an embodiment of a system to illustrate that the data compression unit is used to compress data received from multiple RF sensors that are coupled to different matches, which are coupled to multiple TCP coils.
Figures 1, 1E, 2:
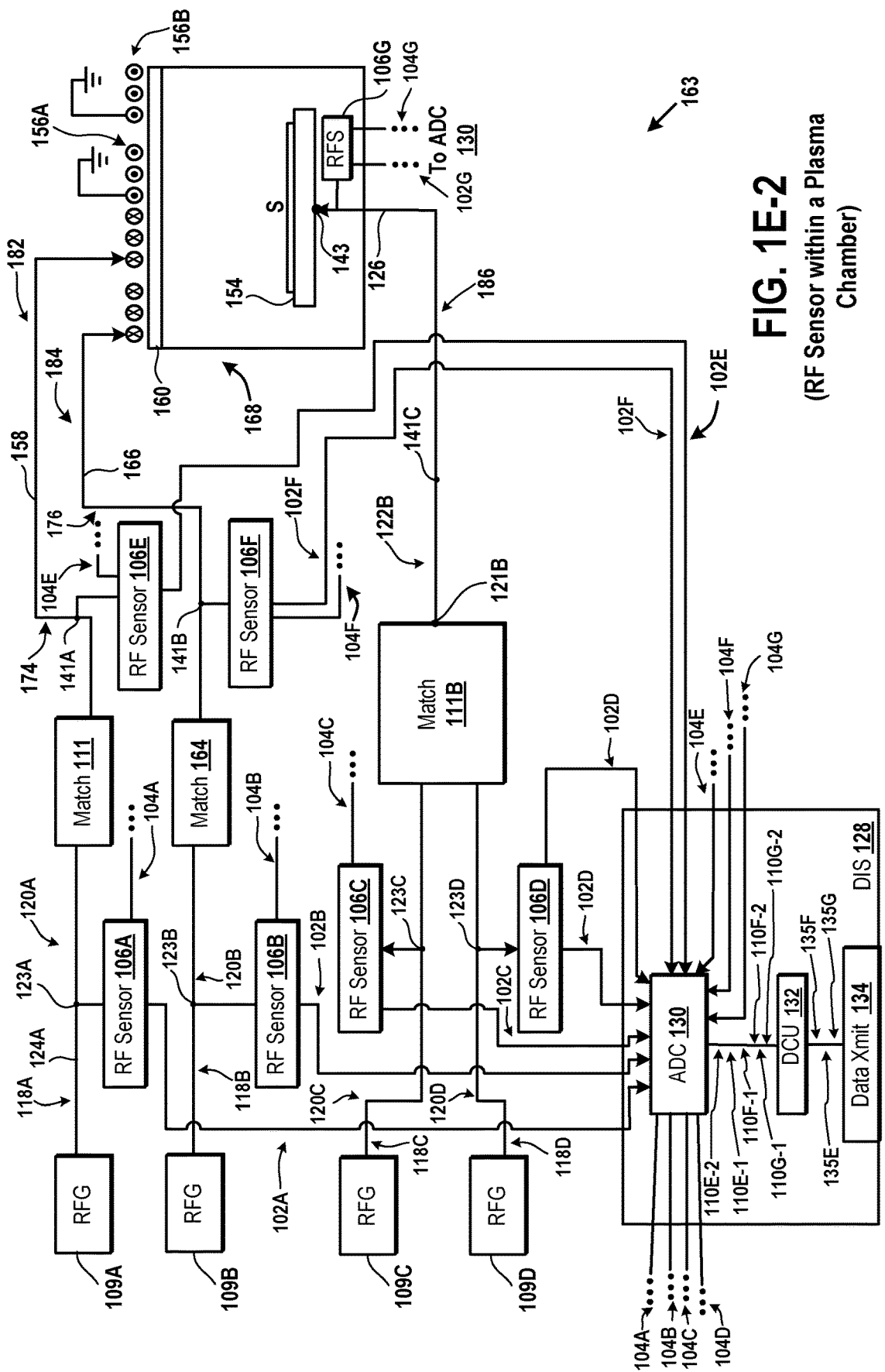

FIG. 1C-2 is a diagram of an embodiment of a system 145 to illustrate use of an RF sensor 147 within the match 111A. The system 145 has the same components as the system 150 (FIG. 1C-1) except that the system 145 further includes the RF sensor 147.

The RF sensor 147 is situated within a housing of the match 111A. For example, the match 111A includes a first branch circuit that is coupled between the input 119A and the output 121A and a second branch circuit that is coupled between the input 119B and the output 121A. The first branch circuit is coupled to the second branch circuit at a connection point between the output 121A and the inputs 119A and 119B. The RF sensor 147 is coupled to the connection point, the output 121A, or at a point between the connection point and the output 121A.

The RF sensor 147 is coupled to the ADC 130. When the substrate S is being processed, the RF sensor 147 senses the parameter to generate a measurement signal 102D-1 and another measurement signal 104D-1. The ADC 130 converts each of the measurement signals 102D-1 and 104D-1 from an analog form to a digital form to sample the measurement signal. For example, the measurement signal 102D-1 is sampled to output sample data 149A, and the measurement signal 104D-1 is sampled to output sample data 149B.

The DCU 132 processes the sample data 149A and 149B to provide compressed data 157 at its output. For example, the DCU 132 processes the sample data 149A and 149B to compress the sample data 149A and 149B from 256 samples to 8 samples or 4 samples.

The DCU 132 sends the compressed data 157 to the data transmitter 134. The data transmitter 134 sends the compressed data 157 to the processor 101 (FIG. 1A) for processing.

In one embodiment, instead of processing the compressed data 157, the processor 101 sends the compressed data 157 to the processor 105 for processing.

In one embodiment, instead of being located within the match 111A, the RF sensor 147 is coupled at a point on the RF transmission line 158. For example, the RF sensor 147 is coupled to the RF rod of the RF transmission line 158.

It should be noted that in one embodiment of the present disclosure, all RF sensors, described herein, are non-directional sensors that sense the parameters in both directions, forward and reverse or forward and reflected. To illustrate, the RF sensor 106A sends both forward power and reflected power. The forward power is sensed to output the measurement signal 102A and the reflected power is sensed to output the measurement signal 102B. In an embodiment, instead of any of the non-directional RF sensors, described herein, a directional RF sensor can be used. As an example, a directional RF sensor is coupled to an RF transmission line or located within a match. To illustrate, instead of the RF sensor 147, a directional RF sensor that senses the parameter in a single direction is used. To further illustrate, the directional RF sensor senses either forward power or reflected power but not both to output a single measurement signal. As another example, a directional sensor senses a magnitude of the parameter and a phase of the parameter. As another example, a directional sensor measures a phase of an RF signal that is generated by a source. In the example, the RF signal is supplied from the source to a load, such as a plasma chamber. In the example, the source is an RF generator. As yet another example, a directional sensor measures a phase of an RF signal that is reflected from a load. In the example, the signal is reflected from the load, such as a plasma chamber. The signal is reflected towards a source, such as an RF generator.

FIG. 1D is a diagram of an embodiment of a system 162 to illustrate use of the DIS 128 with the RF sensors 106A and 106B that are coupled to different matches 111 and 164. A plasma system, such as the system 162 is sometimes referred to herein as a plasma tool. The system 162 includes the RF generators 109A-109D, the RF sensors 106A-106D, the match 111, the match 164, the match 111B, a plasma chamber 168, and the DIS 128. The system 162 is the same as the system 150 of FIG. 1C-1 except that the system 162 includes the match 164 that is coupled via an RF transmission line 166 to a TCP coil 156B of the plasma chamber 168.

The plasma chamber 168 has a TCP coil 156A, the TCP coil 156B, and the dielectric window 160. The TCP coil 156B is an outer coil and the TCP coil 156A is an inner TCP coil. The TCP coil 156B has a larger diameter than the TCP coil 156A. For example, each turn of the TCP coil 156B has a larger diameter than each turn of the TCP coil 156A. The TCP coils 156A and 156B are located above the dielectric window 160.

The RF generator 109A is coupled to the input 119 of the match 111 via the RF cable 124A and the output 121 of the match 111 is coupled via the RF transmission line 158 to the input 159 of the TCP coil 156A. Also, the RF generator 109B is coupled to an input 170 of the match 172 via the RF cable 124B and an output 172 of the match 172 is coupled via the RF transmission line 166 to an input 161 of the TCP coil 156B. The RF sensor 106A is coupled at the point 123A on the RF cable 124A and the RF sensor 106B is coupled at the point 123B on the RF cable 124B.

An RF path includes the RF generator 109A, the RF cable 124A, the match 111, and the RF transmission line 158, and extends from the output 117 of the RF generator 109A to the input 159 of the TCP coil 156A. Another RF path includes the RF generator 109B, the RF cable 124B, the match 164, and the RF transmission line 166, and extends from the output 151 of the RF generator 109B to the input 161 of the TCP coil 156B. Yet another RF path includes the RF generator 109C, the RF cable 124C, the match 111B, and the RF transmission line 126, and extends from the output 153 of the RF generator 109C to the input 143 of the lower electrode 154. Another RF path includes the RF generator 109D, the RF cable 124D, the match 111B, and the RF transmission line 126, and extends from the output 155 of the RF generator 109D to the input 143 of the lower electrode 154.

The RF generator 109A generates the RF signal 118A and supplies the RF signal 118A via the RF cable 124A to the input 119 of the match 111. The match 111 receives the RF signal 118A and matches an impedance of a load coupled to the output 121 with that of a source coupled to the input 119 to output a modified RF signal 174. An example of the load coupled to the output 121 includes the RF transmission line 158 and the plasma chamber 168. An example of the source coupled to the input 119 includes the RF cable 124A and the RF generator 109A. When the RF signal 118A is supplied, the reflected RF signal 120A is reflected towards the RF generator 109A from the plasma chamber 168 via the RF transmission line 158, the match 111, and the RF cable 124A.

Similarly, the RF generator 109B generates the RF signal 118B and supplies the RF signal 118B via the RF cable 124B to the input 170 of the match 164. The match 164 receives the RF signal 118B and matches an impedance of a load coupled to the output 172 with that of a source coupled to the input 170 to output a modified RF signal 176. An example of the load coupled to the output 172 includes the RF transmission line 166 and the plasma chamber 168. An example of the source coupled to the input 170 includes the RF cable 124B and the RF generator 109B. When the RF signal 118B is supplied, the reflected RF signal 120B is reflected towards the RF generator 109B from the plasma chamber 168 via the RF transmission line 166, the match 164, and the RF cable 124B.

When the modified RF signals 174, 176, and 122B are supplied to the plasma chamber 168 and the one or more process gases are supplied to the plasma chamber 168, plasma is stricken or maintained within the plasma chamber 168 to process the substrate S placed on top of the lower electrode 154 of the plasma chamber 168. Moreover, when the modified RF signals 174, 176, and 122B are supplied to the plasma chamber 168, the RF signal 120A is reflected from the plasma chamber 168 via the RF transmission line 158 and the match 111 to the RF generator 109A. Also, when the modified RF signals 174, 176, and 122B are supplied to the plasma chamber 168, the RF signal 120B is reflected from the plasma chamber 168 via the RF transmission line 166 and the match 164 to the RF generator 109B. Each RF signal 118A-118D is an example of the master RF signal and each RF signal 120A-120D is an example of the slave RF signal.

Each of the RF sensors 106A-106D senses the parameter to output multiple measurement signals. For example, the RF sensor 106A senses the parameter at the point 123A to output the measurement signal 102A and provides the measurement signal 102A to the ADC 130, and the RF sensor 106B senses the parameter at the point 123B to output the measurement signal 102B and provides the measurement signal 102B to the ADC 130. To illustrate, the RF sensor 106A senses supplied power of the RF signal 118A and the RF sensor 106B senses supplied power of the RF signal 118B. As another illustration, the RF sensor 106A senses supplied power of the RF signal 118A and the RF sensor 106B senses reflected power of the RF signal 120B. As yet another illustration, the RF sensor 106A senses reflected power of the RF signal 120A and the RF sensor 106B senses supplied power of the RF signal 118B. As another illustration, the RF sensor 106A senses reflected power of the RF signal 120A and the RF sensor 106B senses reflected power of the RF signal 120B.

In addition to the measurement signals 102A-102D, the RF sensors 106A-106D generate the measurement signals 104A, 104B, 104C, and 104D by measuring the parameter, such as reflected power. For example, the RF sensor 106A senses the reflected power of the RF signal 120A to output the measurement signal 104A based on the reflected power, and provides the measurement signal 104A to the ADC 130, and the RF sensor 106B senses the reflected power of the RF signal 120B to output the measurement signal 104B based on the reflected power and provides the measurement signal 104B to the ADC 130.

In one embodiment, the TCP coil 156B is located to a side of the plasma chamber 168 rather than above the dielectric window 160.

In an embodiment, the RF sensor 106A is coupled at a point on the RF transmission line 158 instead of being coupled to the RF cable 124A.

In one embodiment, the RF sensor 106B is coupled at a point on the RF transmission line 166 instead of being coupled to the RF cable 124B.

In one embodiment, the RF sensor 106A is integrated within the RF generator 109A or within the match 111. For example, the RF sensor 106A is a component of the RF generator 109A or of the match 111. As another example, the RF sensor 106A is located within a housing or enclosure of the RF generator 109A or a housing or enclosure of the match 111.

In an embodiment, the RF sensor 106B is integrated within the RF generator 109B or within the match 164. For example, the RF sensor 106B is a component of the RF generator 109B or of the match 164. As another example, the RF sensor 106B is located within a housing or enclosure of the RF generator 109B or a housing or enclosure of the match 164.

FIG. 1E-1 is a diagram of an embodiment of a system 180 to illustrate use of RF sensors 106E, 106F, and 106G. A plasma system, such as the system 180 is sometimes referred to herein as a plasma tool. The system 180 is the same as the system 162 (FIG. 1D) except that the system 180 includes the RF sensors 106E, 106F, and 106G in addition to the RF sensors 106A-106D. The RF sensor 106E is coupled at a point 141A on the RF transmission line 158, the RF sensor 106F is coupled at a point 141B on the RF transmission line 166, and the RF sensor 106G is coupled at a point 141C on the RF transmission line 126. For example, an RF rod of the RF transmission line 158 is coupled to an input port of the RF sensor 106E and passes from the input port via the RF sensor 106E to an output port of the RF sensor 106E. As another example, an RF rod of the RF transmission line 166 is coupled to an input port of the RF sensor 106F and passes from the input port via the RF sensor 106F to an output port of the RF sensor 106F. As yet another example, an RF rod of the RF transmission line 126 is coupled to an input port of the RF sensor 106G and passes from the input port via the RF sensor 106G to an output port of the RF sensor 106G.

When the modified RF signals 174, 176, and 122B are supplied to the plasma chamber 168, RF signals 182, 184, and 186 are reflected from the plasma chamber 168. For example, the RF signal 182 is reflected from the plasma chamber 168 via the RF transmission line 158 towards the match 111. As another example, the RF signal 184 is reflected from the plasma chamber 168 via the RF transmission line 166 towards the match 164 and the RF signal 186 is reflected from the plasma chamber 168 via the RF transmission line 126 towards the match 111B. Each modified RF signal 174, 176, and 122B is an example of the master RF signal and each RF signal 182, 184, and 186 is an example of the slave RF signal.

When the substrate S is being processed, each of the RF sensors 106E-106G senses the parameter to output multiple measurement signals. For example, the RF sensor 106E senses the parameter at the point 141A to output a measurement signal 102E and provides the measurement signal 102E to the ADC 130, the RF sensor 106F senses the parameter at the point 141B to output a measurement signal 102F and provides the measurement signal 102F to the ADC 130, and RF sensor 106G senses the parameter at the point 141C to output a measurement signal 102G and provides the measurement signal 102G to the ADC 130. To illustrate, the RF sensor 106E senses supplied power of the modified RF signal 174 to output the measurement signal 102E, the RF sensor 106F senses supplied power of the modified RF signal 176 to output the measurement signal 102F, and the RF sensor 106G senses supplied power of the modified RF signal 122B to output the measurement signal 102G.

In addition to the measurement signals 102E-102G, the RF sensors 106E-106G generate additional measurement signals 104E, 104F and 104G by measuring the parameter, such as reflected power. For example, the RF sensor 106E senses the reflected power of the RF signal 182 to output a measurement signal 104E based on the reflected power, and provides the measurement signal 104E to the ADC 130, and the RF sensor 106F senses the reflected power of the RF signal 184 to output the measurement signal 104F based on the reflected power and provides the measurement signal 104F to the ADC 130. As another example, the RF sensor 106G senses the reflected power of the RF signal 186 to output the measurement signal 104G based on the reflected power, and provides the measurement signal 104G to the ADC 130.

The ADC 130 converts each of the measurement signals 102E, 104E, 102F, 104F, 102G, and 104G from an analog form to a digital form to sample the measurement signal. The measurement signal 102E is sampled to output sample data 110E-1 and the measurement signal 104E is sampled to output sample data 110E-2. An example of the sample data 110E-1 or 110E-2 is 128 samples or 256 samples or 512 samples. To illustrate, each sample of the sample data 110E-1 or 110E-2 is a measured value of the parameter, and can be represented by a number of bits, such as two bits or four bits or one byte. Similarly, the measurement signal 102F is sampled to output sample data 110E-1, the measurement signal 104F is sampled to output sample data 110E-2, the measurement signal 102G is sampled to output sample data 110G-1, and the measurement signal 104G is sampled to output sample data 110G-2. As another example, the ADC 130 samples the parameter from the measurement signals 102A, 102B, 102C, 102D, 102E, 102F, and 102G, 104A, 104B, 104C, 104D, 104E, 104F, and 104G in synchronization with the clock signal. To illustrate, the parameter is sampled from the measurement signals 102A, 102B, 102C, 102D, 102E, 102F, 102G, 104A, 104B, 104C, 104D, 104E, 104F, and 104G during the same clock cycle or the same number of multiple clock cycles of the clock signal. To further illustrate, the parameter is sampled from the measurement signals 102A, 102B, 102C, 102D, 102E, 102F, 102G, 104A, 104B, 104C, 104D, 104E, 104F, and 104G during clock cycles 1 through 8 or the cycles 1 through N of the clock signal.

The DCU 132 processes the sample data 110E-1 and 110E-2 to provide compressed data 135E at its output, processes the sample data 110E-1 and 110E-2 to provide compressed data 135F at its output, and processes the sample data 110G-1 and 110G-2 to provide compressed data 135G at its output. For example, the DCU 132 processes the sample data 110E-1 and 110E-2 to compress the sample data 110E-1 and 110E-2 from 256 samples to 4 or 8 samples, and processes the sample data 110E-1 and 110E-2 to compress the sample data 110E-1 and 110E-2 from 256 samples to 4 or 8 samples.

The DCU 132 sends the compressed data 135A-135G to the data transmitter 134. The data transmitter 134 sends the compressed data 135A-135G to the processor 101 (FIG. 1A) for processing.

In an embodiment, each sample data 110A-1, 110A-2, 110B-1, 110B-2, 110C-1, 110C-2, 110D-1, 110D-2, 110E-1, 110E-2, 110E-1, 110E-2, 110G-1, and 110G-2 is output from the ADC 130 via a different channel to the DCU 132. For example, the sample data 110A-1 is output from the ADC 130 to the DCU 132 via a first channel and the sample data 110A-2 is output from the ADC 130 to the DCU 132 via a second channel. The sample data 110A-1, 110A-2, 110B-1, 110B-2, 110C-1, 110C-2, 110D-1, 110D-2, 110E-1, 110E-2, 110E-1, 110E-2, 110G-1, and 110G-2 are output in a synchronized manner from the ADC 130 to the DCU 132. For example, the sample data 110A-1, 110A-2, 110B-1, 110B-2, 110C-1, 110C-2, 110D-1, 110D-2, 110E-1, 110E-2, 110E-1, 110E-2, 110G-1, and 110G-2 are output from the ADC 130 to the DCU 132 in synchronization to the clock signal. To illustrate, the sample data 110A-1, 110A-2, 110B-1, 110B-2, 110C-1, 110C-2, 110D-1, 110D-2, 110E-1, 110E-2, 110E-1, 110E-2, 110G-1, and 110G-2 are output from the ADC 130 to the DCU 132 during the same clock cycle of the clock signal or during a pre-determined number of clock cycles or during the N clock cycles of the clock signal.

In one embodiment, the RF sensor 106E is integrated within the match 111. For example, the RF sensor 106E is a component of the match 111. As another example, the RF sensor 106E is located within a housing or enclosure of the match 111.

In an embodiment, the RF sensor 106F is integrated within the match 164. For example, the RF sensor 106F is a component of the match 164. As another example, the RF sensor 106F is located within a housing or enclosure of the match 164.

In one embodiment, the RF sensor 106G is integrated within the match 111B. For example, the RF sensor 106G is a component of the match 111B. As another example, the RF sensor 106G is located within a housing or enclosure of the match 111B.

FIG. 1E-2 is a diagram of an embodiment of a system 163 to illustrate use of the RF sensor 106G within the plasma chamber 168. The RF sensor 106G is located within a housing or an enclosure of the plasma chamber 168, and is coupled to the RF transmission line 126.

In one embodiment, instead of being coupled to the RF transmission line 126, the RF sensor 106G is coupled to a bottom surface of a substrate support in which the electrode 154 is embedded. The substrate S is placed on a top surface of the substrate support 169 for being processed. The top surface of the substrate support 169 faces a gap between the substrate support 169 and an upper electrode, such as the RF coils 156A and 156B. The bottom surface faces a direction opposite to that of the top surface.

In one embodiment, the RF sensor 106G is coupled at any point between the output 121B and the input 143 of the lower electrode 154.

In one embodiment, in addition to providing the RF sensor 106G within the plasma chamber 168, an additional RF sensor is coupled to the point 141C. The additional RF sensor is coupled to the ADC 130.

Figure 1F:
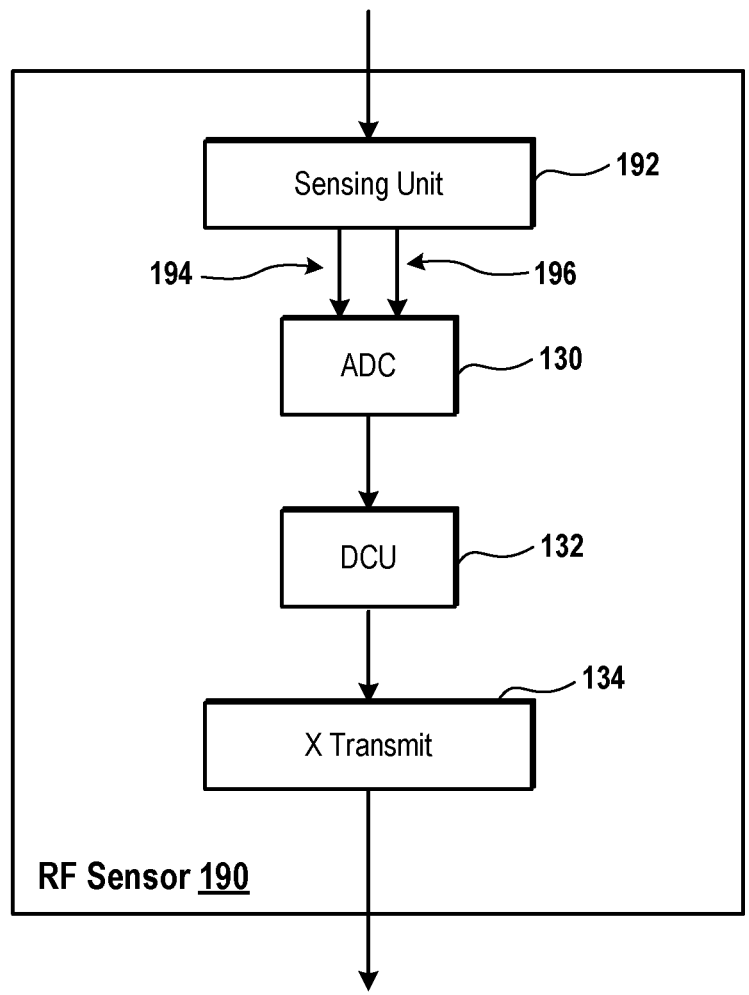
FIG. 1F is a diagram of an embodiment of an RF sensor to illustrate that an analog-to-digital converter (ADC), the DCU, and a data transmitter are integrated within an RF sensor.

FIG. 1F is a diagram of an embodiment of an RF sensor 190 to illustrate that the ADC 130, the DCU 132, and the data transmitter 134 are integrated within the RF sensor 190. An example of the RF sensor 190 includes a PLD or an ASIC. The RF sensor 190 includes a sensing unit 192, the ADC 130, the DCU 132, and the data transmitter 134. For example, each of the sensing unit 192, the ADC 130, the DCU 132, and the data transmitter 134 is a logic block of an FPGA. An example of the sensing unit 190 is a circuit that measures the parameter to generate a measurement signal. The sensing unit 192 is coupled the ADC 130, which is coupled to the DCU 132. The DCU 132 is coupled to the data transmitter 134.

The sensing unit 192 measures the parameter to output multiple measurement signals 194 and 196. An example of the measurement signals 194 and 196 include the measurement signals 102 and 104 (FIGS. 1A & 1B), or the measurement signals 102A and 104A (FIG. 1C-1), or the measurement signals 102B and 104B (FIG. 1C-1), or the measurement signals 102C and 104C (FIG. 1C-1), or the measurement signals 102D-1 and 104D-1 (FIG. 1C-2), or the measurement signals 102E and 104E (FIG. 1E-1), or the measurement signals 102F and 104F (FIG. 1F), or the measurement signals 102G and 104G (FIG. 1G).

It should be noted that instead of the RF sensor 106 and the DIS 128 (FIG. 1A), the RF sensor 190 is used. Moreover, instead of the DIS 128 and any of the RF sensors 106A106G and 147 (FIGS. 1C-1, 1C-2, & 1E-1), the RF sensor 190 is used.

Figure 1G:
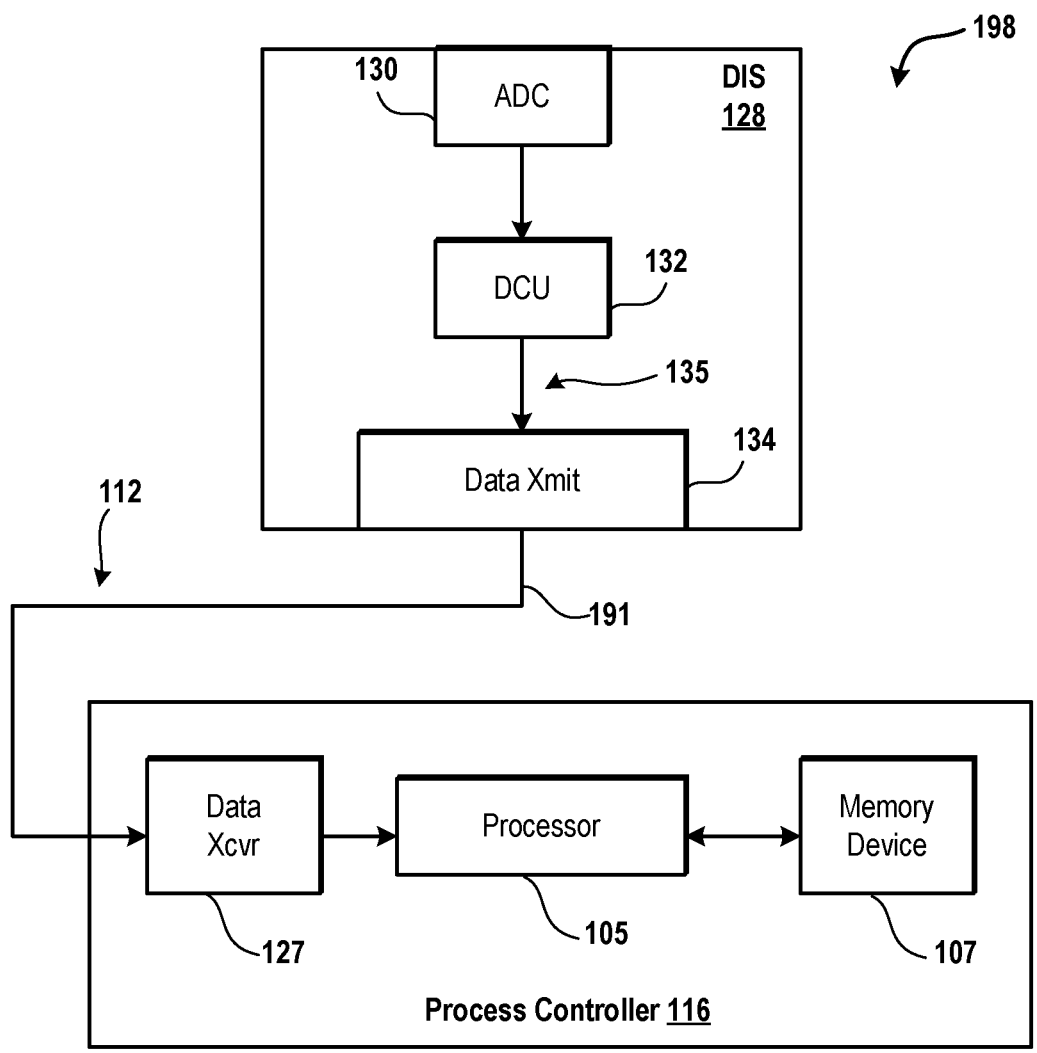
FIG. 1G is a diagram of an embodiment of a system to illustrate that compressed data is transmitted from a data integration system (DIS) to a process controller for processing instead of being transmitted to an analytical controller.

FIG. 1G is a diagram of an embodiment of a system 198 to illustrate that the compressed data 135 is transmitted from the DIS 128 to the process controller 116 for processing instead of being transmitted to the analytical controller 114 (FIG. 1A). The system 198 includes the DIS 128 and the process controller 116. The DIS 128 is coupled to the data transceiver 127 via a transfer cable 191.

The data units 112 having the compressed data 135 are transmitted from the data transmitter 134 via the transfer cable 191 to the data transceiver 127. The data transceiver 127 applies the transfer protocol to the data units 112 to extract the compressed data 135 and sends the compressed data 135 to the processor 105. The processor 105 processes the compressed data 135 in the same manner in which the processor 101 of the analytical controller 114 processes the compressed data 135. For example, the processor 105 uses the compressed data 135 to control one or more components of a plasma tool, such as the system 100, 139, 150, 162, and 180. The compressed data 135 is stored by the processor 105 in the memory device 107.

In an embodiment, each RF generator, described herein, and the DIS 128, are coupled via multiple network communication devices and the computer network to the processor 105 of the process controller 116. For example, a network communication device of the process controller 116 is coupled to a network communication device of an RF generator, described herein, via the computer network. The network communication device of the process controller 116 is also coupled to the network communication device of the DIS 128 via the computer network. The processor 105 of the process controller 116 is coupled to the network communication device of the process controller 116, and the controller, such as the digital signal processor and the memory device, within the RF generator is coupled to the network communication device of the RF generator.

Figure 1H:
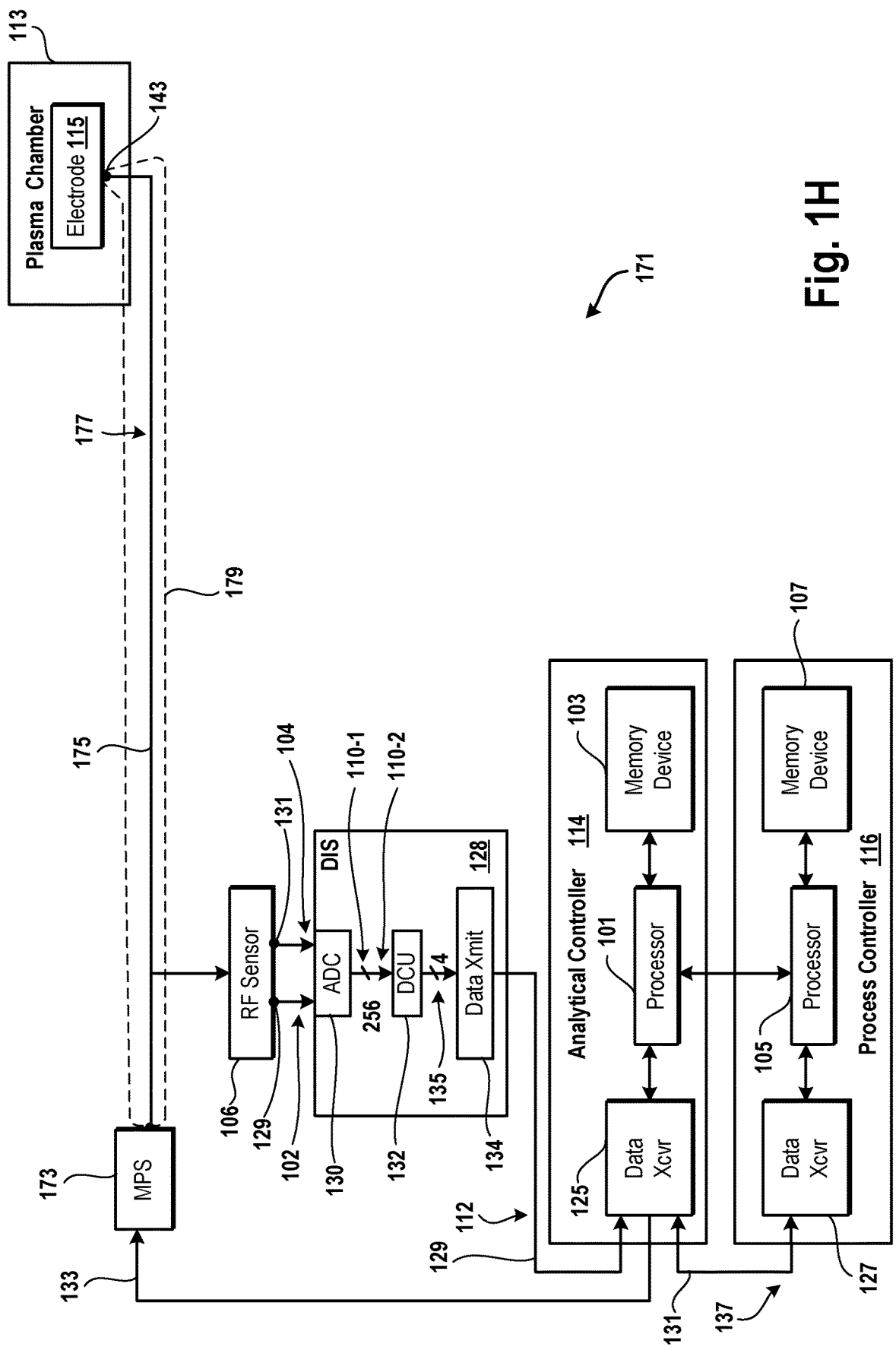
FIG. 1H is a diagram of an embodiment of a 171 to illustrate use of an RF sensor with a matchless plasma source (MPS).
Figure 2:
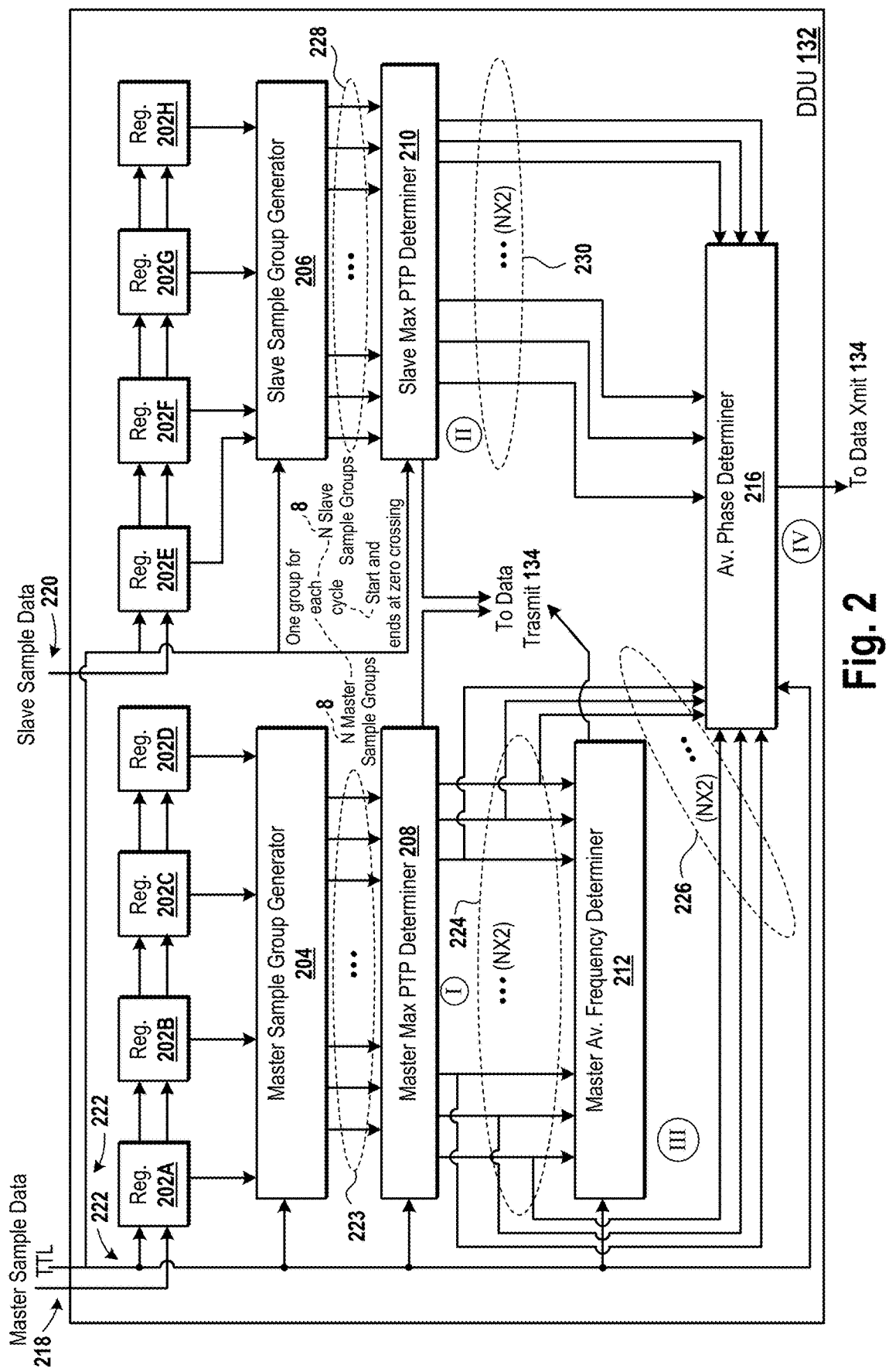

FIG. 1H is a diagram of an embodiment of a system 171 to illustrate use of the RF sensor 106 with a matchless plasma source (MPS) 173. The MPS 173 is sometimes referred to herein as a non 50-ohm source. The system 171 is the same as the system 100 of FIG. 1A except that in the system 171, the MPS 173 is used. There is no match between the MPS 172 and the plasma chamber 113. For example, there is no network of inductors and capacitors between the MPS 172 and the plasma chamber 113 to provide a balance between a load impedance at an output of the network and a source impedance at an input of the network.

The MPS 172 is coupled to the electrode 115 via a connection 175. An example of the connection 175 includes a conductor, such as an RF transmission line. The MPS 172 generates an RF signal 177 and sends the RF signal 177 via the RF transmission line 177 to the electrode 155. The RF sensor 106 senses the parameter of the RF signal 177 to output the measurement signals 102 and 104. An RF path 179 includes the RF transmission line 175. The RF path 179 extends from an output 181 of the MPS 173 to the input 143 of the electrode 115.

In one embodiment, the RF sensor 106 is coupled at any point on the RF path 179. For example, the RF sensor 106 is coupled to the RF transmission line 177 at any point on an RF rod of the RF transmission line 177.

FIG. 2 is a diagram of an embodiment of the DCU 132. The DCU 132 includes multiple registers 202A, 202B, 202C, 202D, 202E, 202F, 202G, and 202H. The DCU 132 further includes a master sample group generator 204 and a slave sample group generator 206. The DCU 132 includes a master maximum (max) peak-to-peak (PTP) determiner 208 and a slave max PTP determiner 210. The DCU 132 also a master average (Av.) frequency (Freq.) determiner 212 and an average phase determiner 216.

An example of each register 202A-202H includes a group of flip-flops. Another example of each register 202A-202H includes a shift register. Each of the master sample group generator tool 204, the slave sample group generator 206, the master max PTP determiner 208, the slave max PTP determiner 210, and the average phase determiner 216 can be a logic block, which includes a group of logic gates and interconnections between the logic gates.

An output of the register 202A is coupled to an input of the register 202B. Similarly, an output of the register 202B is coupled to an input of the register 202C, and an output of the register 202C is coupled to an input of the register to 202D. Also, an output of the register 202E is coupled to an input of the register 202F, an output of the register 202F is coupled to an input of the register 202G, and an output of the register 202G is coupled to an input of the register 202H.

Each register 202A and 202E is coupled to the ADC 130 (FIG. 1A). The registers 202A-202D are coupled to the master sample group generator 204, which is coupled to the master max PTP determiner 208 via N connections 223, where N is an integer greater than zero. As an example, a connection is a conductor, such as the conductor wire or a conductive via, that transfers an electrical signal. The master max PTP determiner 208 is coupled to the master average frequency determiner 212 via 2N connections 224. The master max PTP determiner 208 is coupled to the average phase determiner 216 via 2N connections 226.

Also, the registers 202E-202H are coupled to the slave sample group generator 206, which is coupled to the slave max PTP determiner 210 via N connections 228. The slave max PTP determiner 210 is coupled to the average phase determiner 216 via 2N connections 230. The average phase determiner 216 is coupled to the data transmitter 134 (FIG. 1A). Also, each of the master max PTP determiner 208, the slave max PTP determiner 210, and the master average frequency determiner 212 are coupled to the data transmitter 134.

Master sample data 218 is provided from the ADC 130 to the register 202A. An example of the master sample data 218 is the sample data 110-1 (FIG. 1A). Other examples of the master sample data 218 includes the sample data 110A-1, or the sample data 110B-1, or the sample data 110C-1, or the sample data 110D-1, or the sample data 149A (FIGS. 1C-1, 1C-2, & 1D), or the sample data 110E-1, or the sample data 110E-1, or the sample data 110G-1 (FIG. 1E-1).

Similarly, slave sample data 220 is provided from the ADC 130 to the register 202E. An example of the slave sample data 220 is the sample data 110-2 (FIG. 1A). Other examples of the slave sample data 220 includes the sample data 110A-2, or the sample data 110B-2, or the sample data 110C-2, or the sample data 110D-2, or the sample data 149B (FIGS. 1C-1, 1C-2, & 1D), or the sample data 110E-2, or the sample data 110E-2, or the sample data 110G-2 (FIG. 1E-1).

In addition, the DCU 132 receives the clock signal, such as a transistor-transistor logic (TTL) signal 222, from the processor 101 of the analytical controller 114 (FIG. 1A). The processor 101 includes a clock source or a clock generator that generates a clock signal, which periodically transitions between a high logic level, such as one, and the low logic level, such as zero. The TTL signal 222 is also supplied from the processor 101 to the RF generator 109 (FIG. 1A), the RF generator 109A, the RF generator 109B, the RF generator 109C, and the RF generator 109D (FIGS. 1C-1, 1D, & 1E-1). The DCU 132, and the RF generators 109 and 109A-109D operate in synchronization with the TTL signal 222.

By supplying the TTL signal 222 to the RF generators 109 and 109A-109D and to the DCU 132, the master sample data 218 and the slave sample data 220 output from the ADC 130 are synchronized to the TTL signal 222. For example, the master sample data 218 and the slave sample data 220 are generated by the ADC 130 based on multiple measurement signals, described herein, and the measurement signals are generated by sensing multiple RF signals during the same clock cycle or the same number of clock cycles or the N clock cycles of the TTL signal 222.

The TTL signal 222 is supplied to each component of the DIS 128 and the components of the DIS 128 operate in synchronization with the TTL signal 122. For example, the TTL signal is supplied from the processor 101 to the ADC 130, the registers 202A-202D, the master sample group generator 204, the slave sample group generator 206, the master max PTP determiner 208, the slave max PTP determiner 210, the master average frequency determiner 212, and the average phase determiner 216.

The master sample data 218 shifts from the output of the register 202A to the input of the register 202B, further shifts from the output of the register 202B to the input of the register 202C, and further shifts from the output of the register 202C to the input of the register 202D. Similarly, the slave sample data 220 shifts from the output of the register 202E to the input of the register 202F, further shifts from the output of the register 202F to the input of the register 202G, and further shifts from the output of the register 202G to the input of the register 202H.

The master sample data 218 after shifting from the register 202A to the register 202D via the registers 202B and 202C is provided from the registers 202A-202D to the master sample group generator 204. For example, a first portion of the master sample data 218 stored in the register 202A is sent from the output of the register 202A to the master sample group generator 204, a second portion of the master sample data 218 stored in the register 202B is sent from the output of the register 202B to the master sample group generator 204, a third portion of the master sample data 218 stored in the register 202C is sent from the output of the register 202C to the master sample group generator 204, and a fourth portion of the master sample data 218 stored in the register 202D is sent from the output of the register 202D to the master sample group generator 204. Moreover, after the first through fourth portions are transferred to the master sample group generator 204, in a similar manner, fifth, sixth, seventh, and eighth portions of the master sample data 218 are stored in the registers 202A-202D, and transferred from the registers 202A-202D to the master sample group generator 204.

As an example, each portion of the master sample data 218 represents a cycle of the master RF signal, described herein, such as a supplied RF signal or a voltage signal. To illustrate, the first portion of the master sample data 218 represents a first cycle of the RF signal 118 (FIG. 1A), the second portion of the master sample data 218 represents a second cycle of the RF signal 118, and so on until the eighth portion of the master sample data 218 represents an eighth cycle of the RF signal 118. The second cycle of the RF signal 118 is consecutive to the first cycle of the RF signal 118 and so on until the eighth cycle of the RF signal 118 is consecutive to the seventh cycle of the RF signal 118.

Each cycle of operation of the RF signal, such as a supplied RF signal, having the parameter that is represented by the master sample data 218, starts at a zero crossing, such as a positive zero crossing or a negative zero crossing, and ends at a consecutive zero crossing, such as a consecutive positive zero crossing or a consecutive negative zero crossing, of the same type. For example, if the first cycle of the RF signal 118 starts at a first positive zero crossing, the first cycle ends at a second positive zero crossing. The second positive zero crossing is consecutive to the first positive zero crossing. For example, there is no positive zero crossing between the first and second positive zero crossings of the RF signal 118.

Similarly, the slave sample data 220 after shifting from the register 202E to the register 202H via the registers 202F and 202G is provided from the registers 202E-202H to the slave sample group generator 206. For example, a first portion of the slave sample data 220 stored in the register 202E is sent from the output of the register 202E to the slave sample group generator 204, a second portion of the slave sample data 220 stored in the register 202F is sent from the output of the register 202F to the slave sample group generator 206, a third portion of the slave sample data 220 stored in the register 202G is sent from the output of the register 202G to the slave sample group generator 206, and a fourth portion of the slave sample data 220 stored in the register 202H is sent from the output of the register 202H to the slave sample group generator 206. Moreover, after the first through fourth portions are transferred to the slave sample group generator 206, in a similar manner, fifth, sixth, seventh, and eighth portions of the slave sample data 220 are stored in the registers 202E-202H, and transferred from the registers 202E-202H to the slave sample group generator 206.

As an example, each portion of the slave sample data 220 represents a cycle of the slave RF signal, described herein, such as a reflected RF signal or a voltage signal. To illustrate, the first portion of the slave sample data 220 represents a first cycle of the RF signal 120 (FIG. 1A), the second portion of the slave sample data 220 represents a second cycle of the RF signal 120, and so on until the eighth portion of the slave sample data 220 represents an eighth cycle of the RF signal 120. The second cycle of the RF signal 120 is consecutive to the first cycle of the RF signal 120 and so on until the eighth cycle of the RF signal 120 is consecutive to the seventh cycle of the RF signal 120.

Each cycle of operation of the slave RF signal, such as a reflected RF signal, having the parameter that is represented by the slave sample data 220, starts at a zero crossing, such as a positive zero crossing or a negative zero crossing, and ends at a consecutive zero crossing, such as a consecutive positive zero crossing or a consecutive negative zero crossing, of the same type. For example, if the first cycle of the RF signal 120 starts at a first positive zero crossing, the first cycle ends at a second positive zero crossing. The second positive zero crossing is consecutive to the first positive zero crossing. For example, there is no positive zero crossing between the first and second positive zero crossings of the RF signal 120.

The master sample group generator 204 groups the master sample data 218 into N number of groups, which is sometimes referred to herein as sets, where N is the integer greater than zero. For example, the master sample group generator 204 determines that a pre-determined number, such as N, of groups, such as eight groups or 16 groups, are to be generated from the master sample data 218, and segments the master sample data 218 into the pre-determined number of groups. To illustrate, the master sample group generator 204 includes the pre-determined number of buffers and stored each of the pre-determined number of groups into a corresponding one of the pre-determined number of buffers. To further illustrate, a first group of the master sample data 218 is stored in a first buffer of the master sample group generator 204 and a second group of the master sample data 218 is stored in a second buffer of the master sample group generator 204. As an example, each of the N groups of the master sample data 218 corresponds to a cycle of the master RF signal. To illustrate, the first group of the master sample data 218 is generated by sampling measurements of the parameter of a first cycle of the master RF signal and the second group of the master sample data 218 is generated by sampling measurements of the parameter of a second cycle of the master RF signal.

The master sample group generator 204 sends the N number of groups via the N connections 223 to the master max PTP determiner 208. The master max PTP determiner 208 determines or calculates a master maximum PTP value (MMaxPTP), in a manner described below, from the N number of groups received from the master sample group generator 204. In addition, the master max PTP determiner 208 determines or calculates times at which maximum and minimum values are sampled for each of the N groups of the master sample data 218. The master max PTP determiner 208 sends the times at which maximum and minimum values are sampled for each of the N groups of the master sample data 218 via the connections 224 to the master average frequency determiner 212. The master average frequency determiner 212 determines or calculates a master average frequency MAVF, in a manner described below, from the times at which maximum and minimum values are sampled for each of the N groups of the master sample data 218. The master average frequency MAVF is an example a statistical frequency value. Moreover, the master sample group generator 204 sends the times at which maximum and minimum values are sampled for each of the N groups of the master sample data 218 to the average phase determiner 216.

Similarly, the slave sample group generator 206 groups the slave sample data 220 into N number of groups. For example, the slave sample group generator 206 determines that the pre-determined number, such as N, of groups, such as eight groups or 16 groups, are to be generated from the slave sample data 220, and segments the slave sample data 220 into the pre-determined number of groups. To illustrate, the slave sample group generator 206 includes the pre-determined number of buffers and stores each of the pre-determined number of groups into a corresponding one of the pre-determined number of buffers. To further illustrate, a first group of the slave sample data 220 is stored in a first buffer of the slave sample group generator 206 and a second group of the slave sample data 220 is stored in a second buffer of the slave sample group generator 206. As an example, each of the N groups of the slave sample data 220 corresponds to a cycle of the slave RF signal. To illustrate, the first group of the slave sample data 220 is generated by sampling measurements of the parameter of a first cycle of the slave RF signal and the second group of the slave sample data 220 is generated by sampling measurements of the parameter of a second cycle of the slave RF signal.

The slave sample group generator 206 sends the N number of groups of the slave sample data 220 via the N connections 228 to the slave max PTP determiner 210. The slave max PTP determiner 210 determines or calculates a slave maximum PTP (SMaxPTP), in a manner described below, from the N number of groups received from the slave sample group generator 206. For example, there is parallel processing of the master sample data 218 and the slave sample data 220. To illustrate, the slave max PTP determiner 210 determines the slave maximum PTP value SMaxPTP simultaneous with the determination of the master maximum PTP value MMaxPTP by the master max PTP determiner 208. As another illustration, the slave max PTP determiner 210 determines the slave maximum PTP value SMaxPTP within a pre-set time period from a time of the determination of the master maximum PTP value MMaxPTP by the master max PTP determiner 208. As another illustration, the N groups of the slave sample data 220 are processed by the slave max PTP determiner 210 during a time period in which the N groups of the master sample data 218 are processed by the master max PTP determiner 208.

In addition, the slave max PTP determiner 210 determines or calculates times at which maximum and minimum values are sampled for each of the N groups of the slave sample data 220. The slave max PTP determiner 210 sends the times at which maximum and minimum values are sampled for each of the N groups of the slave sample data 220 via the connections 230 to the average phase determiner 216. The average phase determiner 216 determines or calculates an average phase φ from the times at which maximum and minimum values are sampled for each of the N groups of the master sample data 218 and the times at which maximum and minimum values are sampled for each of the N groups of the slave sample data 220. The average phase φ is calculated in a manner described below and is an example of a statistical phase value. The values MMaxPTP, SMaxPTP, MAVF, and φ are examples of the compressed data 135 (FIG. 1A). Similarly, the values MMaxPTP, SMaxPTP, MAVF, and φ are examples of any of the compressed data 135A-135G.

By using the TTL signal 222 to synchronize operations of the master max PTP determiner 208, the slave max PTP determiner 210, the master average frequency determiner 212, and the average phase determiner 216 with that of the ADC 130 that samples measurement signals received from multiple RF sensors, described herein, any of the compressed data 135A-135G is synchronized across all of the RF sensors to preserve time alignment of the compressed data with a precision of the ADC 130.

The average phase φ is generated in a synchronized manner with respect to the output of the values MMaxPTP, SMaxPTP, and MAVF. For example, the average phase φ and the values MMaxPTP, SMaxPTP, and MAVF are output in synchronization to the TTL signal 222. To illustrate, the average phase φ and the values MMaxPTP, SMaxPTP, and MAVF are output during the same clock cycle. As another illustration, the average phase φ and the values MMaxPTP, SMaxPTP, and MAVF are output during a number of consecutive clock cycles of the TTL signal 222 and the number of consecutive clock cycles is within a pre-determined range. As yet another illustration, the average phase φ and the values MMaxPTP, SMaxPTP, and MAVF are output during the N clock cycles.

In one embodiment, the DCU 132 includes any other number of registers. For example, instead of the four registers 202A-202D, the DCU 132 includes a first set of eight registers, and instead of the four registers 202E-202H, the DCU 132 includes a second set of eight registers. In this embodiment, there is no need for the master sample group generator 204 and the slave sample group generator 206. The first set of eight registers is coupled to the master max PTP determiner 208 and the second set of state registers is coupled to the slave max PTP determiner 210. As another example, instead of the four registers 202A-202D, one register is used, and instead of the four registers 202E-202F, one register is used.

In an embodiment, instead of the processor 101 supplying the TTL signal 222, the processor 105 of the process controller 116 (FIG. 1A) supplies the TTL signal 222.

In one embodiment, the DCU 132 is specific for a fixed operating range of an RF generator, such as the RF generator 109, or the RF generator 109A, or the RF generator 109B, or the RF generator 109C, or the RF generator 109D. For example, when the fixed operating range changes, another DCU is used instead of the DCU 132. Similarly, the DCU 132 is specific for a fixed sampling rate of the ADU 130 and for a frequency response of an RF sensor, such as the RF sensor 106, or the RF sensor 106A, or the RF sensor 106B, or the RF sensor 106C, or the RF sensor 106D, or the RF sensor 106E, or the RF sensor 106F, or the RF sensor 106G. Similarly, the DCU 132 is specific for fixed coefficients of multiple filters, which include a first filter and a second filter. The first filter is connected between the ADC 130 and the register 202A, and the second filter is connected between the ADC 130 and the register 202E. The first filter is coupled to filter noise from a first digital signal having the master sample data 218 and the second filter is coupled to filter noise from a second digital signal having the slave sample data 220.

FIG. 3A is a diagram to illustrate an embodiment of a method that is executed by the master max PTP determiner 208 (FIG. 2). The master max PTP determiner 208 receives the N groups of the master sample data 218 from the master sample group generator 204 (FIG. 2), and identifies a maximum value, such as a maximum magnitude, and a minimum value, such as a minimum magnitude, of each of the N groups. The maximum value a maximum of all values of a group of the master sample data 218 and the minimum value is a minimum of all values of the group of the master sample data 218. For example, the master max PTP determiner 208 identifies from group 1 of the master sample data 218, a maximum value Mmx1 and a minimum value Mmn1. As another example, the master max PTP determiner 208 identifies from group 2 of the master sample data 218, a maximum value Mmx2 and a minimum value Mmn2, the master max PTP determiner 208 identifies from group 3 of the master sample data 218, a maximum value Mmx3 and a minimum value Mmn3, the master max PTP determiner 208 identifies from group (N−2) of the master sample data 218, a maximum value Mmx(N−2) and a minimum value Mmn (N−2), the master max PTP determiner 208 identifies from group (N−1) of the master sample data 218, a maximum value Mmx(N−1) and a minimum value Mmn(N−1), and the master max PTP determiner 208 identifies from group N of the master sample data 218, a maximum value MmxN and a minimum value MmnN.

The master max PTP determiner 208 determines a difference between a maximum value and a minimum value of each of the N groups of the master sample data 218. For example, the master max PTP determiner 208 calculates a first difference between the values Mmx1 and Mmn1, a second difference between the values Mmx2 and Mmn2, a third difference between the values Mmx3 and Mmn3, and so on until an (N−2)th difference between the values Mmx (N−2) and Mmn(N−2), an (N−1)th difference between the values Mmx(N−1) and Mmn(N−1), and an Nth difference between the values MmxN and MmnN The master max PTP determiner 208 determines the master maximum peak-to-peak value MMaxPTP, such as a maximum magnitude, among the first through the Nth differences calculated from the master sample data 218. For example, the master maximum peak-to-peak value MMaxPTP is determined as a maximum of the first through the $N^{th}$ differences determined from the N groups of the master sample data 218. The maximum value MMaxPTP is the master maximum PTP.

The master max PTP determiner 208 sends the maximum value MMaxPTP to the data transmitter 134 (FIG. 2). The data transmitter 134 transmits the maximum value MMaxPTP to a processor, such as the processor 101 of the analytical controller 114 or the processor 105 of the process controller 116 (FIG. 2).

Moreover, the master max PTP determiner 208 identifies the times at which the maximum and minimum values are sampled or achieved for each of the groups N of the master sample data 218. For example, the master max PTP determiner 208 determines a time tMmx1 at which the maximum value MMx1 is sampled by the ADC 130 and a time tMmn1 at which the minimum value Mmn1 is sampled by the ADC 130. The times tMmx1 and tMmn1 are calculated by the master max PTP determiner 208 based on the TTL signal 222. For example, the time tMmx1 is a time at which the maximum value Mmx1 is determined by the master max PTP determiner 208. As another example, the master max PTP determiner 208 determines a difference between the time at which the maximum value Mmx1 is determined by the master max PTP determiner 208 and a time taken for receiving the master sample data 218 from the ADC 130 via the registers 202A-202D and the master sample group generator 204, and subtracts the difference from the time at which the maximum value Mmx1 is determined to determine the time at which the maximum value Mmx1 is sampled by the ADC 130. As yet another example, the master max PTP determiner 208 requests the time of sampling of the maximum value Mmx1 from the ADC 130 via a connection between the master max PTP determiner 208 and the ADC 130. The ADC 130 measures the time of sampling of the maximum value Mmx1 while sampling the maximum value Mmx1 and provides the time to the master max PTP determiner 208 via the connection between the master max PTP determiner 208 and the ADC 130. The time is measured by a timer of the ADC 130 based on the TTL signal 222 that is received by the ADC 130. The timer is coupled to a sampler of the ADC 130, and the sampler samples data from the master measurement, described herein, that is received by the ADC 130.

In a similar manner, the master max PTP determiner 208 determines a time tMmx2 at which the maximum value MMx2 is sampled by the ADC 130 and a time tMmn2 at which the minimum value Mmn2 is sampled by the ADC 130, and determines a time tMmx3 at which the maximum value MMx3 is sampled by the ADC 130 and a time tMmn3 at which the minimum value Mmn3 is sampled by the ADC 130. The master max PTP determiner 208 determines a time tMmx(N−2) at which the maximum value MMx(N−2) is sampled by the ADC 130 and a time tMmn(N−2) at which the minimum value Mmn(N−2) is sampled by the ADC 130, determines a time tMmx(N−1) at which the maximum value MMx(N−1) is sampled by the ADC 130 and a time tMmn(N−1) at which the minimum value Mmn(N−1) is sampled by the ADC 130, and determines a time tMmxN at which the maximum value MMxN is sampled by the ADC 130 and a time tMmnN at which the minimum value MmnN is sampled by the ADC 130.

In one embodiment, instead of the times tMmn1 through tMmnN being associated with the minimum values of the master RF signal, described herein, such as the RF signal 118 (FIG. 1A), having the parameter that is sampled by the ADC 130, the times tMmn1 through tMmnN are times of positive zero crossings of cycles of the master RF signal. For example, the time tMmn1 is a time at which the master RF signal transitions from a negative value to a positive value during a first cycle of the master RF signal and the time tMmn2 is a time at which the master RF signal transitions from a negative value to a positive value during a second cycle of the master RF signal. The second cycle of the master RF signal is consecutive to the first cycle of the master RF signal. Each cycle of the master RF signal has one positive zero crossing and one negative zero crossing. As another example, when a direct current (DC) offset is applied to the master RF signal, the time tMmn1 is a time at which the master RF signal transitions from a first value to a second value during the first cycle of the master RF signal and the time tMmn2 is a time at which the master RF signal transitions from a third value to a fourth value during the second cycle of the master RF signal. The second value is greater than the first value and the fourth value is greater than the third value.

Similarly, in the embodiment, instead of the times tMmx1 through tMmxN being associated with the maximum values of the master RF signal, the times tMmx1 through tMmxN are times of negative zero crossings of cycles of the master RF signal. For example, the time tMmx1 is a time at which the master RF signal transitions from a positive value to a negative value during the first cycle of the master RF signal and the time tMmx2 is a time at which the master RF signal transitions from a positive value to a negative value during the second cycle of the master RF signal. It should be noted that a negative zero crossing of a cycle of the master RF signal is consecutive to a positive zero crossing of the cycle. For example, there are no other zero crossings between the negative zero crossing and the positive zero crossing of the cycle of the master RF signal. As another example, when the DC offset is applied to the master RF signal, the time tMmx1 is a time at which the master RF signal transitions from a first value to a second value during the first cycle of the master RF signal and the time tMmx2 is a time at which the master RF signal transitions from a third value to a fourth value during the second cycle of the master RF signal. The second value is less than the first value and the fourth value is less than the third value.

In an embodiment, instead of the times tMmn1 through tMmnN being associated with the minimum values of the master RF signal, the times tMmn1 through tMmnN are times of negative zero crossings of cycles of the master RF signal. For example, the time tMmn1 is a time at which the master RF signal transitions from a positive value to a negative value during the first cycle of the master RF signal and the time tMmn2 is a time at which the master RF signal transitions from a positive value to a negative value during the second cycle of the master RF signal. As another example, when the DC offset is applied to the master RF signal, the time tMmx1 is a time at which the master RF signal transitions from a first value to a second value during the first cycle of the master RF signal and the time tMmx2 is a time at which the master RF signal transitions from a third value to a fourth value during the second cycle of the master RF signal. The second value is lower than the first value and the fourth value is lower than the third value.

Similarly, in the embodiment, instead of the times tMmx1 through tMmxN being associated with the maximum values of the master RF signal, the times tMmx1 through tMmxN are times of positive zero crossings of cycles of the master RF signal. For example, the time tMmx1 is a time at which the master RF signal transitions from a negative value to a positive value during the first cycle of the master RF signal and the time tMmx2 is a time at which the master RF signal transitions from a negative value to a positive value during the second cycle of the master RF signal. As another example, when a DC offset is applied to the master RF signal, the time tMmx1 is a time at which the master RF signal transitions from a first value to a second value during the first cycle of the master RF signal and the time tMmx2 is a time at which the master RF signal transitions from a third value to a fourth value during the second cycle of the master RF signal. The second value is greater than the first value and the fourth value is greater than the third value. It should be noted that a positive zero crossing of a cycle of the master RF signal is consecutive to a negative zero crossing of the cycle. For example, there are no other zero crossings between the positive zero crossing and the negative zero crossing of the cycle of the master RF signal.

Figure 3B:
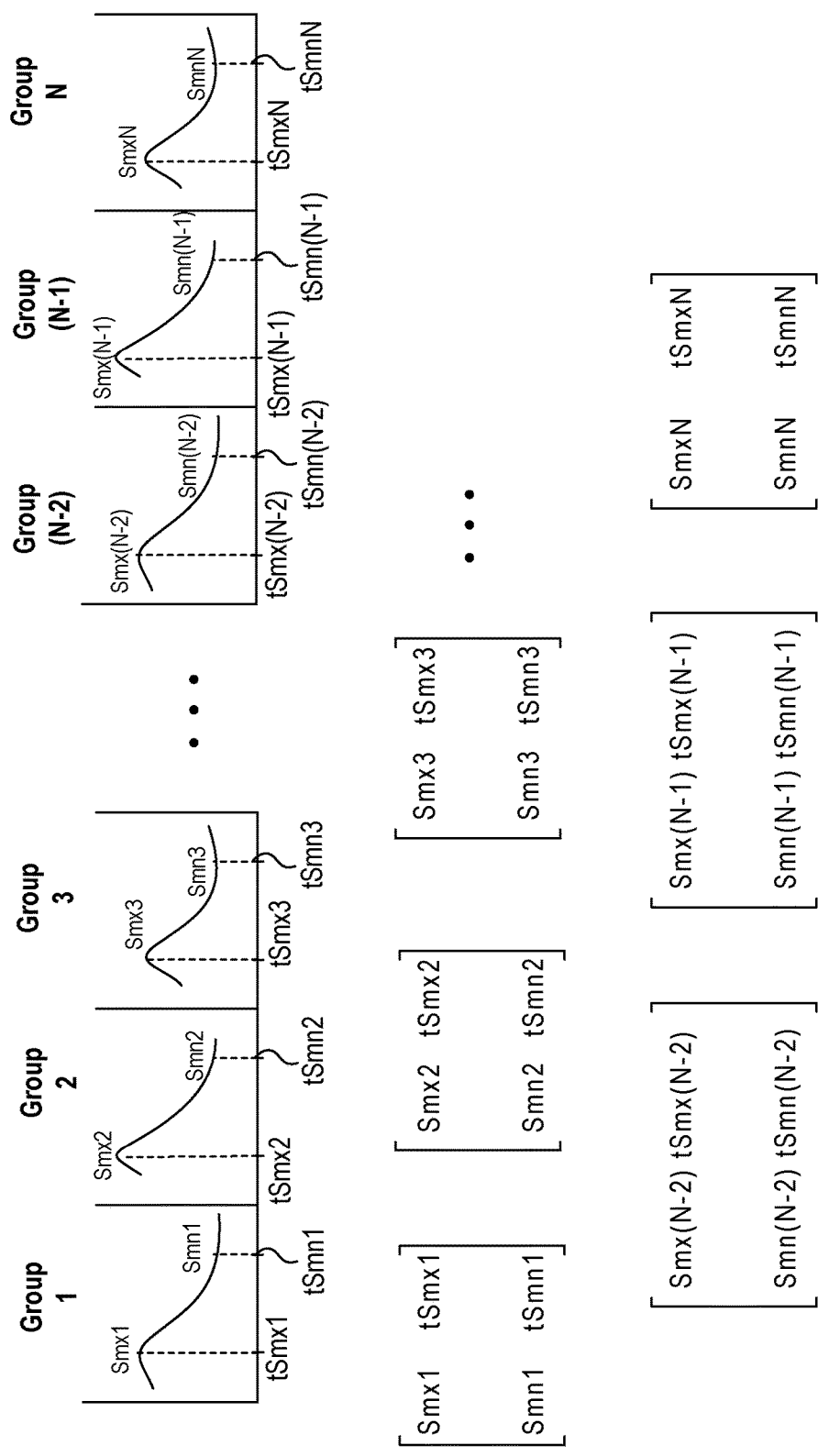
FIG. 3B is a diagram to illustrate an embodiment of a method executed by a slave max PTP determiner to determine a slave maximum peak-to-peak value SMaxPTP.

FIG. 3B is a diagram to illustrate an embodiment of a method that is executed by the slave max PTP determiner 210 (FIG. 2). The slave max PTP determiner 210 receives the N group of data of the slave sample data 220 (FIG. 2) from the slave sample group generator 206, and identifies a maximum value, such as a maximum magnitude, and a minimum value, such as a minimum magnitude, of each of the N groups. The maximum value is a maximum of all values of a group of the slave sample data 220 and the minimum value is a minimum of all values of the group of the slave sample data 220. For example, the slave max PTP determiner 210 identifies from group 1 of the slave sample data 220, a maximum value Smx1 and a minimum value Smn1. As another example, the slave max PTP determiner 208 identifies from group 2 of the slave sample data 220, a maximum value Smx2 and a minimum value Smn2, the slave max PTP determiner 208 identifies from group 3 of the slave sample data 220, a maximum value Smx3 and a minimum value Smn3, the slave max PTP determiner 208 identifies from group (N−2) of the slave sample data 220, a maximum value Smx(N−2) and a minimum value Smn(N−2), the slave max PTP determiner 210 identifies from group (N−1) of the slave sample data 220, a maximum value Smx(N−1) and a minimum value Smn(N−1), and the slave max PTP determiner 210 identifies from group N of the slave sample data 220, a maximum value SmxN and a minimum value SmnN.

It should be noted that the group 1 of the slave sample data 220 corresponds to the same time period for which the group 1 of the master sample data 218 (FIG. 2) is output from the ADC 130 (FIG. 1A). For example, the group 1 of the slave sample data 220 is output by sampling a portion of a master measurement signal during the same time period in which a portion of a slave measurement signal is sampled. The slave measurement signal is sampled to output the slave sample data. Similarly, each of the remaining groups 2 through N of the slave sample data 220 is associated with a corresponding one of the groups 2 through N of the master sample data 218.

The slave max PTP determiner 210 determines a difference between a maximum value and a minimum value of each group of the slave sample data 220. For example, the slave max PTP determiner 210 calculates a first difference between the values Smx1 and Smn1, a second difference between the values Smx2 and Smn2, a third difference between the values Smx3 and Smn3, and so on until an (N−2)th difference between the values Smx(N−2) and Smn(N−2), an (N−1)th difference between the values Smx(N−1) and Smn(N−1), and an Nth difference between the values SmxN and SmnN. The slave max PTP determiner 210 determines a maximum value SMaxPTP, such as a maximum magnitude, among the first through the Nth differences calculated from the slave sample data 220. The maximum value SMaxPTP is the slave maximum PTP. For example, the maximum value SMaxPTP is a maximum value of all the first through Nth differences of the groups of the slave sample data 220.

The slave max PTP determiner 210 sends the maximum value SMaxPTP to the data transmitter 134 (FIG. 2). The data transmitter 134 transmits the maximum value SMaxPTP to a processor, such as the processor 101 of the analytical controller 114 or the processor 105 of the process controller 116 (FIG. 2).

Moreover, the slave max PTP determiner 210 identifies the times at which the maximum and minimum values are sampled or achieved for each of the groups N of the slave sample data 220. For example, the slave max PTP determiner 210 determines a time tSmx1 at which the maximum value SMx1 is sampled by the ADC 130 and a time tSmn1 at which the minimum value Smn1 is sampled by the ADC 130. The times tSmx1 and tSmn1 are calculated by the slave max PTP determiner 210 based on the TTL signal 222. For example, the time tSmx1 is a time at which the maximum value Smx1 is determined by the slave max PTP determiner 210. As another example, the slave max PTP determiner 210 determines a difference between the time at which the maximum value Smx1 is determined by the slave max PTP determiner 210 and a time taken for receiving the slave sample data 220 from the ADC 130 via the registers 202E-202H and the slave sample group generator 206, and subtracts the difference from the time at which the maximum value Smx1 is determined to determine the time at which the maximum value Smx1 is sampled by the ADC 130. As yet another example, the slave max PTP determiner 210 requests the time of sampling of the maximum value Smx1 from the ADC 130 via a connection between the slave max PTP determiner 210 and the ADC 130. The ADC 130 measures the time of sampling of the maximum value Smx1 while sampling the maximum value Smx1 and provides the time to the slave max PTP determiner 210 via the connection between the slave max PTP determiner 210 and the ADC 130. The time is measured by the timer of the ADC 130 based on the TTL signal 222 that is received by the ADC 130. The timer is coupled to the sampler of the ADC 130, and the sampler samples data from the slave measurement signal that is received by the ADC 130.

In a similar manner, the slave max PTP determiner 210 determines a time tSmx2 at which the maximum value SMx2 is sampled by the ADC 130 and a time tSmn2 at which the minimum value Smn2 is sampled by the ADC 130, and determines a time tSmx3 at which the maximum value SMx3 is sampled by the ADC 130 and a time tSmn3 at which the minimum value Smn3 is sampled by the ADC 130. The master max PTP determiner 208 determines a time tSmx(N−2) at which the maximum value Mmx(N−2) is sampled by the ADC 130 and a time tMmn(N−2) at which the minimum value Smn(N−2) is sampled by the ADC 130, determines a time tSmx(N−1) at which the maximum value SMx(N−1) is sampled by the ADC 130 and a time tSmn(N−1) at which the minimum value Smn(N−1) is sampled by the ADC 130, and determines a time tSmxN at which the maximum value SMxN is sampled by the ADC 130 and a time tSmnN at which the minimum value SmnN is sampled by the ADC 130.

In one embodiment, instead of the times tSmn1 through tSmnN being associated with the minimum values of the slave RF signal, described herein, such as the RF signal 120 (FIG. 1A), having the parameter that is sampled by the ADC 130, the times tSmn1 through tSmnN are times of positive zero crossings of cycles of the slave RF signal. For example, the time tSmn1 is a time at which the slave RF signal transitions from a negative value to a positive value during a first cycle of the slave RF signal and the time tSmn2 is a time at which the slave RF signal transitions from a negative value to a positive value during a second cycle of the slave RF signal. As another example, when a DC offset is applied to the slave RF signal, the time tSmx1 is a time at which the slave RF signal transitions from a first value to a second value during the first cycle of the slave RF signal and the time tSmx2 is a time at which the slave RF signal transitions from a third value to a fourth value during the second cycle of the slave RF signal. The second value is greater than the first value and the fourth value is greater than the third value. The second cycle of the slave RF signal is consecutive to the first cycle of the slave RF signal. Each cycle of the slave RF signal has one positive zero crossing and one negative zero crossing.

Similarly, in the embodiment, instead of the times tSmx1 through tSmxN being associated with the maximum values of the slave RF signal, times tSmx1 through tSmxN are times of negative zero crossings of cycles of the slave RF signal. For example, the time tMmx1 is a time at which the slave RF signal transitions from a positive value to a negative value during the first cycle of the slave RF signal and the time tSmx2 is a time at which the slave RF signal transitions from a positive value to a negative value during the second cycle of the slave RF signal. As another example, when the DC offset is applied to the slave RF signal, the time tSmx1 is a time at which the slave RF signal transitions from a first value to a second value during the first cycle of the slave RF signal and the time tSmx2 is a time at which the slave RF signal transitions from a third value to a fourth value during the second cycle of the slave RF signal. The second value is lower than the first value and the fourth value is lower than the third value. It should be noted that a negative zero crossing of a cycle of the slave RF signal is consecutive to a positive zero crossing of the cycle. For example, there are no other zero crossings between the negative zero crossing and the positive zero crossing of the cycle of the slave RF signal.

In an embodiment, instead of the times tSmn1 through tSmnN being associated with the minimum values of the slave RF signal, the times tSmn1 through tSmnN are times of negative zero crossings of cycles of the slave RF signal. For example, the time tSmn1 is a time at which the slave RF signal transitions from a positive value to a negative value during the first cycle of the slave RF signal and the time tSmn2 is a time at which the slave RF signal transitions from a positive value to a negative value during the second cycle of the slave RF signal. As another example, when the DC offset is applied to the slave RF signal, the time tSmn1 is a time at which the slave RF signal transitions from a first value to a second value during the first cycle of the slave RF signal and the time tSmn2 is a time at which the slave RF signal transitions from a third value to a fourth value during the second cycle of the slave RF signal. The second value is less than the first value and the fourth value is less than the third value.

Similarly, in the embodiment, instead of the times tSmx1 through tSmxN being associated with the maximum values of the slave RF signal, the times tSmx1 through tSmxN are times of positive zero crossings of cycles of the slave RF signal. For example, the time tSmx1 is a time at which the slave RF signal transitions from a negative value to a positive value during the first cycle of the slave RF signal and the time tSmx2 is a time at which the slave RF signal transitions from a negative value to a positive value during the second cycle of the slave RF signal. It should be noted that a positive zero crossing of a cycle of the slave RF signal is consecutive to a negative zero crossing of the cycle. For example, there are no other zero crossings between the positive zero crossing and the negative zero crossing of the cycle of the slave RF signal. As another example, when the DC offset is applied to the slave RF signal, the time tSmx1 is a time at which the slave RF signal transitions from a first value to a second value during the first cycle of the slave RF signal and the time tSmx2 is a time at which the slave RF signal transitions from a third value to a fourth value during the second cycle of the slave RF signal. The second value is greater than the first value and the fourth value is greater than the third value.

FIG. 3C is a diagram to illustrate an embodiment of a method that is executed by the master average frequency determiner 212 (FIG. 2) to determine the master average frequency MAVF. The master average frequency determiner 212 receives the times associated with the master sample data 218 (FIG. 2) from the master max PTP determiner 208 (FIG. 2). For example, the master average frequency determiner 212 receives the times tMmx1 through tMmxN and the times tMmn1 through tMmnN from the master max PTP determiner 208 via the connections 224 (FIG. 2).

The master average frequency determiner 212 determines, such as calculates or computes, the master average frequency MAVF from the times tMmx1 through tMmxN and the times tMmn1 through tMmnN For example, the master average frequency determiner 212 calculates an absolute value of a difference of the times tMmx1 and tMmn1 and multiples the difference by two to determine a time period PM1 associated with the first group of the master sample data 218 (FIG. 2). As an example, the time period PM1 is a time of occurrence of a first cycle of the master RF signal, described herein, such as the RF signal 118 (FIG. 1A), for which the values Mmx1 and Mmn1 are calculated. Similarly, the master average frequency determiner 212 calculates an absolute value of a difference of the times tMmx2 and tMmn2 and multiples the difference by two to determine a time period PM2, and calculates an absolute value of a difference of the times tMmx3 and tMmn3 and multiples the difference by two to determine a time period PM3. For example, the time period PM2 is a time of occurrence of a second cycle of the master RF signal for which the values Mmx2 and Mmn2 are calculated. Also, the master average frequency determiner 212 calculates an absolute value of a difference of the times tMmx(N−2) and tMmn(N−2) and multiples the difference by two to determine a time period PM(N−2), calculates an absolute value of a difference of the times tMmx(N−1) and tMmn(N−1) and multiples the difference by two to determine a time period PM(N−1), and calculates an absolute value of a difference of the times tMmxN and tMmnN and multiples the difference by two to determine a time period PMN. For example, the time period PMN is a time of occurrence of an Nth cycle of the master RF signal for which the values MmxN and MmnN are calculated.

The master average frequency determiner 212 calculates an average of the time periods PM1 through PMN to determine a master average time period MAVP. For example, the master average frequency determiner 212 determines the average of the time periods PM1 through PMN by summing the time periods PM1 through PMN and dividing the sum by a number N of the time periods, where N is the number of groups of the master sample data 118. The average of the time periods PM1 through PMN is the master average time period MAVP. The master average frequency determiner 212 inverts the master average time period MAVP to generate the master average frequency MAVF. For example, the frequency determiner 212 calculates the master average frequency MAVF as a ratio of 1 and the master average time period MAVP.

The master average frequency determiner 212 sends the master average frequency MAVF to the data transmitter 134 (FIG. 2). The data transmitter 134 transmits the master average frequency MAVF to a processor, such as the processor 101 of the analytical controller 114 or the processor 105 of the process controller 116 (FIG. 2).

FIG. 3D is a diagram to illustrate an embodiment of a method that is executed by the average phase determiner 216 (FIG. 2) to determine the average phase ϕ. The average phase determiner 216 receives the times associated with the master sample data 218 (FIG. 2) from the master max PTP determiner 208 (FIG. 2). For example, the average phase determiner 216 receives the times tMmx1 through tMmxN and the times tMmn1 through tMmnN from the master max PTP determiner 208 via the connections 226 (FIG. 2). Moreover, the average phase determiner 216 receives the times associated with the slave sample data 220 (FIG. 2) from the slave max PTP determiner 210 (FIG. 2). For example, the average phase determiner 216 receives the times tSmx1 through tSmxN and the times tSmn1 through tSmnN from the slave max PTP determiner 210 via the connections 230 (FIG. 2).

The average phase determiner 216 determines, such as calculates or computes, the average phase $\phi$ from the times tMmx1 through tMmxN, the times tMmn1 through tMmnN, the times tSmx1 through tSmxN, and the times tSmn1 through tSmnN. For example, the average phase determiner 216 calculates an absolute value of a difference of the times tMmx1 and tSmx1 to determine a value Mxav1, calculates an absolute value of a difference of the times tMmn1 and tSmn1 to determine a value Mnav1, and calculates an average of the values Mxav1 and Mnav1 to determine an average phase Av1. As an example, the average phase Av1 is an average phase during first cycles of the master and slave RF signals, described herein, such as the RF signals 118 and 120 (FIG. 1A), for which the values Mmx1, Mmn1, Smx1, and Smn1 are calculated.

Similarly, as another example, the average phase determiner 216 calculates an absolute value of a difference of the times tMmx2 and tSmx2 to determine a value Mxav2, calculates an absolute value of a difference of the times tMmn2 and tSmn2 to determine a value Mnav2, and calculates an average of the values Mxav2 and Mnav2 to determine an average phase Av2. As an example, the average phase Av2 is an average phase during second cycles of the master and slave RF signals, described herein, such as the RF signals 118 and 120 (FIG. 1A), for which the values Mmx2, Mmn2, Smx2, and Smn2 are calculated.

As yet another example, the average phase determiner 216 calculates an absolute value of a difference of the times tMmx3 and tSmx3 to determine a value Mxav3, calculates an absolute value of a difference of the times tMmn3 and tSmn3 to determine a value Mnav3, and calculates an average of the values Mxav3 and Mnav3 to determine an average phase Av3.

As still another example, the average phase determiner 216 calculates an absolute value of a difference of the times tMmx(N−2) and tSmx(N−2) to determine a value Mxav(N−2), calculates an absolute value of a difference of the times tMmn(N−2) and tSmn(N−2) to determine a value Mnav(N−2), and calculates an average of the values Mxav(N−2) and Mnav(N−2) to determine an average phase Av(N−2).

As another example, the average phase determiner 216 calculates an absolute value of a difference of the times tMmx(N−1) and tSmx(N−1) to determine a value Mxav(N−1), calculates an absolute value of a difference of the times tMmn(N−1) and tSmn(N−1) to determine a value Mnav(N−1), and calculates an average of the values Mxav(N−1) and Mnav(N−1) to determine an average phase Av(N−1).

As yet another example, the average phase determiner 216 calculates an absolute value of a difference of the times tMmxN and tSmxN to determine a value MxavN, calculates an absolute value of a difference of the times tMmnN and tSmnN to determine a value MnavN, and calculates an average of the values MxavN and MnavN to determine an average phase AvN.

The average phase determiner 216 determines an average of the average phases Av1 through Avn to determine the average phase $\phi$ for all the N groups of the master sample data 118 and the slave sample data 120. For example, the average phase determiner 216 sums the average phases Av1 through Avn to determine a total value, and divides the total value by N to determine the average phase $\phi$.

The average phase determiner 216 sends the average phase $\phi$ to the data transmitter 134 (FIG. 2). The data transmitter 134 transmits the average phase $\phi$ to a processor, such as the processor 101 of the analytical controller 114 or the processor 105 of the process controller 116 (FIG. 2).

Figure 3E:
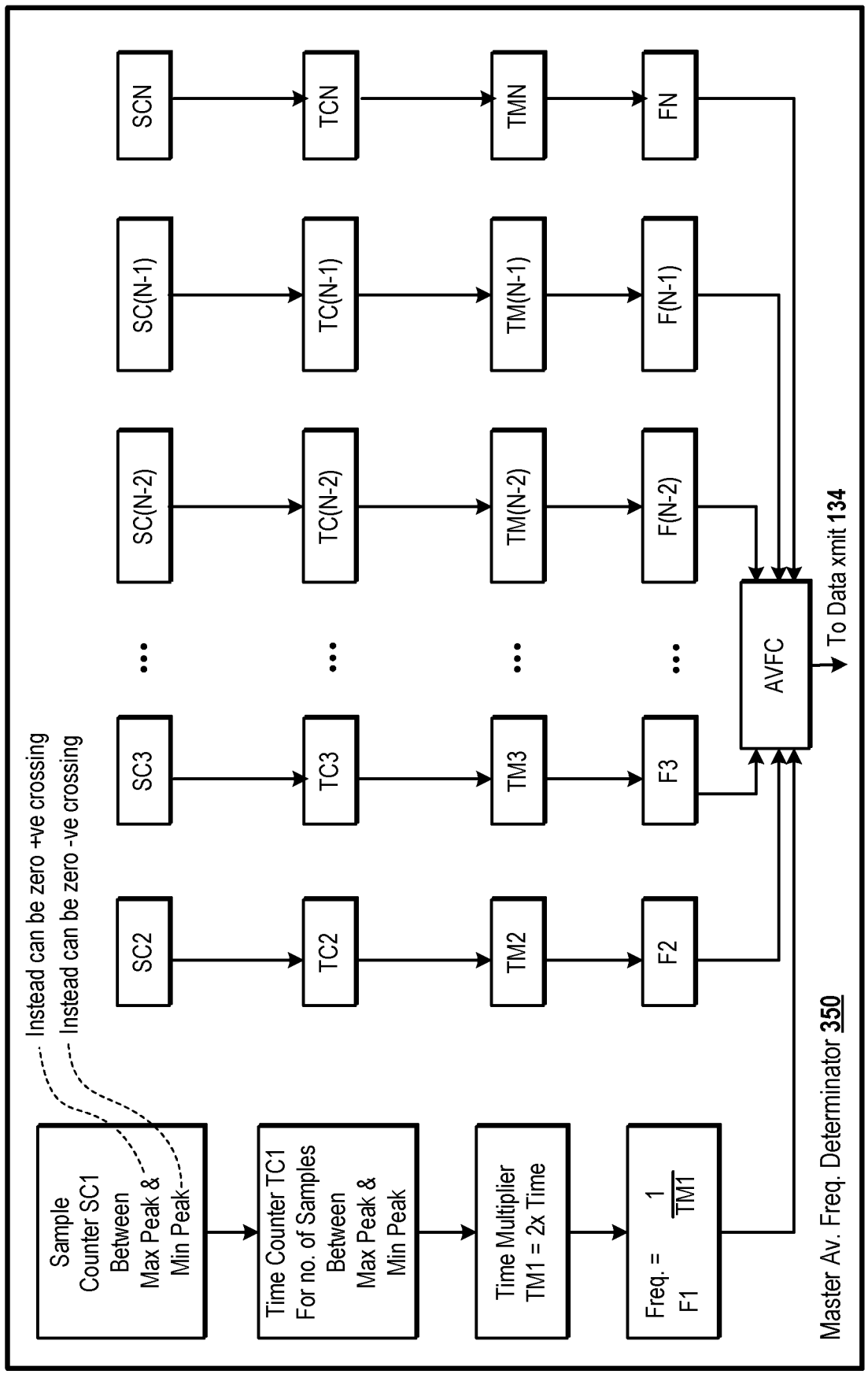
FIG. 3E is a diagram of an embodiment of a master average frequency determiner, synchronized across all ADC channels.

FIG. 3E is a diagram of an embodiment of a master average frequency determiner 350. The master average frequency determiner 350 is an example of the master average frequency determiner 212 (FIG. 2). The master average frequency determiner 350 includes sample counters (SC) SC1, SC2, SC3, and so on until sample counters SC(N−2), SC(N−1), and SCN, where N is the integer. As an example, each sample counter SC1 through SCN is a digital counter made from flip-flops connected in a cascading manner.

The master average frequency determiner 350 includes a time counter (TC) TC1, a time counter TC2, a time counter TC3, and so on until time counters TC(N−2), TC(N−1), and TCN, where N is the integer. As an example, each time counter TC1 through TCN is a digital counter made from flip-flops connected in a cascading manner.

The master average frequency determiner 350 includes time multipliers (TM) TM1, TM2, TM3, and so on until time multipliers TM(N−2), TM(N−1), and TMN, where N is the integer. Also, the master average frequency determiner 350 includes frequency determiners F1, F2, F3, and so on until F(N−2), F(N−1), and FN, where N is the integer. Each frequency determiner F1 through FN is an inverter that calculates an inverted value. The master average frequency determiner 350 is coupled to an average frequency calculator AVFC. The average frequency calculator AVFC is coupled to the data transmitter 134 (FIG. 2).

Each sample counter is coupled to the master max PTP determiner 208 (FIG. 2) and to a corresponding time counter. For example, the sample counter SC1 is coupled to the time counter TC1, the sample counter TC2 is coupled to the time counter SC2 and so on until the sample counter SCN is coupled to the time counter TCN.

Also, each time counter is coupled to a corresponding time multiplier. For example, the time counter TC1 is coupled to the time multiplier TM1, the time counter TC2 is coupled to the time multiplier TM2 and so on until the time counter TCN is coupled to the time multiplier TMN.

Each time multiplier is coupled to a corresponding frequency determiner. For example, the time multiplier TM1 is coupled to the frequency determiner F1, the time multiplier TM2 is coupled to the frequency determiner F2 and so on until the time multiplier TMN is coupled to the frequency determiner FN. The frequency determiners F1 through FN are coupled to the average frequency calculator AVFC.

The sample counter SC1 receives the first group of the master sample data 218 (FIG. 2), and counts a first number of samples within the first group between the maximum value Mmx1 and the minimum value Mmn1 within the first group. The sample counter SC1 provides the first number of samples to the time counter TC1. Similarly, the sample counter SC2 receives the second group of the master sample data 218 (FIG. 2), and counts a second number of samples within the second group between the maximum value Mmx2 and the minimum value Mmn2 within the second group. Also, the sample counter SCN receives the $N^{th}$ group of the master sample data 218 (FIG. 2), and counts an $N^{th}$ number of samples within the $N^{th}$ group between the maximum value MmxN and the minimum value MmnN within the $N^{th}$ group.

The time counter TC1 receives the count of the first number of samples from the sample counter SC1, and measures a first amount of time taken for achieving the first number of samples by the ADC 130. For example, the time counter TC1 sends a request to the ADC 130 (FIG. 1A) via a connection between the time counter TC1 and the ADC 130 to determine a time taken between achieving two consecutive samples from the first number of samples. Upon receiving the time, the time counter TC1 multiplies the time by the first number of samples to determine the first amount of time taken for achieving the first number of samples by the ADC 130.

In a similar manner, the time counter TC2 receives the count of the second number of samples from the sample counter SC2, and measures a second amount of time taken for achieving the second number of samples by the ADC 130. For example, the time counter TC2 sends a request to the ADC 130 via a connection between the time counter TC2 and the ADC 130 to determine a time taken between achieving two consecutive samples from the second number of samples. Upon receiving the time, the time counter TC2 multiplies the time by the second number of samples to determine the second amount of time.

Also, the time counter TCN receives the count of the $N^{th}$ number of samples from the sample counter SCN, and measures an $N^{th}$ amount of time taken for achieving the Nth number of samples by the ADC 130. For example, the time counter TCN sends a request to the ADC 130 via a connection between the time counter TCN and the ADC 130 to determine a time taken between achieving two consecutive samples from the $N^{th}$ number of samples. Upon receiving the time, the time counter TCN multiplies the time by the $N^{th}$ number of samples to determine the $N^{th}$ amount of time.

The time multiplier TM1 receives the first amount of time from the time counter TC1 and multiplies the first amount of time by two to calculate a first time value associated with the first number of samples. Similarly, the time multiplier TM2 receives the second amount of time from the time counter TC2 and multiplies the second amount of time by two to calculate a second time value and the time multiplier TMN receives the $N^{th}$ amount of time from the time counter TCN and multiplies the second amount of time by two to calculate an $N^{th}$ time value.

The frequency determiner F1 receives the first time value from the time multiplier TM1 and inverts the first time value to calculate a first frequency value associated with the first number of samples. Similarly, the frequency determiner F2 receives the second time value from the time multiplier TM2 and inverts the second time value to calculate a second frequency value associated with the second number of samples, and the frequency determiner FN receives the $N^{th}$ time value from the time multiplier TMN and inverts the $N^{th}$ time value to calculate an $N^{th}$ frequency value associated with the $N^{th}$ number of samples.

The average frequency calculator AVFC receives the first through $N^{th}$ frequency values from the frequency determiners F1 through FN and calculates an average of the N frequency values. For example, the average frequency calculator AVFC computes a sum of the first through $N^{th}$ frequency values and divides the sum by N to determine the master average frequency MAVF. The average frequency calculator AVFC provides the master average frequency MAVF to the data transmitter 134.

FIG. 3F-1 is an embodiment of a graph 302 to illustrate a group 304D having a largest swing among all groups 304A, 304B, 304C, and 304D, and a corresponding group 318D (FIG. 3F-2). The graph 302 includes a plot 304 of power versus time t. The groups 304A-304D are examples of any of four consecutive ones of the groups 1 through N of the master sample data 218 (FIG. 2). The processor 101 or 105 determines that the group 304D has a maximum magnitude 306A and a minimum magnitude 306B. The maximum magnitude 306A is a maximum of all values of the group 304D and the minimum magnitude 306B is a minimum of all values of the group 304D.

The processor 101 or 105 (FIG. 1A) determines that the group 304D has the largest swing. For example, the processor 101 or 105 calculates differences between maximum and minimum magnitudes for each of the groups 304A-304D. The processor 101 or 105 further determines that a difference between the maximum magnitude 306A and the minimum magnitude 306B is the greatest among all the differences to determine that the group 304D has the largest swing. The group 304D that has the largest swing among all the groups 304A-304D is sometimes referred to herein as a dominating master group. The maximum magnitude 306A within the dominating master group is referred to herein as a dominating master max value. Also, the minimum magnitude 306B within the dominating master group is referred to herein as a dominating master min value.

Also, the processor 101 or 105 determines that the group 304C has the highest maximum magnitude. For example, the processor 101 or 105 determines that a maximum magnitude 310A of the group 304C is largest among maximum magnitudes of the groups 304A-304D. The maximum magnitude 310A within the group 304C is referred to herein as a global master max value.

Furthermore, the processor 101 or 105 determines that the group 304B has the lowest minimum magnitude. For example, the processor 101 or 105 determines that a minimum magnitude 312B of the group 304B is lowest among minimum magnitudes of the groups 304A-304D. The minimum magnitude 312B within the group 304B is referred to herein as a global master min value.

The processor 101 or 105 determines a time 308A at which a first positive crossing occurs in the group 304D, which is the dominating master group. The processor 101 or 105 determines a positive crossing for a group to be a time at which there is change from a negative value within the group to a positive value within the group. The processor 101 or 105 also determines a time 308B at which a first negative crossing occurs in the group 304D. The processor 101 or 105 determines a negative crossing for a group to be a time at which there is change from a positive value within the group to a negative value within the group. Each time 308A and 308B is a position on an x-axis on which the time is plotted. The time 308A is referred to herein as a master positive edge and the time 308B is referred to herein as a master negative edge.

It should be noted that the processor 101 or 105 can identify but ignores any remaining positive and negative crossings in each group 304A-304D. For example, the processor 101 identifies a second positive crossing 314A and a second negative crossing 314B but ignores the crossings 314A and 314B.

The processor 101 or 105 further determines a sum of all widths for the groups 304A-304D. For example, a width of the group 304D is calculated by the processor 101 to be a time difference between the times 308B and 308A. The processor 101 ignores time differences between any remaining positive and negative crossings within the group 304D. Similarly, widths of the groups 304A-304C are calculated. The processor 101 calculates a total of all the widths of the groups 304A-304D. The sum of all widths of the groups 304A-304D is referred to herein as a sum master width.

The processor 101 or 105 calculates, based on the sum master width, an average master width. The processor 101 or 105 calculates an average of all widths of the groups 304A-304D to calculate the average master width. For example, the processor 101 divides the sum master width calculated based on the groups 304A-304D and divides the sum master width by four to determine the average master width.

It should be noted that one or more of the dominating master max value, the global master max value, the dominating master min value, the global master min value, the master positive edge, the master negative edge, the sum master width, and the average master width are examples of compressed data, described herein, such as the compressed data 135 (FIG. 1A).

In one embodiment, one or more of a maximum magnitude of each of the groups 304A-304D, a minimum magnitude of each of the groups 304A-304D, a time at which a first positive crossing occurs in each of the groups 304A-304D, the time at which a first negative crossing occurs in each of the groups 304A-304D are examples of compressed data, described herein, such as the compressed data 135 (FIG. 1A).

In an embodiment, the processor 101 or 105 determines a difference dominating master amplitude (DDMA) based on the maximum and minimum magnitudes 306A and 306B. For example, the processor 101 calculates a difference between the maximum magnitude 306A and the minimum magnitude 306B and divides the difference by two to determine the DDMA. Moreover, in the embodiment, the processor 101 or 105 determines a difference global master amplitude (DGMA) based on the amplitudes 310A and 312B. For example, the processor 101 calculates a difference between the maximum amplitude 310A and the minimum amplitude 312B and divides the difference by two to determine the DGMA. Also, in the embodiment, the processor 101 or 105 determines an absolute difference between the times 308A and 308B or the times 308B and 308A and multiplies the absolute difference by two to calculate a dominating master phase.

Further, in the embodiment, the processor 101 or 105 determines an average master period based on an average master width. The processor 101 or 105 calculates the average master width based on the sum master width and a number of widths within the groups 304A-304D. For example, the processor 101 calculates the average master width as a ratio of the sum master width and a sum of a number of widths within the groups 304A-304D. To further illustrate, the processor 101 calculates the average master width as a ratio of the sum master width and four. In the illustration, to calculate the average master width, the processor 101 ignores positive crossings other than a first positive crossing and ignores negative crossings other than a first negative crossing within each group 304A-304D. In the illustration, the processor 101 calculates the average master period as a product of two and the average master width.

Also, in the embodiment, the processor 101 or 105 counts a total number of clock cycles of the TTL signal 222 (FIG. 2) during which the group 304D is generated by the master sample group generator 204. The processor 101 or 105 further identifies a state within each clock cycle of the TTL signal 222 to generate a sum dominating master digital value. For example, the processor 101 or 105 counts a number of times for which a logic level 1 is achieved during a time period in which the group 304D is generated and counts a number of times for which a logic level 0 is achieved during the time period. To illustrate, the processor 101 or 105 determines that a logic level of the TTL signal 222 is greater than a pre-set threshold to determine that the logic level is one. In the illustration, the processor 101 or 105 determines that the logic level of the TTL signal 222 is less than the pre-set threshold to determine that the logic level is zero. In the illustration, the processor 101 or 105 counts a number of times for which the logic level is one or a number of times for which the logic level is zero to determine the sum dominating master digital value.

In the embodiment, one or more of the difference dominating master amplitude, the difference global master amplitude, the dominating master phase, the average master period, and the sum dominating master digital value are examples of compressed data, described herein, such as the compressed data 135.

In one embodiment, the processor 101 or 105 counts a total number of clock cycles of the TTL signal 222 (FIG. 2) during which each remaining group 304A-304C is generated by the master sample group generator 204. The processor 101 or 105 further identifies a state within each clock cycle of the TTL signal 222 to generate a sum master digital value for each of the groups 304A-304C. For example, in the same manner as that described above with reference to the group 304D, the processor 101 or 105 counts a number of times for which a logic level 1 is achieved during a time period in which each group 304A-304C is generated and counts a number of times for which a logic level 0 is achieved during the time period. The sum master digital value is an example of compressed data, described herein.

In one embodiment, the group 304D, instead of the group 304B, has a global master minimum value.

In an embodiment, the group 304D, instead of the group 304C, has a global master maximum value.

FIG. 3F-2 is an embodiment of a graph 316 to illustrate that a group 318B does not correspond to the group 304D (FIG. 3F-1) having the magnitudes 306A and 306B. The graph 316 includes a plot 318 of power versus the time t. The plot 318 includes groups 318A, 318B, 318C, and 318D, which are examples of any of four consecutive ones of the groups 1 through N of the slave sample data 220 (FIG. 2). The processor 101 or 105 determines that the group 318B has a maximum magnitude 320A and a minimum magnitude 320B. The maximum magnitude 320A is a maximum of all values of the group 318B and the minimum magnitude 320B is a minimum of all values of the group 318B.

It should be noted that the group 318B having the maximum and minimum magnitudes 320A and 320B does not correspond to the group 304D. For example, the group 318B is sampled second among the groups 318A-318D by the ADC 130 to generate the slave sample data 220 and the group 304D is sampled fourth among the groups 304A-304D to generate the master sample data 218. To illustrate, the group 318B is sampled during a different time period of the TTL signal 222 compared to a time period during which the group 304D is sampled. In the illustration, the group 318B is sampled two clock cycles earlier compared to the group 304D, and the clock cycles are of the TTL signal 222. Rather, the group 318D corresponds to the group 304D. For example, the group 318D is sampled fourth among the groups 318A-318D by the ADC 130 to generate the slave sample data 220 and the group 304D is also sampled fourth among the groups 304A-304D to generate the master sample data 218. To illustrate, the group 318D is sampled during the same time period of the TTL signal 222 compared to a time period in which the group 304D is sampled. In the illustration, the group 318D is sampled during the same one or more clock cycles of the TTL signal 222 during which the group 304D is sampled. As another illustration, a portion of a slave measurement signal from which the group 318D is generated is output by an RF sensor during the same time period in which a portion of a master measurement signal is output by the RF sensor. In the illustration, the group 304D is generated from the portion of the master measurement signal. As such, a maximum magnitude 322A of the group 318D and a minimum magnitude 322B of the group 318D, which correspond to the dominating group 304D, are analyzed by the analytical controller 101 or the process controller 105. The maximum magnitude 322A is the highest magnitude among all magnitudes of the group 318D and the minimum magnitude 322B is the lowest magnitude among all magnitudes of the group 318D.

The processor 101 or 105 further determines that the group 318B has the largest swing. For example, the processor 101 or 105 calculates differences between maximum and minimum magnitudes for each of the groups 318A-318D. The processor 101 or 105 further determines that a difference between the maximum magnitude 320A and the minimum magnitude 320B is the greatest among all the differences to determine that the group 318B has the largest swing. The group 318B that has the largest swing among all the groups 318A-318D is sometimes referred to herein as a dominating slave group. The maximum magnitude 320A within the dominating slave group is referred to herein as a dominating slave max value. Also, the minimum magnitude 320B within the dominating slave group is referred to herein as a dominating slave min value.

Also, the processor 101 or 105 determines that the group 318C has the highest maximum magnitude within the groups 318A-318D. For example, the processor 101 or 105 determines that a maximum magnitude 324A of the group 318C is largest among maximum magnitudes of the groups 318A-318D. The maximum magnitude 324A within the group 318C is referred to herein as a global slave max value.

Also, the processor 101 or 105 determines that the group 318A has the lowest minimum magnitude within the groups 318A-318D. For example, the processor 101 or 105 determines that a minimum magnitude 326B of the group 318A is smallest among minimum magnitudes of the groups 318A-318D. The minimum magnitude 326B within the group 318A is referred to herein as a global slave min value.

The processor 101 or 105 determines a time 328A at which a first positive crossing occurs in the dominating slave group 318B. The processor 101 or 105 also determines a time 328B at which a first negative crossing occurs in the group 318B. Each time 328A and 328B is a position on an x-axis on which the time is plotted. The time 308A is referred to herein as a slave positive edge and the time 328B is referred to herein as a slave negative edge. It should be noted that the processor 101 or 105 can identify but ignores any remaining positive and negative crossings in each group 318A-318D in the same manner in which the processor can identify but ignores any remaining positive and negative crossings in each group 304A-304D.

The processor 101 or 105 further determines a sum of all widths for the groups 318A-318D. For example, a width of the group 318B is calculated by the processor 101 to be a time difference between the times 328B and 328A. The processor 101 ignores time differences between any remaining positive and negative crossings within the group 318B. Similarly, widths of remaining groups 318A, 318C, and 318D are calculated. The processor 101 calculates a total of all the widths of the groups 318A-318D. The sum of all widths of the groups 318A-318D is referred to herein as a sum slave width.

The processor 101 or 105 calculates, based on the sum slave width, an average slave width. The processor 101 or 105 calculates an average of all widths of the groups 318A-318B to calculate the average slave width. For example, the processor 101 divides the sum slave width calculated based on the groups 318A-318D and divides the sum master width by four to determine the average slave width.

It should be noted that one or more of the dominating slave max value, the global slave max value, the dominating slave min value, the global slave min value, the slave positive edge, the slave negative edge, the sum slave width, and the average slave width are examples of compressed data, described herein, such as the compressed data 135.

In one embodiment, the processor 101 or 105 calculates a corresponding maximum magnitude, a corresponding minimum magnitude, a time of occurrence of a corresponding positive edge crossing, and a time of occurrence of a corresponding negative edge crossing for one of the groups 318A-318D. The one of the groups 318A-318D corresponds to the same number as that of the dominating master group. For example, the processor 101 determines the maximum magnitude 322A, the minimum magnitude 322B, a time 330A at which a first positive crossing occurs within the group 318D, and a time 330B at which a first negative crossing occurs within the group 318D. The group 318D corresponds to the group 304D. It should be noted that one or more of the corresponding maximum magnitude, the corresponding minimum magnitude, the time of occurrence of the corresponding positive edge crossing, and the time of occurrence of the corresponding negative edge crossing are examples of compressed data, described herein, such as the compressed data 135.

It should be noted that although a power value of zero is illustrated in each graph 302 and 316 at a positive or a negative crossing, in one embodiment, a DC offset is used instead of the power value of zero. The DC offset is a negative value or a positive value.

In an embodiment, the processor 101 or 105 determines a difference dominating slave amplitude (DDSA) based on the maximum and minimum magnitudes 320A and 320B. For example, the processor 101 calculates a difference between the maximum magnitude 320A and the minimum magnitude 320B and divides the difference by two to determine the difference dominating slave amplitude. Moreover, in the embodiment, the processor 101 or 105 determines a difference global slave amplitude (DGSA) based on the amplitudes 324A and 326B. For example, the processor 101 calculates a difference between the maximum amplitude 324A and the minimum amplitude 326B and divides the difference by two to determine the difference global slave amplitude. Also, in the embodiment, the processor 101 or 105 determines an absolute difference between the times 328A and 328B or the times 328B and 328A and multiplies the absolute difference by two to calculate a dominating slave phase.

Further, in the embodiment, the processor 101 or 105 determines an average slave period based on an average slave width. The processor 101 or 105 calculates the average slave width based on the sum slave width and a number of widths within the groups 318A-318D. For example, the processor 101 calculates the average slave width as a ratio of the sum slave width and a sum of a number of widths within the groups 318A-318D. To further illustrate, the processor 101 calculates the average slave width as a ratio of the sum slave width and four. In the illustration, to calculate the average slave width, the processor 101 ignores positive crossings other than a first positive crossing and negative crossings other than a first negative crossing within each group 318A-318D. In the illustration, the processor 101 calculates the average slave period as a product of two and the average slave width.

Also, in the embodiment, the processor 101 or 105 counts a total number of clock cycles of the TTL signal 222 (FIG. 2) during which the dominating slave group 318B is generated by the slave sample group generator 206. The processor 101 or 105 further identifies a state within each clock cycle of the TTL signal 222 to generate a sum dominating slave digital value. For example, the processor 101 or 105 counts a number of times for which the logic level 1 of the TTL signal 222 is achieved during a time period in which the group 318B is generated. In the example, the processor 101 or 105 counts a number of times for which the logic level 0 of the TTL signal 222 is achieved during the time period. To illustrate, the processor 101 or 105 determines that a logic level of the TTL signal 222 is greater than the pre-set threshold to determine that the logic level is one. In the illustration, the processor 101 or 105 determines that the logic level of the TTL signal 222 is less than the pre-set threshold to determine that the logic level is zero. In the illustration, the processor 101 or 105 counts a number of times for which the logic level is one or a number of times for which the logic level is zero to determine the sum dominating slave digital value.

In the embodiment, one or more of the difference dominating slave amplitude, the difference global slave amplitude, the dominating slave phase, the average slave period, and the sum dominating slave digital value are examples of compressed data, described herein, such as the compressed data 135.

In one embodiment, the processor 101 or 105 counts a total number of clock cycles of the TTL signal 222 (FIG. 2) during which each remaining group 318A, 318C, and 318D is generated by the slave sample group generator 206. The processor 101 or 105 further identifies a state within each clock cycle of the TTL signal 222 to generate a sum slave digital value for each of the groups 318A, 318C, and 318D. For example, in the same manner as that described above with reference to the group 318B, the processor 101 or 105 counts a number of times for which a logic level 1 is achieved during a time period in which each group 318A, 318C, and 318D is generated and counts a number of times for which a logic level 0 is achieved during the time period. In the example, the number of times is equal to the sum slave digital value. The sum slave digital value is an example of compressed data, described herein, such as the compressed data 135.

In one embodiment, one or more of the MMaxPTP, the SMaxPTP, the MAVF, the φ, the dominating master max value, the global master max value, the dominating master min value, the global master min value, the master positive edge, the master negative edge, the sum master width, the average master width, the maximum magnitude of each of the groups 304A-304C, the minimum magnitude of each of the groups 304A-304C, the time at which a first positive crossing occurs in each of the groups 304A-304C, the time at which a first negative crossing occurs in each of the groups 304A-304C, the difference dominating master amplitude, the difference global master amplitude, the dominating master phase, the average master period, the sum dominating master digital value, the sum master digital value, the dominating slave max value, the global slave max value, the dominating slave min value, the global slave min value, the slave positive edge, the slave negative edge, the sum slave width, the average slave width, the corresponding maximum magnitude within the groups 318A-318D, the corresponding minimum magnitude within the groups 318A-318D, the time of occurrence of the corresponding positive edge crossing within the groups 318A-318D, the time of occurrence of the corresponding negative edge crossing within the groups 318A-318D, the difference dominating slave amplitude, the difference global slave amplitude, the dominating slave phase, the average slave period, the sum dominating slave digital value, and the sum slave digital value are examples of compressed data, described herein. Examples of the compressed data, described herein, include the compressed data 135, 135A, 135B, 135C, 135D, 135E, 135F, 135G, and 157 (FIGS. 1C-1, 1C-2, 1E-1, and 1E-2).

In one embodiment, the group 318B, instead of the group 318A, has a global slave minimum value.

In an embodiment, the group 318B, instead of the group 318C, has a global slave maximum value.

FIG. 4A is a diagram of an embodiment of a system 400 to illustrate control of an RF generator 402 based on the compressed data, described herein. The system 400 includes the RF generator 402, a match 404, a motor system 406, a driver system 408, the analytical controller 114, and the process controller 116.

An example of the RF generator 402 includes the RF generator 109 (FIGS. 1A and 1B), or the RF generator 109A (FIG. 1C-1), or the RF generator 109B, (FIG. 1C-1), or the RF generator 109C (FIG. 1D), or the RF generator 109D (FIG. 1D). An example of the match 404 includes the match 111 (FIG. 1A), or the match 111A (FIG. 1C-1), or the match 111B (FIG. 1C-1), or the match 164 (FIG. 1D). To illustrate, when the RF generator 402 is the RF generator 109, the match 404 is the match 111 that is coupled to the RF generator 109, and when the RF generator 402 is the RF generator 109B, the match 404 is the match 111A that is coupled to the RF generator 109B or the match 164 that is coupled to the RF generator 109B.

An example of the motor system 406 includes one or more electric motors, such as direct current (DC) motors and alternative current (AC) motors. Each electric motor includes a stator and a rotor. An example of the driver system 408 includes one or more drivers, such as one or more transistors. For example, one or more transistors of the driver are coupled to each other.

The processor 101 of the analytical controller 114 is coupled to the driver system 408 and the driver system 408 is coupled to the motor system 406. Also, the processor 101 is coupled to the RF generator 402. For example, the processor 101 is coupled to a digital signal processor of the RF generator via a transfer cable.

The motor system 406 is coupled to the match 404 via one or more mechanical connections, such as one or more rods, or a combination of two or more rods and one or more gears. For example, a motor of the motor system 406 is coupled to a plate of the capacitor of the match 404 via two rods and a gear between the two rods. The two rods are coupled to each other via the gear. As another example, a motor of the motor system 406 is coupled to a core surrounded by a coil of an inductor of the match 404. The motor is coupled to the core to change a position of the core. The core and the coil are parts of the inductor.

Upon receiving the compressed data, described herein, from the data transmitter 134 (FIG. 1A) via the data transceiver 125 (FIG. 1A), the processor 101 determines to change one or more variables of operation of the RF generator 402. An example of a variable of the RF generator 402 includes power or frequency. For example, upon determining that the slave maximum peak-to-peak value SMaxPTP is greater than a pre-determined threshold and the master maximum peak-to-peak value MMaxPTP is lower than a pre-determined limit, the processor 101 determines to increase an amount of power that is generated and supplied by the RF generator 402. As another example, upon determining that the master average frequency value MAVF is not within a pre-determined range, the processor 101 controls the RF generator 402 to increase or decrease the frequency of operation of the RF generator 402 until the master average frequency value MAVF is within the pre-determined range. As yet another example, upon determining that the average phase value $\phi$ is not within a pre-determined range, the processor 101 controls the RF generator 402 to increase or decrease the frequency of operation of the RF generator 402 until the average phase value $\phi$ is within the pre-determined range. In this manner, the variable of the RF generator 402 is controlled by the processor 101 until the master maximum peak-to-peak value MMaxPTP is within a pre-determined range, or the slave maximum peak-to-peak value SMaxPTP is within a pre-determined range, or the master average frequency value MAVF is within a pre-determined range, or the average phase value $\phi$ is within a pre-determined range, or a combination of two or more thereof.

As another example, the processor 101 determines that the compressed data, described herein, corresponds to a first plasma control state, such as plasma impedance, and determines to modify one or more of the variables of the RF generator 402. To illustrate, the correspondence exists when there is a one-to-one relationship or a link between the compressed data, described herein, and the first plasma control state. The one or more variables are modified until the processor 101 determines that the compressed data, described herein, corresponds to a second plasma control state. An example of the plasma impedance state is a level of impedance of plasma within the plasma chamber 152. The level of impedance includes impedance values that are within a pre-determined range from each other. Also, magnitudes of an impedance level are exclusive of magnitudes of another impedance level.

As yet another example, the processor 101 determines that the compressed data, described herein, corresponds to a first RF transition sequence, such as a sequence of states or levels of the one of the variables of the RF generator 402, and determines to modify one or more of the variables of the RF generator 402. To illustrate, the correspondence exists when there is a one-to-one relationship or a link between the compressed data, described herein, and the first RF transition sequence. The one or more variables are modified until the processor 101 determines that the compressed data, described herein, corresponds to a second RF transition sequence. An example of the an RF transition sequence is a change from one power level to another of an RF signal generated by the RF generator 402 during a clock cycle of the clock signal that is received by the RF generator 402 from the processor 101. The RF transition sequence includes any number of changes in power levels during the clock cycle. A power level of the RF signal includes peak-to-peak or zero-to-peak power magnitudes of the RF signal and the magnitudes are within a pre-determined range from each other. Also, magnitudes of a power level are exclusive of magnitudes of another power level.

As still another example, the processor 101 determines that the master maximum peak-to-peak value MMaxPTP is greater than or lower than a first pre-determined master maximum peak-to-peak value, or the slave maximum peak-to-peak value SMaxPTP is greater than or lower than a first pre-determined slave maximum peak-to-peak value, or the master average frequency value MAVF is greater than or lower than a first pre-determined master average frequency value, or the average phase value $\phi$ is greater than or lower than a first average phase pre-determined value, or a combination thereof to determine that an RF trigger event has occurred. Upon determining that the RF trigger event has occurred, the processor 101 controls one or more of the variables of the RF generator 402 until the RF trigger event no longer occurs.

As yet another example, the processor 101 determines that the master maximum peak-to-peak value MMaxPTP is greater than or lower than a second pre-determined master maximum peak-to-peak value, or the slave maximum peak-to-peak value SMaxPTP is greater than or lower than a second pre-determined slave maximum peak-to-peak value, or the master average frequency value MAVF is greater than or lower than a second pre-determined master average frequency value, or the average phase value $\phi$ is greater than or lower than a second average phase pre-determined value, or a combination thereof to determine that an RF precursor event has occurred. The RF precursor event is an event that occurs before the RF trigger event. To illustrate, the RF precursor event is a warning that the RF trigger event will occur. Upon determining that the RF precursor event has occurred, the processor 101 controls one or more of the variables of the RF generator 402 until the RF precursor event no longer occurs.

As another example, the processor 101 determines that the master maximum peak-to-peak value MMaxPTP is greater than or lower than a third pre-determined master maximum peak-to-peak value, or the slave maximum peak-to-peak value SMaxPTP is greater than or lower than a third pre-determined slave maximum peak-to-peak value, or the master average frequency value MAVF is greater than or lower than a third pre-determined master average frequency value, or the average phase value $\phi$ is greater than or lower than a third average phase pre-determined value, or a combination thereof to determine that an RF fault event has occurred. Upon determining that the RF trigger fault has occurred, the processor 101 controls one or more of the variables of the RF generator 402 until the RF fault event no longer occurs. Illustrations of the RF fault event include malfunction of a component of a plasma system or a plasma tool, described herein, and arcing of plasma within a plasma chamber, described herein. Examples of a component of the plasma system include an RF generator, an RF cable, a match, an RF transmission line, and a plasma chamber.

Similarly, upon receiving the compressed data, described herein, the processor 101 determines to change a variable, such as a capacitance or an inductance, of the match 404. For example, the processor 101 sends a control signal to the driver system 408 to change the variable of the match 404. Upon receiving the control signal, the driver system 408 generates one or more current signals and provides the one or more current signals to the motor system 406. Upon receiving the one or more current signals, the one or more motors of the motor system 406 operate to move one or more plates of one or more capacitors or to change positions of one or more cores of one or more inductors of the match 404. The one or more capacitors of the match 404 are controlled to change a capacitance of the match 404 and the one or more inductors of the match 404 are controlled to change an inductance of the match 404. In this manner, the capacitance and/or the inductance of the match 404 is controlled by the processor 101 until the compressed data, described herein, is within a pre-determined range.

In one embodiment, instead of the analytical controller 114 controlling the RF generator 402 and/or the match 404, the process controller 116 controls the RF generator and/or the match 404. For example, the processor 105 is coupled to the digital signal processor of the RF generator 402 and is coupled to the driver system 408 instead of the processor 101. The processor 105 provides control signals to the RF generator 402 and the driver system 408 to control the RF generator 402 and the driver system 408 in a manner described above until the compressed data, described herein, is within a pre-determined range.

FIG. 4B is a diagram of an embodiment of a system 410 to illustrate a control of a gap 412 between the lower electrode 154 and the TCP coil 156. The system 410 includes the process controller 116, the analytical controller 114, the driver system 408, the motor system 406, and the plasma chamber 152.

The processor 101 is coupled to the driver system 408 and the motor system 406 is coupled to the lower electrode 154. For example, the motor system 406 is coupled to the lower electrode 154 via one or more mechanical connections, examples of which are provided above.

The processor 101 sends a control signal to the driver system 408. Upon receiving the control signal, the driver system 408 generates one or more current signals. The one or more current signals received by the motor system 406, and the motor system 406 operates in the manner described above to move the lower electrode upward or downward in a vertical direction to change the gap 412 between the lower electrode 154 and the TCP coil 156. In this manner, the gap 412 is controlled by the processor 101 until the compressed data, described herein, is within a pre-determined range. For example, the gap 412 is controlled until the master maximum peak-to-peak value MMaxPTP is within a pre-determined range, or the slave maximum peak-to-peak value SMaxPTP is within a pre-determined range, or the master average frequency value MAVF is within a pre-determined range, or the average phase value $\phi$ is within a pre-determined range, or a combination of two or more thereof.

In one embodiment, instead of the plasma chamber 152, the plasma chamber 113 (FIG. 1A) or the plasma chamber 168 (FIG. 1D) is used. For example, a gap between two electrodes, such as an upper electrode and a lower electrode of the plasma chamber 113, or between the lower electrode 154 and the TCP coil 156A of the plasma chamber 168, is controlled.

In an embodiment, instead of the analytical controller 114 controlling the gap 412, the process controller 116 controls the gap 412. For example, the processor 105 is coupled to the driver system 408 instead of the processor 101. The processor 105 provides control signals to the driver system 408 to control the gap 412 in a manner described above.

Figure 4C:
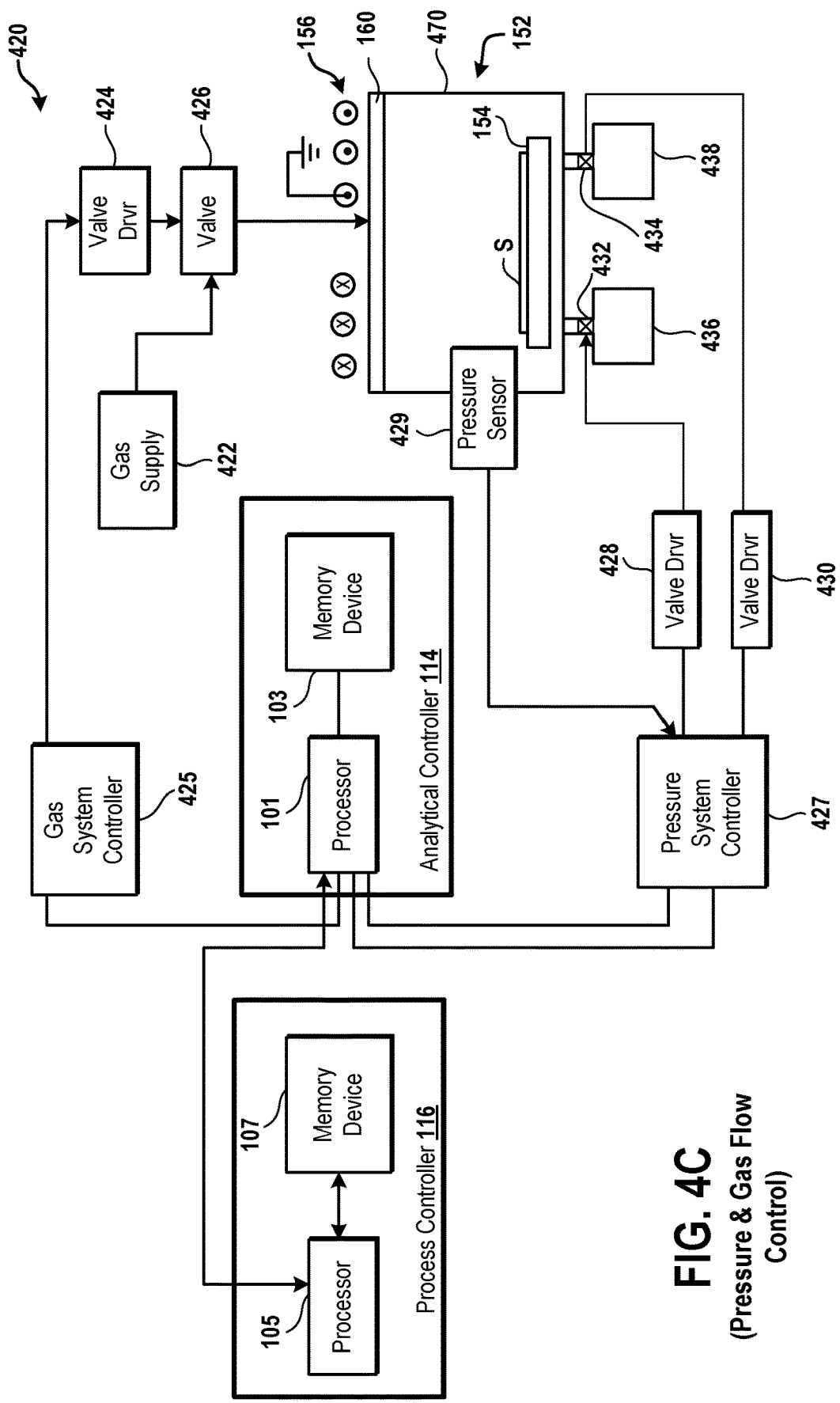
FIG. 4C is a diagram of an embodiment of a system to illustrate a control of pressure and/or gas flow within a plasma chamber based on the compressed data.

FIG. 4C is a diagram of an embodiment of a system 420 to illustrate a control of pressure and a control of gas flow within the plasma chamber 152. The system 420 includes the process controller 116, the analytical controller 114, a gas supply 422, a valve driver 424, a gas system controller 425, a valve 426, a pressure system controller 427, the plasma chamber 152, another valve driver 428, a pressure sensor 429, a valve driver 430, a valve 432, a valve 434, a vacuum pump 436, and another vacuum pump 438.

An example of a gas supply, as used herein, includes one or more gas containers or one or more gas sources or one or more gas storages for storing the one or more process gases. An example of a valve driver, as used herein, includes one or more transistors that are coupled to each other. Examples of a valve, as used herein, includes a piston valve and a diaphragm valve.

The vacuum pumps 436 and 438 are located below the plasma chamber 152. For example, the vacuum pumps 436 and 438 are adjacent to a bottom wall of the plasma chamber 152. The valve 432 is located between the vacuum pump 436 and an inside volume of a housing of the plasma chamber 152. Moreover, the valve 434 is located between the vacuum pump 438 and the inside volume of the plasma chamber 152. For example, the valves 432 and 434 are integrated within the bottom wall of the plasma chamber 152.

The processor 101 is coupled to the gas system controller 425 and the pressure system controller 427. The gas system controller 425 is coupled to the valve driver 424, which is coupled to the valve 426. The gas supply 422 is coupled via a gas channel, such as a gas tube or a gas pipe, to the inside volume within the housing of the plasma chamber 152. The valve 426 is fitted within the gas channel.

The processor 101 is coupled to the pressure system controller 427, which is coupled to the valve driver 428, which is coupled to the valve 432. The pressure system controller 427 is also coupled to the valve driver 430, which is coupled to the valve 434. The pressure sensor 429 is coupled to a wall 470 of the plasma chamber 152 and is also coupled to the pressure system controller 427.

The processor 101 sends an instruction to the gas system controller 425. In response to the instruction, the gas system controller 425 generates and sends a control signal to the valve driver 424. Upon receiving the control signal, the valve driver 424 sends a current signal to the valve 426. In response to receiving the current signal, the valve 426 opens or closes to control, such as increase or decrease, a supply of the one or more process gases, which are stored in the gas supply 422, via the gas channel to the inside volume of the plasma chamber 152 to process the substrate S.

Similarly, the processor 101 sends an instruction to the pressure system controller 427. When the instruction is received in addition to values of pressure, the pressure system controller 427 generates and sends a control signal to the valve driver 428. The pressure system controller 427 receives, from the pressure sensor 429, the values of pressure within the plasma chamber 152. Upon receiving the control signal, the valve driver 428 sends a current signal to the valve 432. In response to receiving the current signal, the valve 432 opens or closes to control, such as increase or decrease, an output of remnants of processing the substrate S from the inside volume of the plasma chamber 152 to outside the plasma chamber 152 into a container within or attached to the vacuum pump 436. Examples of the remnants of processing the substrate S include remaining process gases within the plasma chamber 152 after processing the substrate S or remnant plasma that is generated within the plasma chamber 152. In a similar manner, the processor 101 controls the valve 434 via the valve driver 430 to control, such as increase or decrease, an output of the remnants of processing the substrate S from the inside volume of the plasma chamber 152 to outside the plasma chamber 152 into a container that is within or attached to the vacuum pump 438.

The valve 426 is controlled by the processor 101 in the manner described above to control an amount of pressure within the inside volume of the plasma chamber 152 and/or to control an amount of gas flow of the one or more process gases to the inside volume of the plasma chamber 152. The amount of pressure and/or the amount of gas flow are controlled by controlling the valve 426 until the compressed data, described herein, is within a pre-determined range. For example, the amount of pressure and/or the amount of gas flow are controlled until the master maximum peak-to-peak value MMaxPTP is within a pre-determined range, or the slave maximum peak-to-peak value SMaxPTP is within a pre-determined range, or the master average frequency value MAVF is within a pre-determined range, or the average phase value φ is within a pre-determined range, or a combination of two or more thereof Similarly, instead of or in addition to controlling the valve 426, one or more of the valves 432 and 434 are controlled by the processor 101 in the manner described above to control an amount of pressure within the inside volume of the plasma chamber 152 until the compressed data is within a pre-determined range. For example, instead of or in addition to controlling the valve 426, one or more of the valves 432 and 434 are controlled by the processor 101 in the manner described above to control an amount of pressure within the inside volume of the plasma chamber 152 until the master maximum peak-to-peak value MMaxPTP is within a pre-determined range, or the slave maximum peak-to-peak value SMaxPTP is within a pre-determined range, or the master average frequency value MAVF is within a pre-determined range, or the average phase value φ is within a pre-determined range, or a combination of two or more thereof.

In an embodiment, instead of the analytical controller 114 controlling one or more of the valves 426, 432, and 434, the process controller 116 controls one or more of the valves 426, 432, and 434. For example, the processor 105 is coupled to the valve drivers 424, 428, and 430, instead of the processor 101. The processor 105 provides a control signal to the valve driver 424 to control the gas flow and/or the pressure within the inside volume of the plasma chamber 152. Also, the processor 105 provides control signals to the valve drivers 428 and 430 to control the pressure within the inside volume of the plasma chamber 152.

In one embodiment, instead of the plasma chamber 152, the plasma chamber 113 (FIG. 1A) or the plasma chamber 168 (FIG. 1D) is used. For example, a pressure within an inside volume of the plasma chamber 113, or an inside volume of the plasma chamber 168, is controlled. As another example, an amount of gas flow to the inside volume of the plasma chamber 113 or to the inside volume of the plasma chamber 168 is controlled.

In an embodiment, the compressed data, described herein, facilitates rapid control synchronization of RF to improve matching, or to improve throughput and run-to-run or chamber-to-chamber reproducibility via rapid transition operations, or to achieve synchronization of RF Matching system (>5 parts) via analog domain, or to achieve gas flow tuning. The gas flow and pressure drives the plasma impedance changes and changes in the gas flow and pressure can be detected via a plurality of measurement signals, described herein.

Figure 4D:
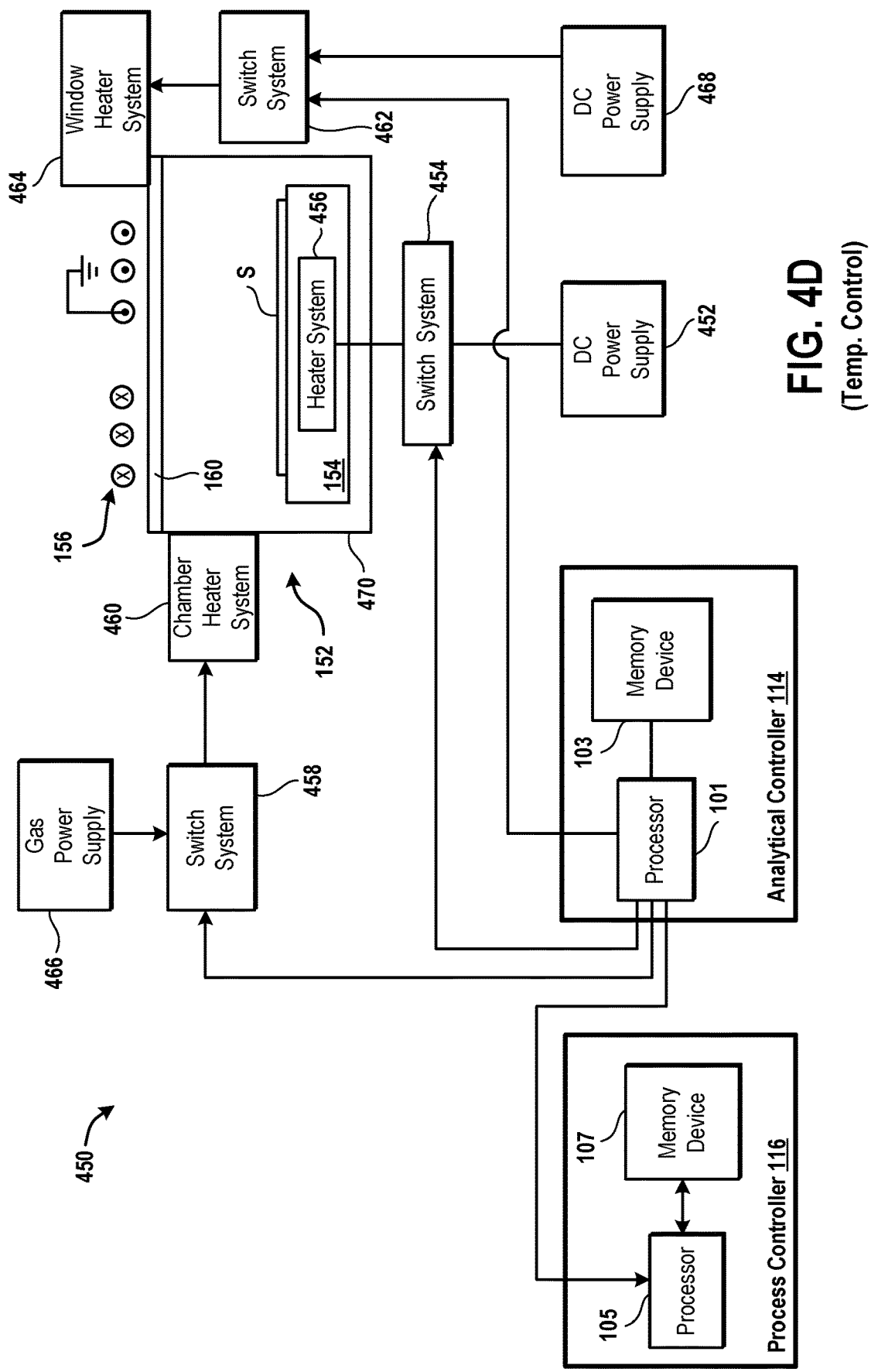
FIG. 4D is a diagram of an embodiment of a system to illustrate a control of temperature within the plasma chamber based on the compressed data.

FIG. 4D is a diagram of an embodiment of a system 450 to illustrate a control of temperature within the plasma chamber 152. The system 450 includes the analytical controller 114, the process controller 116, a direct current (DC) power supply 452, a switch system 454, a switch system 458, a chamber heater system 460, a switch system 462, a window heater system 464, a DC power supply 466, a DC power supply 468, and the plasma chamber 152. The processor 101 is coupled to the switch systems 454, 458, and 462. This switch system 454 is coupled to a heater system 456 within the lower electrode 154 of the plasma chamber 152. The switch system 458 is coupled to the chamber heater system 460 and the switch system 462 is coupled to the window heater system 464.

The chamber heater system 460 is coupled to the wall 470 of the plasma chamber 152. Also, the window heater system 464 is coupled to the dielectric window 160.

An example of a heater system, as used herein, includes one or more heater elements, such as one or more resistors. Another example of the heater system, as used herein, includes a heater array, which includes a matrix of resistors. An example of a switch system, as described herein, includes one or more switches, such as one or more transistors.

The DC power supply 452 is coupled via the switch system 454 to the heater system 456. Similarly, the DC power supply 466 is coupled via the switch system 458 to the chamber heater system 460 and the DC power supply 468 is coupled via the switch system 462 to the window heater system 464. An example of a DC power supply, as used herein, includes a DC voltage source.

The processor 101 sends an on control signal to one or more of the switch systems 454, 458, and 462 to increase a temperature within the plasma chamber 152. Upon receiving the on control signal, the switch system 454 connects the DC power supply 452 to one or more heater elements of the heater system 456 to increase the temperature within the plasma chamber 152. Similarly, in response to receiving the on control signal, the switch system 458 connects the DC power supply 466 to one or more heater elements of the chamber heater system 460 to heat the wall 470. The wall 470 is heated to increase the temperature within the plasma chamber 152. Also, upon receiving the on control signal, the switch system 462 connects the DC power supply 468 to one or more heater elements of the window heater system 464 to heat the dielectric window 160. The dielectric window 160 is heated to increase the temperature within the plasma chamber 152.

On the other hand, the processor 101 sends an off control signal to one or more of the switch systems 454, 458, and 462 to decrease the temperature within the plasma chamber 152. Upon receiving the off control signal, the switch system 454 disconnects the DC power supply 452 from one or more heater elements of the heater system 456 to cool the lower electrode 154. The lower electrode 154 is cooled to decrease the temperature within the plasma chamber 152. In a similar manner, upon receiving the off control signal, the switch system 458 disconnects the DC power supply 466 from one or more heater elements of the chamber heater system 460 to cool the wall 470. The wall 470 is cooled to decrease the temperature within the plasma chamber 152. Also, in response to receiving the off control signal, the switch system 462 disconnects the DC power supply 468 from one or more heater elements of the window heater system 464 to cool the dielectric window 160. The dielectric window 160 is cooled to decrease the temperature within the plasma chamber 152. The temperature within the plasma chamber 152 is controlled, such as increased or decreased, until the processor 101 or 105 determines that the compressed data, described herein, is within a pre-determined range.

In one embodiment, the compressed data, described herein, facilitates overheating fault detection via long RF on times, or detection of high RF power, or detection of extreme high temperatures, or detection of high pressures, or detection of low gas flows, or detection of thermal runaway, or detection of colder cryo capability, or a combination thereof.

In an embodiment, the compressed data, described herein, is used to generate localized heating models. The localized heating models can then be used to calculate temperature within the plasma chamber 152 without using temperature sensors. Also, the temperature within the plasma chamber 152 is controlled to cool an inside volume within the plasma chamber 152 to prevent etch degradation and decreased repeatability for high power.

It should be noted that the RF generator 402, or the match 404, or the gap 412, or the pressure within the plasma chamber 152, or an amount of gas flow to the plasma chamber 152, or a temperature within the plasma chamber 152, or a combination thereof, is controlled to achieve a wafer processing advantage. Examples of achieving the wafer processing advantage include increasing a processing rate of processing the substrate S, or achieving uniformity in processing the substrate S, or a combination thereof. Examples of processing the substrate S include depositing a material on the substrate S, or etching features into the substrate S, or sputtering the substrate S, or cleaning the substrate S, or a combination thereof.

In one embodiment, the processor 101 is coupled to the switch system 454 via a multiplexer.

In an embodiment, instead of the analytical controller 114 controlling the heater system 456, the process controller 116 controls the heater system 456. For example, the processor 105 is coupled to the switch system 454, instead of the processor 101. The processor 105 provides on and off control signals to the switch system 454 to control, such as increase or decrease, the temperature within the inside volume of the plasma chamber 152.

In one embodiment, instead of the plasma chamber 152, the plasma chamber 113 (FIG. 1A) or the plasma chamber 168 (FIG. 1D) is used. For example, a temperature within the inside volume of the plasma chamber 113, or the inside volume of the plasma chamber 168, is controlled.

Figure 5:
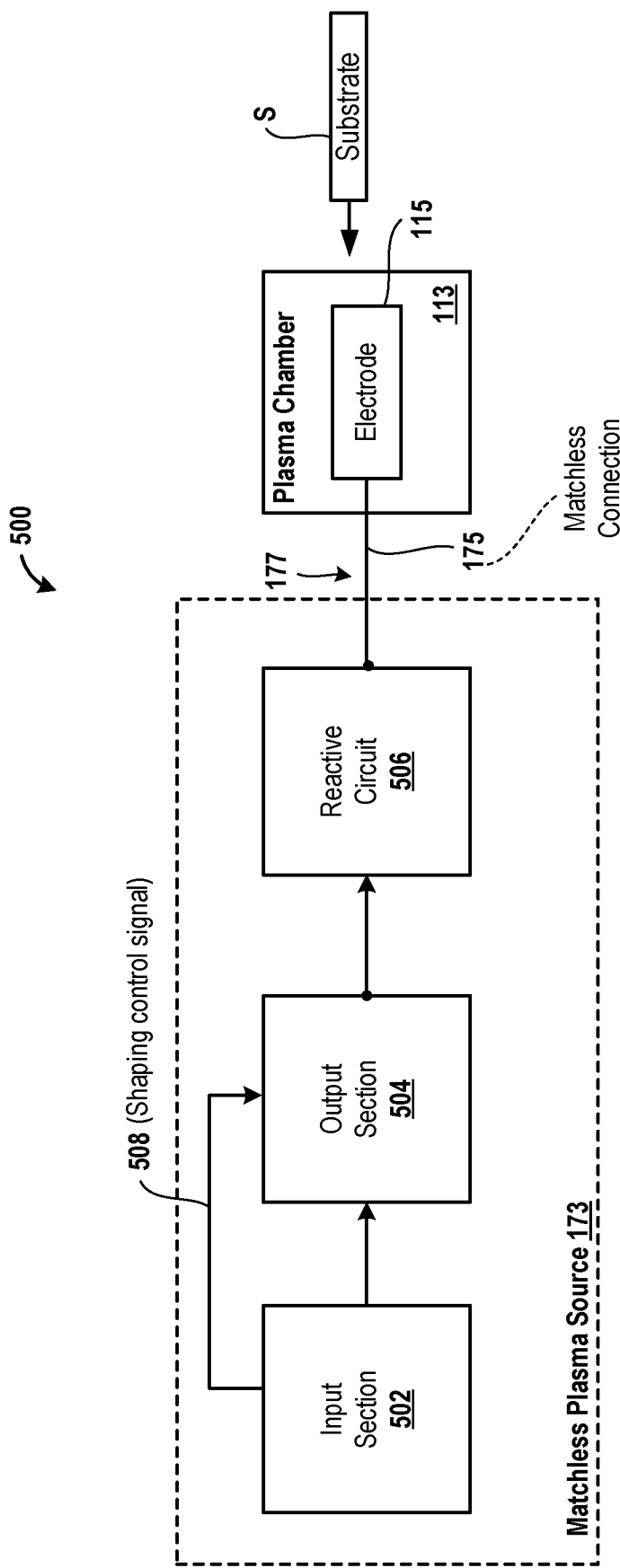
FIG. 5 is a diagram of an embodiment of a system to illustrate details of a matchless plasma source.

FIG. 5 is a diagram of an embodiment of a system 500 to illustrate details of the matchless plasma source 173. The system 500 includes the matchless plasma source 173, the connection 175, and the plasma chamber 113. The MPS 173 includes an input section 502, an output section 504, and a reactive circuit 506. An example of the input section 502 includes a signal generator and a portion of a gate driver. An example of the signal generator is a square wave oscillator that generates a square wave signal, such as a digital waveform or a pulse train. The square wave pulses between a first logic level, such as high or one, and a second logic level, such as low or zero. An example of the output section 504 includes the remaining portion of the gate driver and a half-bridge transistor circuit. Further, an example of the reactive circuit 206 includes a variable capacitor. Another example of the reactive circuit 206 includes a fixed capacitor.

The input section 502 is coupled to the output section 504, which is further coupled to the reactive circuit 506. The reactive circuit 506 is coupled via the connection 175 to the electrode 115.

The input section 202 generates multiple square wave signals and provides the square wave signals to the output section 204. The output section 204 generates an amplified square waveform from the multiple square wave signals received from the input section 202. Moreover, the output section 204 shapes an envelope, such as a peak-to-peak magnitude, of the amplified square waveform. For example, a shaping control signal 508 is supplied from the input section 502 to the output section 504 to generate the envelope. The shaping control signal 508 has multiple voltage values for shaping the amplified square waveform.

The amplified square waveform that is shaped is sent from the output section 504 to the reactive circuit 506. The reactive circuit 506 removes, such as filters out, higher-order harmonics of the amplified square waveform to generate the RF signal 177, which is a shaped sinusoidal waveform having a fundamental frequency. The shaped sinusoidal waveform has the envelope that is shaped.

The shaped sinusoidal waveform is sent from the reactive circuit 506 via the connection 175 to the electrode 115 for processing the substrate S. For example, one or more process materials, such as fluorine containing gases, oxygen containing gases, nitrogen containing gases, liquids for deposition of metals and dielectrics, etc., are supplied to the plasma chamber 115. Upon receiving the shaped sinusoidal waveform and the one or more process materials, plasma is lit within the plasma chamber 113 to process the substrate S. An example of the MPS 173 is provided in U.S. Pat. No. 10,264,663, which is incorporated by reference herein in its entirety.

In some embodiments, the input section 502 includes a controller board having the signal generator and further includes the gate driver, and the output section includes the half-bridge transistor circuit. The controller board includes a controller coupled to the signal generator to control the signal generator to generate the square wave signal at a pre-determined frequency.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a capacitively-coupled plasma chamber, a transformer coupled plasma chamber, a capacitively coupled plasma reactor, conductor tools, dielectric tools, a plasma chamber including an electron cyclotron resonance (ECR) reactor, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:
1. A method for compressing data, comprising:
receiving a plurality of measurement signals from one or more sensors coupled to a radio frequency (RF) transmission path of a plasma tool, wherein the RF transmission path is from an output of an RF generator to an electrode of the plasma tool, wherein said receiving the plurality of measurement signals includes:

receiving a first electrical signal representing a first parameter associated with a first RF signal; and receiving a second electrical signal representing a second parameter associated with a second RF signal;

converting the plurality of measurement signals from an analog form to a digital form to sample data, wherein said converting the plurality of measurement signals includes:

sampling the first electrical signal to output a first plurality of sample sets; and sampling the second electrical signal to output a second plurality of sample sets;

processing the sample data to output compressed data, wherein said processing the sample data includes:

determining a first maximum peak-to-peak value from the first plurality of sample sets; or determining a second maximum peak-to-peak value from the second plurality of sample sets; or determining a statistical frequency value from the first plurality of sample sets; or determining a statistical phase value from the first and second pluralities of sample sets; or a combination of two or more thereof; and sending the compressed data to a controller for controlling the plasma tool.

2. The method of claim 1, wherein the first plurality of sample sets include a first master sample set and a second master sample set, wherein the second plurality of sample sets include a first slave sample set and a second slave sample set, wherein said processing the sample data comprises:

determining the first master sample set to have a largest swing from among the first and second master sample sets;

identifying the first slave sample set as corresponding to the first master sample set; and determining at least one of a maximum magnitude, a minimum magnitude, a time of a positive crossing, and a time of a negative crossing from the first slave sample set.

3. The method of claim 1, wherein the first plurality of sample sets include a first master sample set and a second master sample set, wherein the second plurality of sample sets include a first slave sample set and a second slave sample set, wherein said processing the sample data comprises:

determining the first master sample set to have a largest swing from among the first and second master sample sets; or determining a maximum magnitude of the first master sample set; or determining the second master sample set to have a largest maximum magnitude from the maximum magnitude of the first master sample set and a maximum magnitude of the second master sample set; or determining a minimum magnitude of the first master sample set; or determining a minimum magnitude to be a minimum of the minimum magnitude of the first master sample set and a minimum magnitude of the second master sample set; or determining a position of a positive crossing within the first master sample set; or determining a position of a negative crossing within the first master sample set; or determining a sum of differences between positive and negative crossings of the first and second master sample sets.

4. The method of claim 1, wherein the first plurality of sample sets include a first master sample set and a second master sample set, wherein the second plurality of sample sets include a first slave sample set and a second slave sample set, wherein said processing the sample data comprises:

determining the first slave sample set to have a largest swing from among the first and second slave sample sets; or determining a maximum magnitude of the first slave sample set; or determining the second slave sample set to have a largest maximum magnitude from the maximum magnitude of the first slave sample set and a maximum magnitude of the second slave sample set; or determining a minimum magnitude of the first slave sample set; or determining a minimum magnitude to be a minimum of the minimum magnitude of the first slave sample set and a minimum magnitude of the second slave sample set; or determining a position of a positive crossing within the first slave sample set; or determining a position of a negative crossing within the first slave sample set; or determining a sum of differences between positive and negative crossings of the first and second slave sample sets.

5. The method of claim 1, wherein said sampling the first electrical signal and said sampling the second electrical signal are performed in synchronization with a clock signal, wherein said determining the first maximum peak-to-peak value, said determining the second maximum peak-to-peak value, said determining the statistical frequency value, and said determining the statistical phase value are performed in synchronization with the clock signal.

6. The method of claim 1, wherein said processing the sample data comprises rendering the first and second pluralities of sample sets unavailable for subsequent use after said determining the first maximum peak-to-peak value, the second maximum peak-to-peak value, the statistical frequency value, and the statistical phase value.

7. The method of claim 1, wherein said sending the compressed data comprises transmitting the first maximum peak-to-peak value, the second maximum peak-to-peak value, the statistical frequency value, and the statistical phase value to the controller for controlling the plasma tool based on one or more of the first maximum peak-to-peak value, the second maximum peak-to-peak value, the statistical frequency value, and the statistical phase value.

8. The method of claim 1, wherein the first RF signal is sent from the RF generator via an RF cable to an impedance matching circuit, wherein the second RF signal is reflected from a plasma chamber via the impedance matching circuit towards the RF generator.

9. The method of claim 1, wherein the first RF signal is sent from the RF generator via an RF cable to an impedance matching circuit, wherein the second RF signal is sent from the impedance matching circuit via an RF transmission line to a plasma chamber.

10. The method of claim 1,
wherein said processing the sample data comprises determining for each of the first plurality of sample sets, a maximum value and a minimum value,
wherein the first maximum peak-to-peak value is determined from the maximum and minimum values determined from the first plurality of sample sets,
wherein said processing the sample data comprises determining for each of the second plurality of sample sets, a maximum value and a minimum value,
wherein the second maximum peak-to-peak value is determined from the maximum and minimum values determined from the second plurality of sample sets.

11. The method of claim 1, wherein said processing the sample data comprises:
determining for each of the first plurality of sample sets, a maximum value and a minimum value;
determining for each of the first plurality of sample sets, a time associated with the maximum value and a time associated with the minimum value, wherein the statistical frequency value is determined based on the times associated with the maximum values of the first plurality of sample sets and based on the times associated with the minimum values of the first plurality of sample sets.

12. The method of claim 1, wherein said processing the sample data comprises:
determining for each of the first plurality of sample sets, a maximum value and a minimum value;
determining for each of the second plurality of sample sets, a maximum value and a minimum value;
determining for each of the first plurality of sample sets, a time associated with the maximum value and a time associated with the minimum value; and
determining for each of the second plurality of sample sets, a time associated with the maximum value and a time associated with the minimum value,
wherein the statistical phase value is determined from the times associated with the maximum values of the first plurality of sample sets, the times associated with the maximum values of the second plurality of sample sets, the times associated with the minimum values of the first plurality of sample sets, and the times associated with the minimum values of the second plurality of sample sets.

13. The method of claim 1, wherein said processing the sample data comprises:
determining for each of the first plurality of sample sets, a time associated with a positive zero crossing and a time associated with a negative zero crossing,
wherein the statistical frequency value is determined based on the times associated with the positive zero crossings of the first plurality of sample sets and based on the times associated with the negative zero crossings of the first plurality of sample sets.

14. The method of claim 1, wherein said processing the sample data comprises:
determining for each of the first plurality of sample sets, a time associated with a positive zero crossing and a time associated with a negative zero crossing; and
determining for each of the second plurality of sample sets, a time associated with a positive zero crossing and a time associated with a negative zero crossing,
wherein the statistical phase value is determined from the times associated with the positive zero crossings of the first plurality of sample sets, the times associated with the positive zero crossings of the second plurality of sample sets, the times associated with the negative zero crossings of the first plurality of sample sets, and the times associated with the negative zero crossings of the second plurality of sample sets.

15. The method of claim 1, wherein the plasma tool is controlled based on:
a plasma control state determined based on the compressed data; or
an RF transition sequence determined based on the compressed data; or
an RF trigger event determined based on the compressed data; or
an RF precursor event determined based on the compressed data; or
an RF fault event determined based on the compressed data,
wherein the plasma control state, or the RF trigger event, or a control of pressure within a plasma chamber, or a control of gas flow within the plasma chamber, or a control of an impedance matching circuit, or a control of temperature within the plasma chamber, or a control of a gap within the plasma chamber facilitates achieving a wafer processing advantage.

16. The method of claim 1, wherein one of the one or more sensors is coupled between an output of an impedance matching circuit and the electrode, wherein the impedance matching circuit is coupled to the output of the RF generator.

17. The method of claim 1, wherein one of the one or more sensors is located within the RF generator.

18. The method of claim 1, wherein one of the one or more sensors is located within a match coupled to the RF generator.

19. A compression integrated system for compressing data, comprising:
an analog-to-digital converter configured to receive a plurality of measurement signals from one or more sensors coupled to a radio frequency (RF) transmission path of a plasma tool, wherein the RF transmission path is from an output of an RF generator to an electrode of the plasma tool,
wherein to receive the plurality of measurement signals, the analog-to-digital converter is configured to:
receive a first electrical signal representing a first parameter associated with a first RF signal;
receive a second electrical signal representing a second parameter associated with a second RF signal;
wherein the analog-to-digital converter is configured to convert the plurality of measurement signals from an analog form to a digital form to sample data,
wherein to convert the plurality of measurement signals, the analog-to-digital converter is configured to:
sample the first electrical signal to output a first plurality of sample sets; and
sample the second electrical signal to output a second plurality of sample sets;
a data compression unit coupled to the analog-to-digital converter, wherein the data compression unit is configured to process the sample data to output compressed data,
wherein to process the sample data, the data compression unit is configured to:
determine a first maximum peak-to-peak value from the first plurality of sample sets; or
determine a second maximum peak-to-peak value from the second plurality of sample sets; or
determine a statistical frequency value from the first plurality of sample sets; or determine a statistical phase value from the first and second pluralities of sample sets; or
a combination of two or more thereof; and
a transmitter coupled to the data compression unit, wherein the transmitter is configured to send the compressed data to a controller for controlling the plasma tool.

20. The compression integrated system of claim 19, wherein the first plurality of sample sets include a first master sample set and a second master sample set, wherein the second plurality of sample sets include a first slave sample set and a second slave sample set,
   wherein to process the sample data, the data compression unit is configured to:
      determine the first master sample set to have a largest swing from among the first and second master sample sets;
      identify the first slave sample set as corresponding to the first master sample set; and
      determine at least one of a maximum magnitude, a minimum magnitude, a time of a positive crossing, and a time of a negative crossing from the first slave sample set.

21. The compression integrated system of claim 19, wherein the first plurality of sample sets include a first master sample set and a second master sample set, wherein the second plurality of sample sets include a first slave sample set and a second slave sample set,
   wherein to process the sample data, the data compression unit is configured to:
      determine the first master sample set to have a largest swing from among the first and second master sample sets; or
      determine a maximum magnitude of the first master sample set; or
      determine the second master sample set to have a largest maximum magnitude from the maximum magnitude of the first master sample set and a maximum magnitude of the second master sample set; or
      determine a minimum magnitude of the first master sample set; or
      determine a minimum magnitude to be a minimum of the minimum magnitude of the first master sample set and a minimum magnitude of the second master sample set; or
      determine a position of a positive crossing within the first master sample set; or
      determine a position of a negative crossing within the first master sample set; or
      determine a sum of differences between positive and negative crossings of the first and second master sample sets.

22. The compression integrated system of claim 19, wherein the first plurality of sample sets include a first master sample set and a second master sample set, wherein the second plurality of sample sets include a first slave sample set and a second slave sample set,
   wherein to process the sample data, the data compression unit is configured to:
      determine the first slave sample set to have a largest swing from among the first and second slave sample sets; or
      determine a maximum magnitude of the first slave sample set; or
      determine the second slave sample set to have a largest maximum magnitude from the maximum magnitude of the first slave sample set and a maximum magnitude of the second slave sample set; or
      determine a minimum magnitude of the first slave sample set; or
      determine a minimum magnitude to be a minimum of the minimum magnitude of the first slave sample set and a minimum magnitude of the second slave sample set; or
      determine a position of a positive crossing within the first slave sample set; or
      determine a position of a negative crossing within the first slave sample set; or
      determine a sum of differences between positive and negative crossings of the first and second slave sample sets.

23. The compression integrated system of claim 19, wherein the analog-to-digital converter is configured to convert the plurality of measurement signals from the analog form to the digital form in synchronization with a clock signal.

24. The compression integrated system of claim 19, wherein the data compression unit is configured to render the first and second pluralities of sample sets unavailable for subsequent use after the determination of the first maximum peak-to-peak value, the second maximum peak-to-peak value, the statistical frequency value, and the statistical phase value.

25. The compression integrated system of claim 19, wherein the compressed data includes the first maximum peak-to-peak value, the second maximum peak-to-peak value, the statistical frequency value, and the statistical phase value.

26. The compression integrated system of claim of claim 19,
   wherein the first RF signal is sent from the RF generator via an RF cable to an impedance matching circuit,
   wherein the second RF signal is reflected from a plasma chamber via the impedance matching circuit towards the RF generator.

27. The compression integrated system of claim 19,
   wherein the first RF signal is sent from the RF generator via an RF cable to an impedance matching circuit,
   wherein the second RF signal is sent from the impedance matching circuit via an RF transmission line to a plasma chamber.

28. The compression integrated system of claim 19,
   wherein to process the sample data, the data compression unit is configured to determine for each of the first plurality of sample sets, a maximum value and a minimum value,
   wherein the first maximum peak-to-peak value is determined from the maximum and minimum values determined from the first plurality of sample sets,
   wherein to process the sample data, the data compression unit is configured to determine for each of the second plurality of sample sets, a maximum value and a minimum value,
   wherein the second maximum peak-to-peak value is determined from the maximum and minimum values determined from the second plurality of sample sets.

29. The compression integrated system of claim 19,
   wherein to process the sample data, the data compression unit is configured to:
      determine for each of the first plurality of sample sets, a maximum value and a minimum value; and determine for each of the first plurality of sample sets, a time associated with the maximum value and a time associated with a minimum value, wherein the statistical frequency value is determined based on the times associated with the maximum values of the first plurality of sample sets and based on the times associated with the minimum values of the first plurality of sample sets.

30. The compression integrated system of claim 19, wherein to process the sample data, the data compression unit is configured to:

determine for each of the first plurality of sample sets, a maximum value and a minimum value;

determine for each of the first plurality of sample sets, a time associated with the maximum value and a time associated with the minimum value;

determine for each of the second plurality of sample sets, a maximum value and a minimum value;

determine for each of the second plurality of sample sets, a time associated with the maximum value and a time associated with the minimum value, wherein the statistical phase value is determined from the times associated with the maximum values of the first plurality of sample sets, the times associated with the maximum values of the second plurality of sample sets, the times associated with the minimum values of the first plurality of sample sets, and the times associated with the minimum values of the second plurality of sample sets.

31. The compression integrated system of claim 19, wherein to process the sample data, the data compression unit is configured to determine for each of the first plurality of sample sets, a time associated with a positive zero crossing and a time associated with a negative zero crossing, wherein the statistical frequency value is determined based on the times associated with the positive zero crossings of the first plurality of sample sets and based on the times associated with the negative zero crossings of the first plurality of sample sets.

32. The compression integrated system of claim 19, wherein to process the sample data, the data compression unit is configured to:

determine for each of the first plurality of sample sets, a time associated with a positive zero crossing and a time associated with a negative zero crossing;

determine for each of the second plurality of sample sets, a time associated with a positive zero crossing and a time associated with a negative zero crossing;

wherein the statistical phase value is determined from the times associated with the positive zero crossings of the first plurality of sample sets, the times associated with the positive zero crossings of the second plurality of sample sets, the times associated with the negative zero crossings of the first plurality of sample sets, and the times associated with the negative zero crossings of the second plurality of sample sets.

33. A system for compressing data, comprising:

a radio frequency (RF) generator coupled to an RF path, wherein the RF generator is configured to supply a first RF signal to the RF path;

an RF sensor coupled to the RF path, wherein the RF sensor is configured to sense the first RF signal and a second RF signal to output a plurality of measurement signals; and a data integrated system coupled to the RF sensor to receive the plurality of measurement signals from the RF sensor, wherein to receive the plurality of measurement signals, the data integrated system is configured to:

receive a first electrical signal representing a first parameter associated with the first RF signal;

receive a second electrical signal representing a second parameter associated with the second RF signal, wherein the data integrated system is configured to convert the plurality of measurement signals from an analog form to a digital form to sample data, wherein to convert the plurality of measurement signals, the data integrated system is configured to:

sample the first electrical signal to output a first plurality of sample sets; and sample the second electrical signal to output a second plurality of sample sets, wherein the data integrated system is configured to process the sample data to output compressed data, wherein to process the sample data, the data integrated system is configured to:

determine a first maximum peak-to-peak value from the first plurality of sample sets; or determine a second maximum peak-to-peak value from the second plurality of sample sets; or determine a statistical frequency value from the first plurality of sample sets; or determine a statistical phase value from the first and second pluralities of sample sets; or a combination of two or more thereof, and wherein the data integrated system is configured to send the compressed data to a controller for controlling the system.

34. The system of claim 33, wherein the data integrated system is configured to render the first and second pluralities of sample sets unavailable for subsequent use after the determination of the first maximum peak-to-peak value, the second maximum peak-to-peak value, the statistical frequency value, and the statistical phase value.

* * * * *